US011223142B2

(12) United States Patent
Misaki

(10) Patent No.: US 11,223,142 B2
(45) Date of Patent: Jan. 11, 2022

(54) TFT SUBSTRATE AND SCANNING ANTENNA PROVIDED WITH TFT SUBSTRATE

(71) Applicant: Sharp Kabushiki Kaisha, Sakai (JP)

(72) Inventor: Katsunori Misaki, Yonago (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 203 days.

(21) Appl. No.: 16/621,273

(22) PCT Filed: Jun. 7, 2018

(86) PCT No.: PCT/JP2018/021934
§ 371 (c)(1),
(2) Date: Dec. 11, 2019

(87) PCT Pub. No.: WO2018/230448
PCT Pub. Date: Dec. 20, 2018

(65) Prior Publication Data
US 2020/0136270 A1  Apr. 30, 2020

(30) Foreign Application Priority Data

Jun. 15, 2017  (JP) .............................. JP2017-117822

(51) Int. Cl.
*H01Q 21/06* (2006.01)
*H01L 27/12* (2006.01)
(Continued)

(52) U.S. Cl.
CPC ......... *H01Q 21/065* (2013.01); *H01L 27/124* (2013.01); *H01L 27/1214* (2013.01);
(Continued)

(58) Field of Classification Search
None
See application file for complete search history.

(56) References Cited

U.S. PATENT DOCUMENTS 10,594,032 B2 * 3/2020 Rmili .................... H01Q 21/08
10,720,712 B2 * 7/2020 Foo ......................... H01Q 1/36
(Continued)

FOREIGN PATENT DOCUMENTS

JP   2007-116573 A   5/2007
JP   2007-295044 A   11/2007
(Continued)

OTHER PUBLICATIONS

Stevenson et al., "Rethinking Wireless Communications: Advanced Antenna Design using LCD Technology", SID 2015 DIGEST, 55.2, 2015, pp. 827-830.
(Continued)

*Primary Examiner* — Vibol Tan
(74) *Attorney, Agent, or Firm* — Keating & Bennett, LLP

(57) ABSTRACT

A TFT substrate includes a dielectric substrate and a plurality of antenna unit regions arranged on the dielectric substrate, each of the antenna unit regions including a TFT and a patch electrode electrically connected to a drain electrode of the TFT. The TFT substrate includes a gate metal layer supported by the dielectric substrate and including a gate electrode of the TFT, a source metal layer supported by the dielectric substrate and including a source electrode of the TFT, a semiconductor layer, supported by the dielectric substrate, of the TFT, a gate insulating layer formed between the gate metal layer and the semiconductor layer, and a flattened layer formed over the gate insulating layer and formed from an organic insulating material.

15 Claims, 37 Drawing Sheets

(51) Int. Cl.
*H01Q 19/10* (2006.01)
*H01L 29/786* (2006.01)

(52) U.S. Cl.
CPC ......... *H01L 27/1248* (2013.01); *H01Q 19/10* (2013.01); *H01L 27/1222* (2013.01); *H01L 29/78666* (2013.01); *H01L 2223/6677* (2013.01)

(56) References Cited

U.S. PATENT DOCUMENTS

| | | | |
|---|---|---|---|
| 10,777,887 B2 * | 9/2020 | Orui ................ | H01Q 21/064 |
| 10,819,006 B2 * | 10/2020 | Misaki .............. | H01L 23/66 |
| 10,840,266 B2 * | 11/2020 | Orui ................ | H01Q 21/0012 |
| 10,873,128 B2 * | 12/2020 | Kitoh ............... | H01L 27/124 |
| 10,903,247 B2 * | 1/2021 | Takahashi ......... | H01Q 21/0012 |
| 10,985,469 B2 * | 4/2021 | Mizusaki .......... | H01Q 3/34 |
| 10,992,040 B2 * | 4/2021 | Misaki ............. | H01L 23/66 |
| 10,998,629 B2 * | 5/2021 | Ohtake ............. | H01Q 3/34 |
| 11,005,157 B2 * | 5/2021 | Hirai ............... | H01Q 9/0407 |
| 11,018,439 B2 * | 5/2021 | Otsubo ............. | H01Q 3/44 |
| 11,088,282 B2 * | 8/2021 | Misaki ............. | H01L 29/786 |
| 2008/0036664 A1 | 2/2008 | Haziza | |
| 2012/0194399 A1 | 8/2012 | Bily et al. | |
| 2018/0337446 A1 | 11/2018 | Nakazawa et al. | |

FOREIGN PATENT DOCUMENTS

| | | |
|---|---|---|
| JP | 2009-538565 A | 11/2009 |
| JP | 2013-539949 A | 10/2013 |
| WO | 2015/126550 A1 | 8/2015 |
| WO | 2017/061527 A1 | 4/2017 |

OTHER PUBLICATIONS

Ando et al., "A Radial Line Slot Antenna for 12 GHz Satellite TV Reception", IEEE Transactions on Antennas and Propagation, vol. AP-33, No. 12, Dec. 1985, pp. 1347-1353.

* cited by examiner

C-C' CROSS SECTION　　D-D' CROSS SECTION　　G-G' CROSS SECTION　　H-H' CROSS SECTION (a)

(b)

(c)

(d)

D-D' CROSS SECTION    F-F' CROSS SECTION    H-H' CROSS SECTION (a)

(b)

(c)

(d)

TFT SUBSTRATE AND SCANNING ANTENNA PROVIDED WITH TFT SUBSTRATE

TECHNICAL FIELD

The disclosure relates to a scanning antenna, and more particularly relates to a scanning antenna in which an antenna unit (also referred to as an "element antenna") has a liquid crystal capacitance (also referred to as a "liquid crystal array antenna"), and a TFT substrate used for such a scanning antenna.

BACKGROUND ART

Antennas for mobile communication and satellite broadcasting require functions that can change the beam direction (referred to as "beam scanning" or "beam steering"). As an example of an antenna (hereinafter referred to as a "scanning antenna" (scanned antenna) having such functionality, phased array antennas equipped with antenna units are known. However, known phased array antennas are expensive, which is an obstacle for popularization as a consumer product. In particular, as the number of antenna units increases, the cost rises considerably.

Therefore, scanning antennas that utilize the high dielectric anisotropy (birefringence index) of liquid crystal materials (including nematic liquid crystals and polymer dispersed liquid crystals) have been proposed (PTL 1 to PTL 5 and NPL 1). Since the dielectric constant of liquid crystal materials has a frequency dispersion, in the present specification, the dielectric constant in a frequency band for microwaves (also referred to as the "dielectric constant for microwaves") is particularly denoted as "dielectric constant $M(\varepsilon_M)$".

PTL 3 and NPL 1 describe how an inexpensive scanning antenna can be obtained by using liquid crystal display (hereinafter referred to as "LCD") device technology.

The present inventors have developed a scanning antenna which can be mass-manufactured by utilizing known manufacturing techniques of LCDs. PTL 6 by the present inventors discloses a scanning antenna which can be mass-manufactured by utilizing the known manufacturing techniques of LCDs, a TFT substrate used for such a scanning antenna, and a manufacturing method of such a scanning antenna. For reference, the entire contents disclosed in PTL 6 are incorporated herein.

CITATION LIST

Patent Literature

PTL 1: JP 2007-116573 A
PTL 2: JP 2007-295044 A
PTL 3: JP 2009-538565 A
PTL 4: JP 2013-539949 A
PTL 5: WO 2015/126550
PTL 6: WO 2017/061527

Non-Patent Literature

NPL 1: R. A. Stevenson et al., "Rethinking Wireless Communications: Advanced Antenna Design using LCD Technology", SID 2015 DIGEST, pp. 827-830.

NPL 2: M. ANDO et al., "A Radial Line Slot Antenna for 12 GHz Satellite TV Reception", IEEE Transactions of Antennas and Propagation, Vol. AP-33, No. 12, pp. 1347-1353 (1985).

SUMMARY

Technical Problem

In the course of studying various structures in order to improve antenna performance of the scanning antenna described in PTL 6, it was found that the antenna performance is affected by the thickness of the liquid crystal layer more than expected. An object of the disclosure is to provide a scanning antenna having a novel structure capable of suppressing a decrease in antenna performance due to a thickness of a liquid crystal layer, and a TFT substrate used for such a scanning antenna.

Solution to Problem

A TFT substrate according to an embodiment of the disclosure is a TFT substrate including: a dielectric substrate; and a plurality of antenna unit regions arranged on the dielectric substrate, each of the plurality of antenna unit regions including a TFT and a patch electrode, the patch electrode electrically connected to a drain electrode of the TFT, the TFT substrate further including: a gate metal layer supported by the dielectric substrate and including gate electrode of the TFT; a source metal layer supported by the dielectric substrate and including source electrode of the TFT; a semiconductor layer of the TFT, the semiconductor layer being supported by the dielectric substrate; a gate insulating layer formed between the gate metal layer and the semiconductor layer; and a flattened layer formed over the gate insulating layer and formed from an organic insulating material.

In an embodiment, the flattened layer is formed on the TFT.

In an embodiment, the TFT substrate further includes a first insulating layer formed on the TFT, wherein the flattened layer is formed on the first insulating layer.

In an embodiment, the TFT substrate further includes an inorganic insulating layer formed on the flattened layer, wherein the flattened layer is covered by the inorganic insulating layer.

In an embodiment, the flattened layer is formed under a conductive layer including the patch electrode.

In an embodiment, the flattened layer includes a region overlapping the patch electrode in each of the plurality of antenna unit regions, when viewed from the normal direction of the dielectric substrate.

In an embodiment, the flattened layer is formed from a photosensitive resin.

A scanning antenna according to an embodiment of the disclosure includes the TFT substrate according to any one of those describe above, a slot substrate disposed to face the TFT substrate, a liquid crystal layer provided between the TFT substrate and the slot substrate, and a reflective conductive plate disposed to face a surface of the slot substrate on a side opposite to the liquid crystal layer with a dielectric layer interposed between the reflective conductive plate and the surface, wherein the slot substrate includes another dielectric substrate and a slot electrode formed on a surface of the another dielectric substrate on a side of the liquid crystal layer, and the slot electrode includes a plurality of slots, each of the plurality of slots being arranged corresponding to the patch electrode of each of the plurality of antenna unit regions of the TFT substrate.

In an embodiment, the flattened layer includes a region overlapping the patch electrode and/or the slot in each of the plurality of antenna unit regions, when viewed from a normal direction of the dielectric substrate and the another dielectric substrate.

In an embodiment, the flattened layer includes a region, in the region the patch electrode and the slot electrode overlapping each other in each of the plurality of antenna unit regions, when viewed from the normal direction of the dielectric substrate and the another dielectric substrate.

In an embodiment, the TFT substrate or the slot substrate further includes a columnar spacer formed in each of the plurality of antenna unit regions.

In an embodiment, the flattened layer includes a region overlapping the columnar spacer in each of the plurality of antenna unit regions, when viewed from the normal direction of the dielectric substrate and the another dielectric substrate.

In an embodiment, the TFT substrate further includes a protruding portion overlapping the columnar spacers in each of the plurality of antenna unit regions, when viewed from the normal direction of the dielectric substrate and the another dielectric substrate.

In an embodiment, the protruding portion includes a metal layer.

In an embodiment, the protruding portion is included in a conductive layer including the patch electrode.

Advantageous Effects of Disclosure

According to an embodiment of the disclosure, a scanning antenna having a novel structure capable of suppressing a decrease in antenna performance due to a thickness of a liquid crystal layer, and an TFT substrate used for such a scanning antenna are provided.

DESCRIPTION OF EMBODIMENTS

Figure 1:
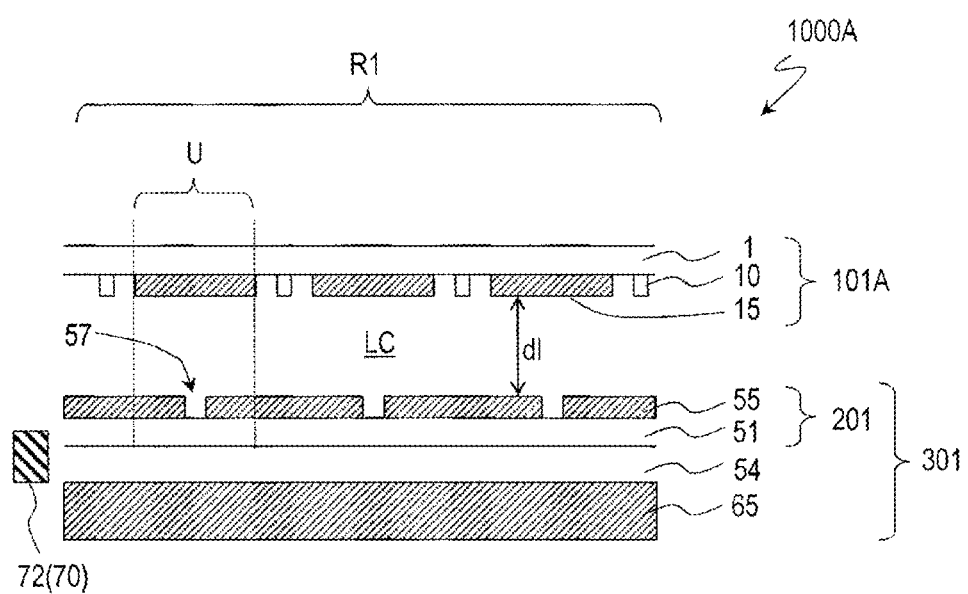
FIG. 1 is a cross-sectional view schematically illustrating a portion of a scanning antenna 1000A according to a first embodiment of the disclosure.

Hereinafter, a scanning antenna, a manufacturing method of the scanning antenna, and a TFT substrate used for the scanning antenna according to embodiments of the disclosure will be described with reference to the drawings. Note that the disclosure is not limited to the embodiments illustrated below. The embodiments of the disclosure are not limited to the drawings. For example, a thickness of a layer in a cross-sectional view, sizes of a conductive portion and an opening in the plan view, and the like are exemplary.
Basic Structure of Scanning Antenna By controlling the voltage applied to each liquid crystal layer of each antenna unit corresponding to the pixels of the LCD panel and changing the effective dielectric constant M ($\varepsilon_M$) of the liquid crystal layer for each antenna unit, a scanning antenna equipped with an antenna unit that uses the anisotropy (birefringence index) of a large dielectric constant M ($\varepsilon_M$) of a liquid crystal material forms a two-dimensional pattern by antenna units with different electrostatic capacitances (corresponding to displaying of an image by an LCD). An electromagnetic wave (for example, a microwave) emitted from an antenna or received by an antenna is given a phase difference depending on the electrostatic capacitance of each antenna unit, and gains a strong directivity in a particular direction depending on the two-dimensional pattern formed by the antenna units having different electrostatic capacitances (beam scanning). For example, an electromagnetic wave emitted from an antenna is obtained by integrating, with consideration for the phase difference provided by each antenna unit, spherical waves obtained as a result of input electromagnetic waves entering each antenna unit and being scattered by each antenna unit. It can be considered that each antenna unit functions as a "phase shifter." For a description of the basic structure and operating principles of a scanning antenna that uses a liquid crystal material, refer to PTL 1 to PTL 4 as well as NPL 1 and NPL 2. NPL 2 discloses the basic structure of a scanning antenna in which spiral slots are arranged. For reference, the entire contents of the disclosures of PTL 1 to PTL 4 as well as NPL 1 and NPL 2 are incorporated herein.

Note that although the antenna units in the scanning antenna according to the embodiments of the disclosure are similar to the pixels of the LCD panel, a structure of the antenna units is different from the structure of the pixel of the LCD panel, and an array of the plurality of antenna units is also different from an array of the pixels in the LCD panel. A basic structure of the scanning antenna according to the embodiments of the disclosure will be described with reference to FIG. 1, which illustrates a scanning antenna 1000A of a first embodiment to be described in detail later.

Although the scanning antenna 1000A is a radial in-line slot antenna in which slots are concentrically arrayed, the scanning antennas according to the embodiments of the disclosure are not limited to this. For example, the array of the slots may be any of various known arrays. In particular, with respect to the slot and/or antenna unit arrangements, the entire disclosure of PTL 5 is incorporated herein by reference.

FIG. 1 is a cross-sectional view schematically illustrating a portion of the scanning antenna 1000A of the present embodiment, and schematically illustrates a part of the cross-section along a radial direction from a power feed pin 72 (see FIG. 2(b)) provided near the center of the concentrically arrayed slots.

The scanning antenna 1000A includes a TFT substrate 101A, a slot substrate 201, a liquid crystal layer LC provided therebetween, and a reflective conductive plate 65 opposing the slot substrate 201 with an air layer 54 interposed between the slot substrate 201 and the reflective conductive plate 65. The scanning antenna 1000A transmits and/or receives microwaves to and/or from a TFT substrate 101A side.

The TFT substrate 101A includes a dielectric substrate 1 such as a glass substrate, and a plurality of patch electrodes 15 and a plurality of TFTs 10 formed on the dielectric substrate 1. Each patch electrode 15 is connected to a corresponding TFT 10. Each TFT 10 is connected to a gate bus line and a source bus line.

The slot substrate 201 includes a dielectric substrate 51 such as a glass substrate and a slot electrode 55 formed on a side of the dielectric substrate 51 closer to the liquid crystal layer LC. The slot electrode 55 includes a plurality of slots 57.

The reflective conductive plate 65 is disposed opposing the slot substrate 201 with the air layer 54 interposed between the reflective conductive plate 65 and the slot substrate 201. In place of the air layer 54, a layer formed of a dielectric (for example, a fluorine resin such as PTFE) having a small dielectric constant M for microwaves can be used. The slot electrode 55, the reflective conductive plate 65, and the dielectric substrate 51 and the air layer 54 therebetween function as a waveguide 301.

The patch electrode 15, the portion of the slot electrode 55 including the slot 57, and the liquid crystal layer LC therebetween constitute an antenna unit U. In each antenna unit U, one patch electrode 15 is opposed to a portion of the slot electrode 55 including one slot 57 with a liquid crystal layer LC interposed therebetween, thereby constituting the liquid crystal capacitance. Each antenna unit U includes an auxiliary capacitance electrically connected in parallel with the liquid crystal capacitance (see FIG. 3). The antenna unit U of the scanning antenna 1000A and a pixel of the LCD panel have a similar configuration. However, the scanning antenna 1000A has many differences from the LCD panel.

First, the performance required for the dielectric substrates 1 and 51 of the scanning antenna 1000A is different from the performance required for the substrate of the LCD panel.

Generally, transparent substrates that are transparent to visible light are used for LCD panels. For example, glass substrates or plastic substrates are used. In reflective LCD panels, since the substrate on the back side does not need transparency, a semiconductor substrate may be used in some cases. In contrast to this, it is preferable for the dielectric substrates 1 and 51 used for the antennas to have small dielectric losses with respect to microwaves (where the dielectric tangent with respect to microwaves is denoted as tan $\delta_M$). The tan $\delta_M$ of each of the dielectric substrates 1 and 51 is preferably approximately less than or equal to 0.03, and more preferably less than or equal to 0.01. Specifically, a glass substrate or a plastic substrate can be used. Glass substrates are superior to plastic substrates with respect to dimensional stability and heat resistance, and are suitable for forming circuit elements such as TFTs, a wiring line, and electrodes using LCD technology. For example, in a case where the materials forming the waveguide are air and glass, as the dielectric loss of glass is greater, from the viewpoint that thinner glass can reduce the waveguide loss, it is preferable for the thickness to be less than or equal to 400 um, and more preferably less than or equal to 300 μm. There is no particular lower limit, provided that the glass can be handled such that it does not break in the manufacturing process.

The conductive material used for the electrode is also different. In many cases, an ITO film is used as a transparent conductive film for pixel electrodes and counter electrodes of LCD panels. However, ITO has a large tan $\delta_M$ with respect to microwaves, and as such cannot be used as the conductive layer in an antenna. The slot electrode 55 functions as a wall for the waveguide 301 together with the reflective conductive plate 65. Accordingly, to suppress the transmission of microwaves in the wall of the waveguide 301, it is preferable that the thickness of the wall of the waveguide 301, that is, the thickness of the metal layer (Cu layer or Al layer) be large. It is known that in a case where the thickness of the metal layer is three times the skin depth, electromagnetic waves are attenuated to 1/20 (−26 dB), and in a case where the thickness is five times the skin depth, electromagnetic waves are attenuated to about 1/150 (−43 dB). Accordingly, in a case where the thickness of the metal layer is five times the skin depth, the transmittance of electromagnetic waves can be reduced to 1%. For example, for a microwave of 10 GHz, in a case where a Cu layer having a thickness of greater than or equal to 3.3 μm and an Al layer having a thickness of greater than or equal to 4.0 μm are used, microwaves can be reduced to 1/150. In addition, for a microwave of 30 GHz, in a case where a Cu layer having a thickness of greater than or equal to 1.9 μm and an Al layer having a thickness of greater than or equal to 2.3 μm are used, microwaves can be reduced to 1/150. In this way, the slot electrode 55 is preferably formed of a relatively thick Cu layer or Al layer. There is no particular upper limit for the thickness of the Cu layer or the Al layer, and the thicknesses can be set appropriately in consideration of the time and cost of film formation. The usage of a Cu layer provides the advantage of being thinner than the case of using an Al layer. Relatively thick Cu layers or Al layers can be formed not only by the thin film deposition method used in LCD manufacturing processes, but also by other methods such as bonding Cu foil or Al foil to the substrate. The thickness of the metal layer, for example, ranges from 2 μm to 30 μm. In a case where the thin film deposition methods are used, the thickness of the metal layer is preferably less than or equal to 5 μm. Note that aluminum plates, copper plates, or the like having a thickness of several mm can be used as the reflective conductive plate 65, for example.

Since the patch electrode 15 does not configure the waveguide 301 like the slot electrode 55, a Cu layer or an Al layer can be used that has a smaller thickness than that of the slot electrode 55. However, to avoid losses caused by heat when the oscillation of free electrons near the slot 57 of the slot electrode 55 induces the oscillation of the free electrons in the patch electrode 15, it is preferable that the resistance be low. From the viewpoint of mass production, it is preferable to use an Al layer rather than a Cu layer, and the thickness of the Al layer is preferably greater than or equal to 0.3 μm and less than or equal to 2 μm, for example.

In addition, an arrangement pitch of the antenna units U is considerably different from that of a pixel pitch. For example, considering an antenna for microwaves of 12 GHz (Ku band), the wavelength λ is 25 mm, for example. Then, as described in PTL 4, since the pitch of the antenna unit U is less than or equal to 214 and/or less than or equal to λ/5, the pitch becomes less than or equal to 6.25 mm and/or less than or equal to 5 mm. This is ten times greater than the pixel pitch of the LCD panel. Accordingly, the length and width of the antenna unit U are also roughly ten times greater than the pixel length and width of the LCD panel.

Of course, the array of the antenna units U may be different from the array of the pixels in the LCD panel. Herein, although an example is illustrated in which the antenna units U are arrayed in concentric circles (for example, refer to JP 2002-217640 A), the present disclosure is not limited thereto, and the antenna units may be arrayed in a spiral shape as described in NPL 2, for example. Furthermore, the antenna units may be arrayed in a matrix as described in PTL 4.

The properties required for the liquid crystal material of the liquid crystal layer LC of the scanning antenna 1000A are different from the properties required for the liquid crystal material of the LCD panel. In the LCD panel, a change in a refractive index of the liquid crystal layer of the pixels allows a phase difference to be provided to the polarized visible light (wavelength of from 380 nm to 830 nm) such that the polarization state is changed (for example, the change in the refractive index allows the polarization axis direction of linearly polarized light to be rotated or the degree of circular polarization of circularly polarized light to be changed), whereby display is performed. In contrast, in the scanning antenna 1000A according to the embodiment, the phase of the microwave excited (re-radiated) from each patch electrode is changed by changing the electrostatic capacitance value of the liquid crystal capacitance of the antenna unit U. Accordingly, the liquid crystal layer preferably has a large anisotropy (ACM) of the dielectric constant M (CM) for microwaves, and tan $\delta_M$ is preferably small. For example, the ACM of greater than or equal to 4 and tan $\delta_M$ of less than or equal to 0.02 (values of 19 GHz in both cases) described in SID 2015 DIGEST pp. 824-826 written by M. Wittek et al, can be suitably used. In addition, it is possible to use a liquid crystal material having a $\Delta\varepsilon_M$ of greater than or equal to 0.4 and tan $\delta_M$ of less than or equal to 0.04 as described in POLYMERS 55 vol. August issue pp. 599-602 (2006), written by Kuki.

In general, the dielectric constant of a liquid crystal material has a frequency dispersion, but the dielectric anisotropy $\Delta\varepsilon_M$ for microwaves has a positive correlation with the refractive index anisotropy Δn with respect to visible light. Accordingly, it can be said that a material having a large refractive index anisotropy Δn with respect to visible light is preferable as a liquid crystal material for an antenna unit for microwaves. The refractive index anisotropy Δn of the liquid crystal material for LCDs is evaluated by the refractive index anisotropy for light having a wavelength of 550 nm. Here again, when a Δn (birefringence index) is used as an index for light having a wavelength of 550 nm, a nematic liquid crystal having a Δn of greater than or equal to 0.3, preferably greater than or equal to 0.4, can be used for an antenna unit for microwaves. Δn has no particular upper limit. However, since liquid crystal materials having a large Δn tend to have a strong polarity, there is a possibility that reliability may decrease. From the viewpoint of reliability, Δn is preferably less than or equal to 0.4. The thickness of the liquid crystal layer is, for example, from 1 μm to 500 μm.

Hereinafter, the structure and manufacturing method of the scanning antenna according to the embodiments of the disclosure will be described in more detail.

First Embodiment

Figure 2:
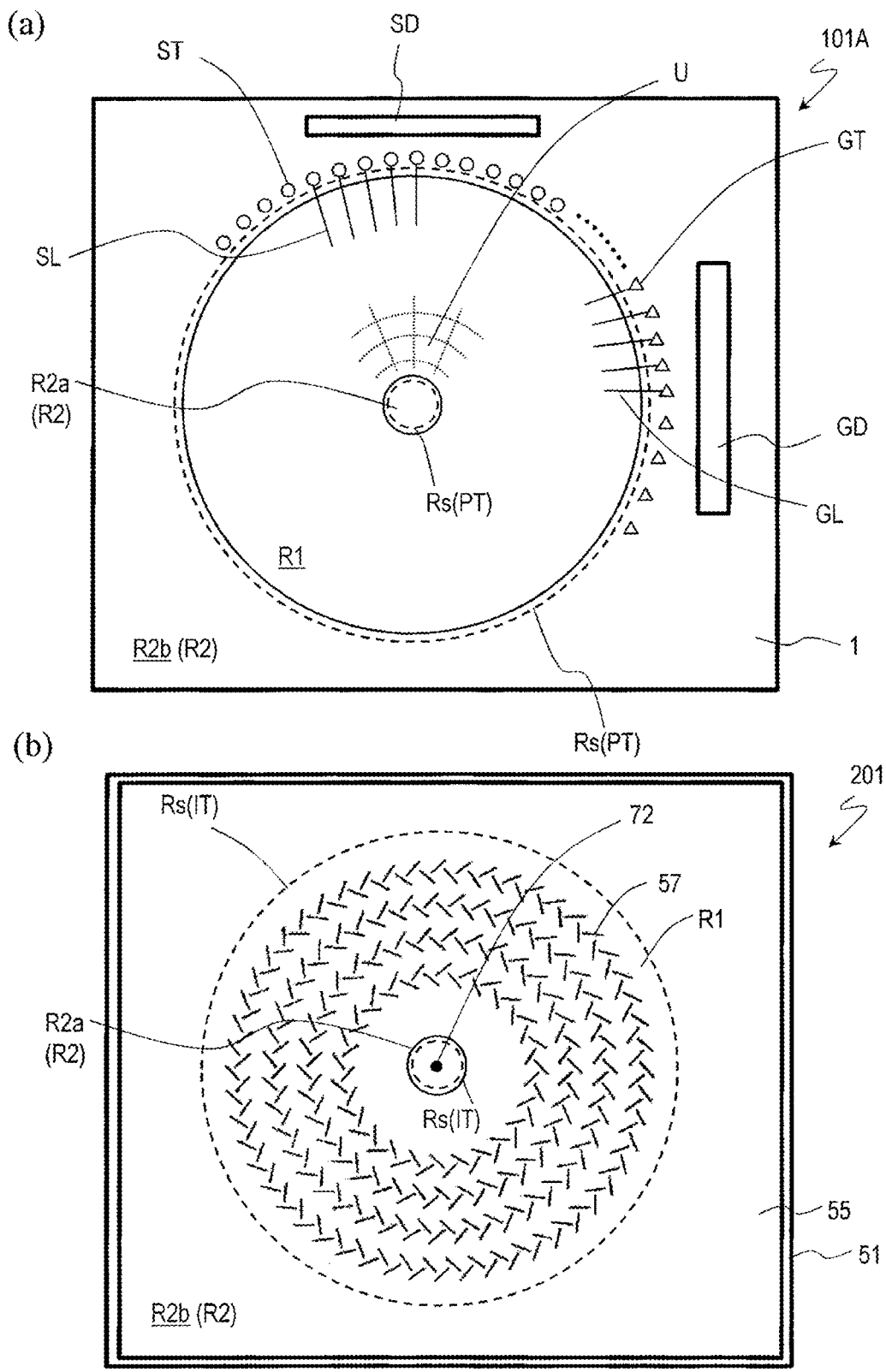
FIGS. 2(a) and 2(b) are schematic plan views illustrating a TFT substrate 101A and a slot substrate 201 included in the scanning antenna 1000A, respectively.

First, a description is given with reference to FIG. 1 and FIG. 2. FIG. 1 is a schematic partial cross-sectional view of the scanning antenna 1000A near the center thereof as described above in detail, and FIGS. 2(a) and 2(b) are schematic plan views illustrating the TFT substrate 101A and the slot substrate 201 included in the scanning antenna 1000A, respectively.

The scanning antenna 1000A includes a plurality of antenna units U arrayed two-dimensionally. In the scanning antenna 1000A exemplified here, the plurality of antenna units are arrayed concentrically. In the following description, the region of the TFT substrate 101A and the region of the slot substrate 201 corresponding to the antenna unit U will be referred to as "antenna unit region," and be denoted with the same reference numeral U as the antenna unit. In addition, as illustrated in FIGS. 2(a) and 2(b), in the TFT substrate 101A and the slot substrate 201, a region defined by the plurality of two-dimensionally arranged antenna unit regions is referred to as a "transmission and/or reception region R1," and a region other than the transmission and/or reception region R1 is referred to as a "non-transmission and/or reception region R2." A terminal section, a driving circuit, and the like are provided in the non-transmission and/or reception region R2.

FIG. 2(a) is a schematic plan view illustrating the TFT substrate 101A included in the scanning antenna 1000A.

In the illustrated example, the transmission and/or reception region R1 has a donut-shape when viewed from a normal direction of the TFT substrate 101A. The non-transmission and/or reception region R2 includes a first non-transmission and/or reception region R2a located at the center of the transmission and/or reception region R1 and a second non-transmission and/or reception region R2b located at the periphery of the transmission and/or reception region R1. An outer diameter of the transmission and/or reception region R1, for example, is from 200 mm to 1500 mm, and is configured according to a communication traffic volume or the like.

A plurality of gate bus lines GL and a plurality of source bus lines SL supported by the dielectric substrate 1 are provided in the transmission and/or reception region R1 of the TFT substrate 101A, and the antenna unit regions U are defined by these wiring lines. The antenna unit regions U are, for example, arranged concentrically in the transmission and/or reception region R1. Each of the antenna unit regions U includes a TFT and a patch electrode electrically connected to the TFT. The source electrode of the TFT is electrically connected to the source bus line SL, and the gate electrode is electrically connected to the gate bus line GL. In addition, the drain electrode is electrically connected to the patch electrode.

In the non-transmission and/or reception region R2 (R2a, R2b), a seal region Rs is disposed surrounding the transmission and/or reception region R1. A sealing member (not illustrated) is applied to the seal region Rs. The sealing member bonds the TFT substrate 101A and the slot substrate 201 to each other, and also encloses liquid crystals between these substrates 101A and 201.

A gate terminal section GT, the gate driver GD, a source terminal section ST, and the source driver SD are provided outside the seal region Rs in the non-transmission and/or reception region R2. Each of the gate bus lines GL is connected to the gate driver GD with the gate terminal section GT therebetween. Each of the source bus lines SL is connected to the source driver SD with the source terminal section ST therebetween. Note that, in this example, although the source driver SD and the gate driver GD are formed on the dielectric substrate 1, one or both of these drivers may be provided on another dielectric substrate.

Also, a plurality of transfer terminal sections PT are provided in the non-transmission and/or reception region R2. The transfer terminal section PT is electrically connected to the slot electrode 55 (FIG. 2(b)) of the slot substrate 201. In the present specification, the connection section between the transfer terminal section PT and the slot electrode 55 is referred to as a "transfer section." As illustrated in drawings, the transfer terminal section PT (transfer section) may be disposed in the seal region Rs. In this case, a resin containing conductive particles may be used as the sealing member. In this way, liquid crystals are sealed between the TFT substrate 101A and the slot substrate 201, and an electrical connection can be secured between the transfer terminal section PT and the slot electrode 55 of the slot substrate 201. In this example, although a transfer terminal section PT is disposed in both the first non-transmission and/or reception region R2a and the second non-transmission and/or reception region R2b, the transfer terminal section PT may be disposed in only one of them.

Note that the transfer terminal section PT (transfer section) need not be disposed in the seal region Rs. For example, the transfer terminal section PT may be disposed outside the seal region Rs in the non-transmission and/or reception region R2.

FIG. 2(b) is a schematic plan view illustrating the slot substrate 201 in the scanning antenna 1000A, and illustrates the surface of the slot substrate 201 closer to the liquid crystal layer LC.

In the slot substrate 201, the slot electrode 55 is formed on the dielectric substrate 51 extending across the transmission and/or reception region R1 and the non-transmission and/or reception region R2.

In the transmission and/or reception region R1 of the slot substrate 201, a plurality of slots 57 are formed in the slot electrode 55. The slots 57 are formed corresponding to the antenna unit region U on the TFT substrate 101A. For the plurality of slots 57 in the illustrated example, a pair of slots 57 extending in directions substantially orthogonal to each other are concentrically arrayed so that a radial in-line slot antenna is configured. Since the scanning antenna 1000A includes slots that are substantially orthogonal to each other, the scanning antenna 1000A can transmit and/or receive circularly polarized waves.

A plurality of terminal sections IT of the slot electrode 55 are provided in the non-transmission and/or reception region R2. The terminal section IT is electrically connected to the transfer terminal section PT (FIG. 2(a)) of the TFT substrate 101A. In this example, the terminal section IT is disposed within the seal region Rs, and is electrically connected to a corresponding transfer terminal section PT by a sealing member containing conductive particles.

In addition, the power feed pin 72 is disposed on a rear surface side of the slot substrate 201 in the first non-transmission and/or reception region R2a. The power feed pin 72 allows microwaves to be inserted into the waveguide 301 constituted by the slot electrode 55, the reflective conductive plate 65, and the dielectric substrate 51. The power feed pin 72 is connected to a power feed device 70. Power feeding is performed from the center of the concentric circle in which the slots 57 are arrayed. The power feed method may be either a direct coupling power feed method or an electromagnetic coupling method, and a known power feed structure can be utilized.

In FIGS. 2(a) and 2(b), an example is illustrated in which the seal region Rs is provided so as to surround a relatively narrow region including the transmission and/or reception region R1, but the arrangement of the seal region Rs is not limited to this. In particular, the seal region Rs provided outside the transmission and/or reception region R1 may be provided nearby the side of the dielectric substrate 1 and/or the dielectric substrate 51, for example, so as to maintain a certain distance or more from the transmission and/or reception region R1. Of course, the terminal section and the driving circuit, for example, that are provided in the non-transmission and/or reception region R2 may be formed outside the seal region Rs (that is, the side where the liquid crystal layer is not present). By forming the seal region Rs at a position separated from the transmission and/or reception region R1 by a certain distance or more, it is possible to prevent the antenna characteristics from deteriorating due to the influence of impurities (in particular, ionic impurities) contained in the sealing member (in particular, a curable resin).

In the following, a structure of the scanning antenna 1000A will be described in greater detail.

Antenna Unit Region U

A structure of the antenna unit region U of the transmission and/or reception region R1 of the scanning antenna 1000A according to the present embodiment will be described with reference to FIG. 3(a), FIG. 4(a), FIG. 6(b), and FIGS. 7(a) and 7(b).

Figure 7:
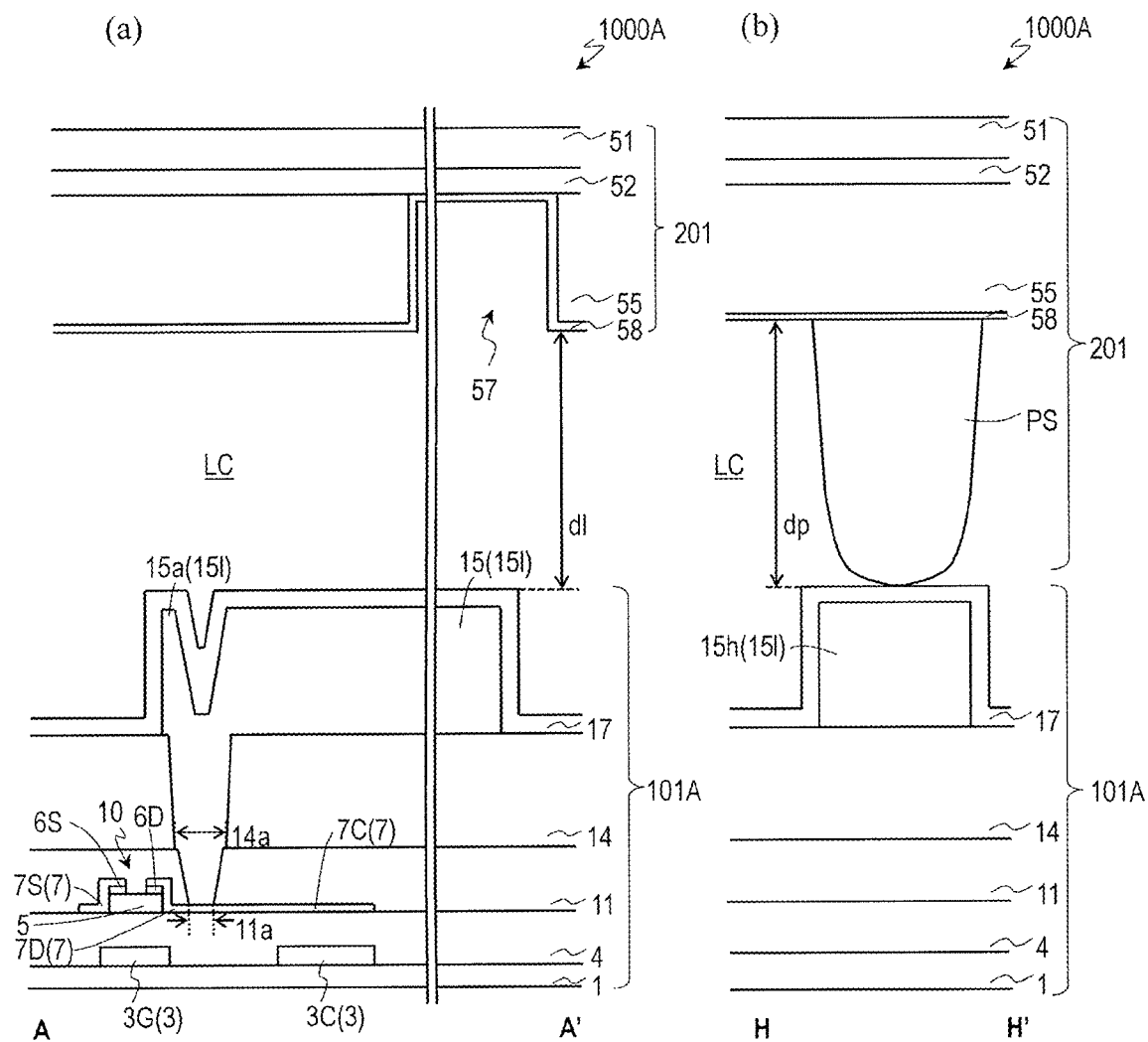
FIGS. 7(a) and 7(b) are schematic cross-sectional views of the scanning antenna 1000A.

FIG. 3(a) is a schematic plan view of the antenna unit region U in the transmission and/or reception region R1 of the scanning antenna 1000A. FIG. 4(a) and FIG. 6(b) are schematic cross-sectional views of the TFT substrate 101A included in the scanning antenna 1000A, and illustrate cross sections along lines A-A' and H-H' in FIG. 3(a), respectively. FIGS. 7(a) and 7(b) are schematic cross-sectional views of the scanning antenna 1000A, and illustrate cross sections along lines A-A' and H-H' in FIG. 3(a), respectively.

As illustrated in FIG. 3(a), FIG. 4(a), and FIG. 6(b), the TFT substrate 101A includes the dielectric substrate 1 and a plurality of antenna unit regions U arranged on the dielectric substrate 1, each antenna unit region U having the TFT 10 and the patch electrode 15 electrically connected to a drain electrode 7D of the TFT 10. The TFT substrate 101A includes a gate metal layer 3 supported by the dielectric substrate 1 and including a gate electrode 3G of the TFT 10, a source metal layer 7 supported by the dielectric substrate 1 and including a source electrode 7S of the TFT 10, a semiconductor layer 5, supported by the dielectric substrate 1, of the TFT 10, a gate insulating layer 4 formed between the gate metal layer 3 and the semiconductor layer 5, and a flattened layer 14 formed over the gate insulating layer 4 and formed from an organic insulating material.

Because the TFT substrate 101A has the flattened layer 14 formed over the gate insulating layer 4, a thickness of the liquid crystal layer LC of the scanning antenna 1000A has high uniformity. This allows the scanning antenna 1000A to suppress a decrease in antenna performance due to variations in the thickness of the liquid crystal layer LC.

As described above, the scanning antenna controls the voltage applied to each liquid crystal layer of each antenna unit to change the effective dielectric constant M (EM) of the liquid crystal layer for each antenna unit, and thereby, forms a two-dimensional pattern by antenna units with different electrostatic capacitances. The present inventors have discovered, by various investigations, new factors that decrease the antenna performance.

In a case where variations occur in the thickness of the liquid crystal layer LC of the plurality of antenna units, the antenna performance of the scanning antenna decreases. It is thought that when there are variations in the thickness of the liquid crystal layer LC, variations occur in an orientation state of liquid crystal molecules (when no voltage is applied), and as a result, the electrostatic capacitance value of the liquid crystal capacitance fluctuates. According to the study by the present inventors, the antenna performance is particularly affected by the uniformity of the thickness of the liquid crystal layer LC near the patch electrode 15 and the slot 57. From the perspective of the antenna performance, it is preferable that a uniformity of a thickness dl of the liquid crystal layer LC between the patch electrode 15 and the slot electrode 55 (see FIGS. 1 and 7(a)) is high, for example. The inventors have found that one reason for the variation occurring in the thickness of the liquid crystal layer LC is a variation in a thickness of the insulating layer and/or the conductive layer included in the TFT substrate 101A.

Since the TFT substrate 101A included in the scanning antenna 1000A of the present embodiment has the flattened layer 14, the insulating layer and/or the conductive layer formed below the flattened layer 14 is flattened by the flattened layer 14. Accordingly, the variations in the thickness of the insulating layer and/or the conductive layer formed below the flattened layer 14 do not contribute to the variation in the thickness of the liquid crystal layer LC. As described above, the uniformity of the thickness of the liquid crystal layer LC of the scanning antenna 1000A is improved.

Note that, in the cross-sectional view, for simplicity, the gate insulating layer 4, a first insulating layer 11, and a second insulating layer 17 may also be represented as a flattened layer, but in general, a layer formed by a thin film deposition method (for example, CVD, sputtering, or vacuum vapor deposition technique) has a surface that reflects steps of an underlayer.

Structure of TFT Substrate 101A (Antenna Unit Region U)

The structure of the TFT substrate 101A in the antenna unit region U will be described in more detail.

The TFT substrate 101A includes the gate metal layer 3 supported by the dielectric substrate 1, the semiconductor layer 5 formed over the gate metal layer 3, the gate insulating layer 4 formed between the gate metal layer 3 and the semiconductor layer 5, the source metal layer 7 formed on the gate insulating layer 4, the first insulating layer 11 formed on the source metal layer 7, a patch metal layer 151 formed over the first insulating layer 11, and the second insulating layer 17 formed on the patch metal layer 151, as illustrated in FIG. 3(a). The TFT substrate 101A further includes a lower conductive layer 13 formed between the first insulating layer 11 and the patch metal layer 151, as will be described later about a structure of the non-transmission and/or reception region R2 of the TFT substrate 101A. The TFT substrate 101A further includes an upper conductive layer 19 formed on the second insulating layer 17.

The TFT 10 included in each antenna unit region U includes the gate electrode 3G, an island-shaped semiconductor layer 5, contact layers 6S and 6D, the gate insulating layer 4 disposed between the gate electrode 3G and the semiconductor layer 5, and the source electrode 7S and the drain electrode 7D. In this example, the TFT 10 is a channel etch-type TFT having a bottom gate structure.

The gate electrode 3G is electrically connected to the gate bus line GL, and supplied with a scanning signal voltage via the gate bus line GL. The source electrode 7S is electrically connected to the source bus line SL, and is supplied with a data signal voltage via the source bus line SL. In this example, the gate electrode 3G and the gate bus line GL are formed of the same conductive film (gate conductive film). Here, the source electrode 7S, the drain electrode 7D, and the source bus line SL are formed of the same conductive film (source conductive film). The gate conductive film and the source conductive film are, for example, metal films.

The semiconductor layer 5 is disposed overlapping the gate electrode 3G with the gate insulating layer 4 interposed therebetween. In the illustrated example, a source contact layer 6S and a drain contact layer 6D are formed on the semiconductor layer 5. The source contact layer 6S and the drain contact layer 6D are disposed on both sides of a region where a channel is formed in the semiconductor layer 5 (channel region). The semiconductor layer 5 may be an intrinsic amorphous silicon (i-a-Si) layer, and the source contact layer 6S and the drain contact layer 6D may be n$^+$ type amorphous silicon (n$^+$-a-Si) layers.

The source electrode 7S is provided in contact with the source contact layer 6S and is connected to the semiconductor layer 5 with the source contact layer 6S interposed therebetween. The drain electrode 7D is provided in contact with the drain contact layer 6D and is connected to the semiconductor layer 5 with the drain contact layer 6D interposed therebetween.

Here, each antenna unit region U includes an auxiliary capacitance electrically connected in parallel with the liquid crystal capacitance. In this example, the auxiliary capacitance is configured by an auxiliary capacitance electrode 7C electrically connected to the drain electrode 7D, the gate insulating layer 4, and an auxiliary capacitance counter electrode 3C opposite to the auxiliary capacitance electrode 7C with the gate insulating layer 4 interposed therebetween. The auxiliary capacitance counter electrode 3C is included in the gate metal layer 3 and the auxiliary capacitance electrode 7C is included in the source metal layer 7. The gate metal layer 3 further includes a CS bus line (auxiliary capacitance line) CL connected to the auxiliary capacitance counter electrode 3C. The CS bus line CL extends substantially in parallel with the gate bus line GL, for example. In this example, the auxiliary capacitance counter electrode 3C is formed integrally with the CS bus line CL. A width of the auxiliary capacitance counter electrode 3C may be larger than a width of the CS bus line CL. In this example, the auxiliary capacitance electrode 7C extends from the drain electrode 7D. A width of the auxiliary capacitance electrode 7C may be larger than a width of a portion extending from the drain electrode 7D except for the auxiliary capacitance electrode 7C. Note that an arrangement relationship between the auxiliary capacitance and the patch electrode 15 is not limited to the example illustrated in the drawing.

The gate metal layer 3 includes the gate electrode 3G of the TFT 10, the gate bus line GL, the auxiliary capacitance counter electrode 3C, and the CS bus line CL.

The source metal layer 7 includes the source electrode 7S and drain electrode 7D of the TFT 10, the source bus line SL, and the auxiliary capacitance electrode 7C.

The first insulating layer 11 is formed to cover the TFT 10. The first insulating layer 11 includes an opening 11a that at least reaches the drain electrode 7D or a portion extending from the drain electrode 7D.

The flattened layer 14 is formed on the first insulating layer 11. The flattened layer 14 includes an opening 14a overlapping the opening 11a formed in the first insulating layer 11 when viewed from the normal direction of the dielectric substrate 1. The opening 14a formed in the flattened layer 14 and the opening 11a formed in the first insulating layer 11 constitute a contact hole CH_a.

The flattened layer 14 is, for example, an organic insulating layer. The flattened layer 14 is formed from, for example, an acrylic resin, a polyimide resin, or a silicone resin. The flattened layer 14 is preferably formed from, for example, a photosensitive resin (for example, acrylic resin). The photosensitive resin may be positive-working or negative-working. When the flattened layer 14 is formed from a photosensitive resin, it is not necessary to form a separate photoresist layer for patterning the flattened layer 14 (e.g., for forming openings), and thus, the number of manufacturing processes and the manufacturing cost can be reduced. A solution containing a photosensitive resin (precursor solution) is provided (applied or printed) onto the substrate, and the pre-baking (heating and removing of the solvent) is performed, and after that the solution is exposed via a photomask having a prescribed pattern and developed to obtain the flattened layer 14. If necessary, post-baking may be performed after the development.

In a case where the flattened layer 14 is formed using a non-photosensitive resin (for example, a thermosetting resin), a photoresist layer having a prescribed pattern may be formed on a film of the thermosetting resin formed, and the photoresist layer may be used as an etching mask to etch the film of the thermosetting resin to form the flattened layer 14.

A thickness of the flattened layer 14 is preferably greater than or equal to 1 μm and less than or equal to 5 μm, for example. In a case where the thickness of the flattened layer 14 is less than 1 μm, the effect of flattening the insulating layer and/or the conductive layer formed below the flattened layer 14 may not be sufficiently obtained. In a case where the thickness of the flattened layer 14 is greater than 5 μm, the exposure time and development time increases and costs increase, which may be undesirable from the perspective of mass manufacturability.

The patch metal layer 151 includes the patch electrode 15 and a connection section 15a. The connection section 15a is formed on the flattened layer 14 and within the contact hole CH_a, and is connected to the drain electrode 7D or the portion extending from the drain electrode 7D within the contact hole CH_a. For example, the connection section 15a is in contact with the portion extending from the drain electrode 7D within the opening 11a formed in the first insulating layer 11. In this example, the connection section 15a is formed integrally with a wiring line 15w extending from the patch electrode 15. In this example, the drain electrode 7D is electrically connected to the patch electrode 15 through the connection section 15a and the wiring line 15w.

The patch metal layer 151 includes a metal layer. The patch metal layer 151 may be formed only from a metal layer. The patch metal layer 151 has a layered structure including a low resistance metal layer and a high melting-point metal containing layer under the low resistance metal layer, for example. The layered structure may further include a high melting-point metal containing layer over the low resistance metal layer. The "high melting-point metal containing layer" is a layer containing at least one element selected from the group consisting of titanium (Ti), tungsten (W), molybdenum (Mo), tantalum (Ta), and niobium (Nb). The "high melting-point metal containing layer" may have a layered structure. For example, the high melting-point metal containing layer refers to a layer formed of any of Ti, W, Mo, Ta, Nb, an alloy containing these, and a nitride of these, and a solid solution of the above metal(s) or alloy and the nitride. The "low resistance metal layer" is a layer containing at least one element selected from the group consisting of copper (Cu), aluminum (Al), silver (Ag), and gold (Au). The "low resistance metal layer" may have a layered structure. The low resistance metal layer of the patch metal layer 151 may be referred to as a "main layer", and the high melting-point metal containing layers under and over the low resistance metal layer may be referred to as a "lower layer" and an "upper layer", respectively.

The patch metal layer 151 includes a Cu layer or an Al layer as a main layer, for example. Specifically, the patch electrode 15 includes a Cu layer or an Al layer as a main layer, for example. A performance of the scanning antenna correlates with an electric resistance of the patch electrode 15, and a thickness of the main layer is set so as to obtain a desired resistance. In terms of the electric resistance, there is a possibility that the thickness of the patch electrode 15 can be made thinner in the Cu layer than in the Al layer. A thickness of the metal layer included in the patch metal layer 151 (that is, a thickness of the metal layer included in the patch electrode 15) is set to be greater than thicknesses of the source electrode 7S and the drain electrode 7D, for example. The thickness of the metal layer in the patch electrode 15 is set to, for example, greater than or equal to 0.3 μm when it is formed of an Al layer.

The second insulating layer 17 is formed on the flattened layer 14 and the patch metal layer 151. The second insulating layer 17 is formed to cover the flattened layer 14, the patch electrode 15, the connection section 15a, and the wiring line 15w.

Since the flattened layer 14 is formed over the gate insulating layer 4, it is possible to absorb at least the variation in the thickness of the gate insulating layer 4. Specifically, the variation in the thickness of the gate insulating layer 4 is not reflected to the thickness of the liquid crystal layer LC. The flattened layer 14 may be formed over the TFT 10. The flattened layer 14 is preferably formed on the first insulating layer 11 formed on the TFT 10. In this case, the flattened layer 14 can absorb at least variations in the thickness of the gate insulating layer 4 and the first insulating layer 11.

The flattened layer 14 is preferably formed under a conductive layer including the patch electrode 15 (here, the patch metal layer 151). From the perspective of the antenna performance, the patch electrode 15 is preferably not covered with the flattened layer 14. This is because a sum of the thicknesses of the insulating layers covering the patch electrode 15 is preferably small, from the perspective of the antenna performance.

The flattened layer 14 is preferably covered with an inorganic insulating layer (here, the second insulating layer 17). Liquid crystal materials used in the scanning antennas may be likely to absorb moisture. The liquid crystal material having a large dielectric anisotropy $\Delta\varepsilon_M$ in the microwave region contains, for example, an isothiocyanate group (—NCS) or a thiocyanate group (—SCN). The isothiocyanate group and thiocyanate group have a strong polarity, and therefore, easily absorb moisture. The flattened layer 14 formed from an insulating resin has a higher water vapor transmission coefficient compared to the inorganic insulating layer, and therefore, infiltration of moisture through the flattened layer 14 can be suppressed by covering a surface of the flattened layer 14 with the inorganic insulating layer.

Note that the embodiment of the disclosure is not limited to the illustrated example. For example, the structure of the TFT is not limited to the illustrated example. As described later in another embodiment, an arrangement relationship between the gate metal layer 3 and the source metal layer 7 may be reversed. The patch electrode may be included in the gate metal layer 3 or the source metal layer 7.

The shape (patterning) of the flattened layer 14 is not limited to the illustrated example. As described above, from the perspective of the antenna performance, it is preferable to reduce the variations in the thickness d1 of the liquid crystal layer LC between the patch electrode 15 and the slot electrode 55 (see FIGS. 1 and 7(a)) (or to reduce differences between the plurality of antenna units). Accordingly, the flattened layer 14 is preferably formed near the patch electrode 15 and the slot 57 in each antenna unit. For example, the flattened layer 14 is preferably formed to include a region overlapping the patch electrode 15 in each of the plurality of antenna unit regions U when viewed from the normal direction of the dielectric substrate 1. For example, the flattened layer 14 is preferably formed to include a region overlapping the patch electrode 15 and/or the slot 57 in each of the plurality of antenna unit regions U when viewed from the normal direction of the dielectric substrate 1 and the dielectric substrate 51. The flattened layer 14 is preferably formed to include a region overlapping the patch electrode 15 and the slot electrode 55 in each of the plurality of antenna unit regions U when viewed from the normal direction of the dielectric substrate 1 and the dielectric substrate 51.

The flattened layer 14 is preferably formed to further overlap a columnar spacer. A spacer structure included in the scanning antenna 1000A will be described below.

Spacer Structure

The scanning antenna 1000A includes a spacer that controls the thickness of the liquid crystal layer LC.

As illustrated in FIG. 3(a), FIG. 6(b), and FIG. 7(b), the scanning antenna 1000A includes a columnar spacer PS that is formed in each of the plurality of antenna unit regions U and controls the thickness of the liquid crystal layer LC. In this example, the slot substrate 201 includes the columnar spacer PS. The columnar spacer is a spacer formed by a photolithography process using a photosensitive resin such as an ultraviolet-curing resin, and may also be referred to as a "photo spacer". Note that a spacer mixed with the sealing member (also called a "granular spacer") may be used in combination as a spacer. Furthermore, specific examples of the number and arrangement of spacers are not illustrated, but may be arbitrary. A plurality of columnar spacers PS may be provided in each antenna unit region U. The spacer may also be provided in the non-transmission and/or reception region R2.

The flattened layer 14 is preferably formed to include a region overlapping the columnar spacer PS in each of the plurality of antenna unit regions U when viewed from the normal direction of the dielectric substrate 1 and the dielectric substrate 51. This allows the uniformity of a thickness dp of the liquid crystal layer LC defined by the columnar spacer PS (see FIG. 7(b)) to be improved to reduce the variation in the thickness of the liquid crystal layer LC between the plurality of antenna units.

In the illustrated example, the TFT substrate 101A includes a protruding portion 15h overlapping the columnar spacer PS in each of the plurality of antenna unit regions U when viewed from the normal direction of the dielectric substrates 1 and 51. Here, the protruding portion 15h is included in the patch metal layer 151. The protruding portion 15h may include at least one conductive layer of the gate metal layer 3, the source metal layer 7, and the patch metal layer 151, for example. The protruding portion 15h typically includes a metal layer.

Since the TFT substrate 101A includes the protruding portion 15h, the following effects can be obtained. In a case where the thickness of the liquid crystal layer LC is large, it is difficult to form a high columnar spacer (for example, a columnar spacer having a height greater than 5 µm) using a photosensitive resin. In such a case, in a case where the columnar spacer PS is formed on the protruding portion 15h included in the TFT substrate 101A, the height of the columnar spacer PS can be reduced. Note that the height of the columnar spacer PS corresponds to the thickness dp of the liquid crystal layer LC defined by the columnar spacer PS.

In this example, the conductive layer other than the patch metal layer 151 included in the TFT substrate 101A is formed not to overlap the patch electrode 15 when viewed from the normal direction of the dielectric substrate 1. Therefore, in a case where the protruding portion 15h is included in the patch metal layer 151, the thickness dp of the liquid crystal layer LC defined by the columnar spacer PS is equal to the thickness dl of the liquid crystal layer LC between the patch electrode 15 and the slot electrode 55. In this case, an advantage is obtained that the thickness dl of the liquid crystal layer LC between the patch electrode 15 and the slot electrode 55 is particularly easily controlled by the columnar spacer PS.

The height of the columnar spacer PS can be appropriately adjusted by a configuration of the conductive layer that constitutes the protruding portion 15h, the thickness of the liquid crystal layer LC, and the like.

Figure 8:
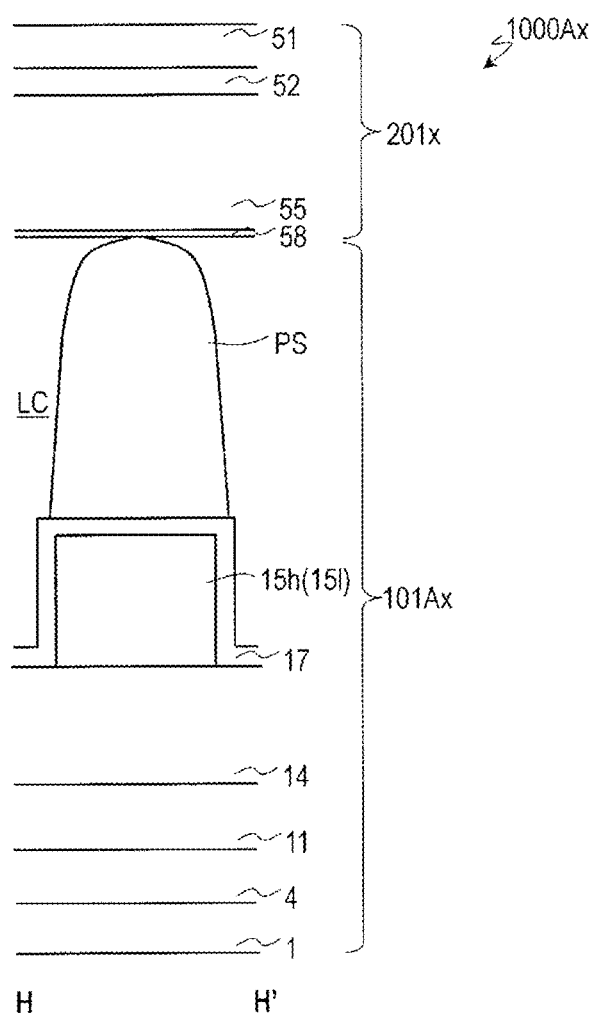
FIG. 8 is a schematic cross-sectional view of a scanning antenna 1000Ax according to Modification Example 1 of the first embodiment.

Here, FIG. 8 illustrates a schematic cross-sectional view of a scanning antenna 1000Ax according to Modification Example 1 of the present embodiment.

The scanning antenna 1000Ax differs from the scanning antenna 1000A in that a TFT substrate 101Ax includes the columnar spacer PS. Forming the columnar spacer PS in the TFT substrate 101Ax has an advantage that problems of misalignment with the protruding portion 15h of the TFT substrate 101Ax do not occur. Note that this spacer structure can be applied to any of the examples.

Structure of Slot Substrate 201 (Antenna Unit Region U)

A structure of the slot substrate 201 included in the scanning antenna 1000A will be described in greater detail with reference to FIGS. 7(a) and 7(b).

The slot substrate 201 includes the dielectric substrate 51 having a front surface and a rear surface, a third insulating layer 52 formed on the front surface of the dielectric substrate 51, the slot electrode 55 formed on the third insulating layer 52, and a fourth insulating layer 58 covering the slot electrode 55. The reflective conductive plate 65 is disposed opposing the rear surface of the dielectric substrate 51 with the dielectric layer (air layer) 54 interposed therebetween. The slot electrode 55 and the reflective conductive plate 65 function as walls of the waveguide 301.

In the transmission and/or reception region R1, a plurality of slots 57 are formed in the slot electrode 55. The slot 57 is an opening that opens through the slot electrode 55. In this example, one slot 57 is disposed in each antenna unit region U.

The fourth insulating layer 58 is formed on the slot electrode 55 and within the slot 57. The material of the fourth insulating layer 58 may be the same as the material of the third insulating layer 52. By covering the slot electrode 55 with the fourth insulating layer 58, the slot electrode 55 and the liquid crystal layer LC are not in direct contact with each other, such that the reliability can be enhanced. In a case where the slot electrode 55 is formed of a Cu layer, Cu may elute into the liquid crystal layer LC in some cases. In addition, in a case where the slot electrode 55 is formed of an Al layer by using a thin film deposition technique, the Al layer may include a void. The fourth insulating layer 58 can prevent the liquid crystal material from entering the void of the Al layer. Note that in a case where the slot electrode 55 is formed by bonding an aluminum foil as the Al layer on the dielectric substrate 51 with an adhesive and patterning it, the problem of voids can be avoided.

The slot electrode 55 includes a main layer 55M such as a Cu layer or an Al layer. The slot electrode 55 may have a layered structure that includes the main layer 55M, as well as an upper layer 55U and a lower layer 55L disposed sandwiching the main layer 55M therebetween (see FIGS. 9(a) and 9(b)). A thickness of the main layer 55M may be set in consideration of the skin effect depending on the material, and may be, for example, greater than or equal to 2 µm and less than or equal to 30 µm. The thickness of the main layer 55M is typically greater than the thickness of the upper layer 55U and the lower layer 55L.

In the illustrated example, the main layer 55M is a Cu layer, and the upper layer 55U and the lower layer 55L are Ti layers. By disposing the lower layer 55L between the main layer 55M and the third insulating layer 52, the adhesion between the slot electrode 55 and the third insulating layer 52 can be improved. In addition, by providing the upper layer 55U, corrosion of the main layer 55M (e.g., the Cu layer) can be suppressed.

Since the reflective conductive plate 65 constitutes the wall of the waveguide 301, it is desirable that the reflective conductive plate 65 has a thickness that is three times or greater than the skin depth, and preferably five times or greater. An aluminum plate, a copper plate, or the like having a thickness of several millimeters manufactured by a cutting out process can be used as the reflective conductive plate 65.

Non-Transmission and/or Reception Region R2

The structure of the non-transmission and/or reception region R2 of the scanning antenna 1000A will be described with reference to FIGS. 3 to 6 and FIG. 9. In the TFT substrate 101A included in the scanning antenna 1000A, the flattened layer 14 is formed on the transfer terminal section and on the source-gate connection section, and is not formed on the source terminal section, the gate terminal section, and the CS terminal section. However, the structure of the non-transmission and/or reception region R2 of the scanning antenna 1000A is not limited to the illustrated example.

Structure of TFT Substrate 101A (Non-Transmission and/or Reception Region R2)

FIGS. 3(b) and 3(c) are schematic plan views of the non-transmission and/or reception region R2 of the scanning antenna 1000A, and FIGS. 4(b) and 4(c), FIGS. 5(a) to 5(d), and FIG. 6(a) are schematic cross-sectional views of the non-transmission and/or reception region R2 of the TFT substrate 101A.

FIG. 3(b) illustrates the transfer terminal section PT, the gate terminal section GT, and the CS terminal section CT provided in the non-transmission and/or reception region R2, and FIG. 3(c) illustrates the source-gate connection section SG and the source terminal section ST provided in the non-transmission and/or reception region R2.

The transfer terminal section PT includes a first transfer terminal section PT1 located in the seal region Rs and a second transfer terminal section PT2 provided outside the seal region Rs (on a side where the liquid crystal layer is not present). In the illustrated example, the first transfer terminal section PT1 extends along the seal region Rs to surround the transmission and/or reception region R1.

FIG. 4(b) illustrates a cross section of the first transfer terminal section PT1 along a line B-B' in FIG. 3(b), FIG. 4(c) illustrates a cross section of the second transfer terminal section PT2 along a line E-E' in FIG. 3(b), FIG. 5(a) illustrates a cross section of the source-gate connection section SG along a line C-C' in FIG. 3(c), FIG. 5(b) illustrates a cross section of the source terminal section ST along a line D-D' in FIG. 3(c), FIG. 5(c) illustrates a cross section of the source-gate connection section SG along a line G-G' in FIG. 3(c), FIG. 5(d) illustrates a cross section of the first transfer terminal section PT1 along a line F-F' in FIG. 3(b), and FIG. 6(a) illustrates cross sections of the source-gate connection section SG and the source terminal section ST along a line I-I' in FIG. 3(c).

In general, the gate terminal section GT and the source terminal section ST are provided for each gate bus line and for each source bus line, respectively. The source-gate connection section SG is provided corresponding to each source bus line, in general. FIG. 3(b) illustrates the CS terminal section CT and the second transfer terminal section PT2 aligned with the gate terminal section GT, but the numbers and arrangements of CS terminal sections CT and second transfer terminal sections PT2 are configured independently from the gate terminal section GT. Typically, the numbers of CS terminal sections CT and second transfer terminal sections PT2 are less than the number of gate terminal sections GT and are adequately configured in consideration of uniformity of voltages of the CS electrode and the slot electrode. The second transfer terminal section PT2 can be omitted in a case where the first transfer terminal section PT1 is formed.

Each CS terminal section CT is provided corresponding to each CS bus line, for example. Each CS terminal section CT may be provided corresponding to a plurality of CS bus lines. For example, in a case where each CS bus line is supplied with the same voltage as the slot voltage, the TFT substrate 101A may include at least one CS terminal section CT. However, in order to decrease a wiring line resistance, the TFT substrate 101A preferably includes a plurality of CS terminal sections CT. Note that the slot voltage is a ground potential, for example. In the case that the CS bus line is supplied with the same voltage as the slot voltage, either the CS terminal section CT or the second transfer terminal section PT2 can be omitted.

Source-Gate Connection Section SG

The TFT substrate 101A includes the source-gate connection section SG in the non-transmission and/or reception region R2 as illustrated in FIG. 3(c). The source-gate connection section SG is provided for each source bus line SL, in general. The source-gate connection section SG electrically connects each source bus line SL to a connection wiring line (also referred to as a "source lower connection wiring line" in some cases) formed in the gate metal layer 3.

As illustrated in FIG. 3(c), FIG. 5(a), FIG. 5(c), and FIG. 6(a), the source-gate connection section SG includes a source lower connection wiring line 3sg, an opening 4sg1 formed in the gate insulating layer 4, a source bus line connection section 7sg, an opening 11sg 1 and an opening 11sg2 formed in the first insulating layer 11, and a source bus line upper connection section 13sg.

The source lower connection wiring line 3sg is included in the gate metal layer 3. The source lower connection wiring line 3sg is electrically separate from the gate bus line GL.

The opening 4sg1 formed in the gate insulating layer 4 at least reaches the source lower connection wiring line 3sg.

The source bus line connection section 7sg is included in the source metal layer 7 and electrically connected to the source bus line SL. In this example, the source bus line connection section 7sg extends from the source bus line SL and is formed integrally with the source bus line SL. A width of the source bus line connection section 7sg may be larger than a width of the source bus line SL.

The opening 11sg 1 formed in the first insulating layer 11 overlaps the opening 4sg1 formed in the gate insulating layer 4 when viewed from the normal direction of the dielectric substrate 1. The opening 4sg1 formed in the gate insulating layer 4 and the opening 11sg 1 formed in the first insulating layer 11 constitute a contact hole CH_sg1.

The opening 11sg2 formed in the first insulating layer 11 at least reaches the source bus line connection section 7sg. The opening 11sg2 may be referred to as a contact hole CH_sg2.

The source bus line upper connection section 13sg (also simply referred to as an "upper connection section 13sg") is included in the lower conductive layer 13. The upper connection section 13sg is formed on the first insulating layer 11, within the contact hole CH_sg1, and within the contact hole CH_sg2, is connected to the source lower connection wiring line 3sg within the contact hole CH_sg1, and is connected to the source bus line connection section 7sg within the contact hole CH_sg2. For example, here, the upper connection section 13sg is in contact with the source lower connection wiring line 3sg within the opening 4sg1 formed in the gate insulating layer 4, and in contact with the source bus line connection section 7sg within the opening 11sg2 formed in the first insulating layer 11.

A portion of the source lower connection wiring line 3sg exposed by the opening 4sg1 is preferably covered by the upper connection section 13sg. A portion of the source bus line connection section 7sg exposed by the opening 11sg2 is preferably covered by the upper connection section 13sg.

The lower conductive layer 13 includes, for example, a transparent conductive layer (for example, ITO layer).

In this example, the source-gate connection section SG does not include the conductive portion included in the patch metal layer 151 and the conductive portion included in the upper conductive layer 19.

The TFT substrate 101A has an excellent actional stability because of including the upper connection section 13sg in the source-gate connection section SG. Because the source-gate connection section SG includes the upper connection section 13sg, damages to the gate metal layer 3 and/or source metal layer 7 in a process of etching a patch conductive film for forming the patch metal layer 151 are reduced. A description is given of these effects.

As described above, in the TFT substrate 101A, the source-gate connection section SG does not include the conductive portion included in the patch metal layer 151. Specifically, the patch conductive film in a source-gate connection section formation region is removed in a process of patterning the patch conductive film. In a case where the source-gate connection section SG does not include the upper connection section 13sg, the gate metal layer 3 (the source lower connection wiring line 3sg) is exposed within the contact hole CH_sg1, so that the patch conductive film to be removed is deposited within the contact hole CH_sg1 and formed in contact with the source lower connection wiring line 3sg. Similarly, in the case where the source-gate connection section SG does not include the upper connection section 13sg, the source metal layer 7 (the source bus line connection section 7sg) is exposed within the contact hole CH_sg2, so that the patch conductive film to be removed is deposited within the contact hole CH_sg2 and formed in contact with the source bus line connection section 7sg. In such a case, the gate metal layer 3 and/or the source metal layer 7 may suffer an etching damage. In the process of patterning the patch conductive film, for example, an etching solution containing phosphoric acid, nitric acid, and acetic acid is used. In a case where the source lower connection wiring line 3sg and/or the source bus line connection section 7sg suffer the etching damage, a contact failure may occur in the source-gate connection section SG.

The source-gate connection section SG of the TFT substrate 101A includes the upper connection section 13sg formed within the contact hole CH_sg1 and the contact hole CH_sg2. Therefore, the damage to the source lower connection wiring line 3sg and/or the source bus line connection section 7sg caused by the etching in the process of patterning the patch conductive film is reduced. Accordingly, the TFT substrate 101A is excellent in the actional stability.

From the viewpoint of effectively reducing the etching damage to the gate metal layer 3 and/or the source metal layer 7, it is preferable that a portion of the source lower connection wiring line 3sg exposed by the contact hole CH_sg1 is covered by the upper connection section 13sg, and a portion of the source bus line connection section 7sg exposed by the opening 11sg2 is covered by the upper connection section 13sg.

In the TFT substrate used for the scanning antenna, a relatively thick conductive film (the patch conductive film) may be used to form the patch electrode. In this case, the etching time and the overetching time of the patch conductive film can be longer than the etching process of the other layers. At this time, when the gate metal layer 3 (the source lower connection wiring line 3sg) and the source metal layer 7 (the source bus line connection section 7sg) are exposed within the contact hole CH_sg1 and the contact hole CH_sg2, the etching damage to which these metal layers are subjected increases. In this manner, in the TFT substrate having a relatively thick patch metal layer, the effect of reducing the etch damage to the gate metal layer 3 and/or the source metal layer 7 is particularly great due to the source-gate connection section SG having the upper connection section 13sg.

In the illustrated example, the contact hole CH_sg2 is formed at a position away from the contact hole CH_sg1. The present embodiment is not limited to the illustrated example, and the contact hole CH_sg1 and the contact hole CH_sg2 may be contiguous to each other (that is, may be formed as a single contact hole). The contact hole CH_sg1 and the contact hole CH_sg2 may be formed as a single contact hole in the same process. Specifically, a single contact hole that at least reaches the source lower connection wiring line 3sg and source bus line connection section 7sg may be formed in the gate insulating layer 4 and first insulating layer 11 to form the upper connection section 13sg within this contact hole and on the first insulating layer 11. At this time, the upper connection section 13sg is preferably formed to cover a portion of the source lower connection wiring line 3sg and source bus line connection section 7sg exposed by the contact hole.

The lower connection section of the source terminal section ST can be formed of the gate metal layer 3 by providing the source-gate connection section SG as described later. The source terminal section ST including the lower connection section formed of the gate metal layer 3 is excellent in reliability.

Source Terminal Section ST

The TFT substrate 101A includes the source terminal section ST in the non-transmission and/or reception region R2 as illustrated in FIG. 3(c). The source terminal section ST is provided corresponding to each source bus line SL, in general. Here, the source terminal section ST and the source-gate connection section SG are provided corresponding to each source bus line SL.

The source terminal section ST includes a source terminal lower connection section 3s (also simply referred to as a "lower connection section 3s") connected to the source lower connection wiring line 3sg formed in the source-gate connection section SG, an opening 4s formed in the gate insulating layer 4, an opening 11s formed in the first insulating layer 11, an opening 17s formed in the second insulating layer 17, and a source terminal upper connection section 19s (also simply referred to as an "upper connection section 19s") as illustrated in FIG. 3(c), FIG. 5(b), and FIG. 6(a).

The lower connection section 3s is included in the gate metal layer 3. The lower connection section 3s is electrically connected to the source lower connection wiring line 3sg formed in the source-gate connection section SG. In this example, the lower connection section 3s extends from the source lower connection wiring line 3sg and is formed integrally with the source lower connection wiring line 3sg.

The opening 4s formed in the gate insulating layer 4 at least reaches the lower connection section 3s.

The opening 11s formed in the first insulating layer 11 overlaps the opening 4s formed in the gate insulating layer 4 when viewed from the normal direction of the dielectric substrate 1.

The opening 17s formed in the second insulating layer 17 overlaps the opening 11s formed in the first insulating layer 11 when viewed from the normal direction of the dielectric substrate 1. The opening 4s formed in the gate insulating layer 4, the opening 11s formed in the first insulating layer 11, and the opening 17s formed in the second insulating layer 17 constitute a contact hole CH_s.

The upper connection section 19s is included in the upper conductive layer 19. The upper connection section 19s is formed on the second insulating layer 17 and within the contact hole CH_s, and is connected to the lower connection section 3s within the contact hole CH_s. Here, the upper connection section 19s is in contact with the lower connection section 3s within the opening 4s formed in the gate insulating layer 4.

An entirety of the upper connection section 19s may overlap the lower connection section 3s when viewed from the normal direction of the dielectric substrate 1.

In this example, the source terminal section ST does not include the conductive portion included in the source metal layer 7, the conductive portion included in the lower conductive layer 13, and the conductive portion included in the patch metal layer 151.

The source terminal section ST, which includes the lower connection section 3s included in the gate metal layer 3, has excellent reliability.

In the terminal section, particularly, the terminal section provided outside the seal region Rs (opposite to the liquid crystal layer), corrosion may occur due to atmospheric moisture (which may contain impurities). The atmospheric moisture intrudes from the contact hole at least reaching the lower connection section and at least reaches the lower connection section so that corrosion may occur in the lower connection section. From the viewpoint of suppressing the corrosion occurring, the contact hole that at least reaches the lower connection section is preferably deep. In other words, the thickness of the insulating layer where the opening constituting the contact hole is formed is preferably large.

In a process of fabricating a TFT substrate including a glass substrate as a dielectric substrate, broken pieces or chips (cullets) of the glass substrate may cause scratches or disconnection in the lower connection section of the terminal section. For example, a plurality of TFT substrates are fabricated from one mother substrate. The cullet is generated in cutting the mother substrate or in forming scribe lines in the mother substrate, for example. From the viewpoint of preventing the scratches and disconnection in the lower connection section of the terminal section, the contact hole that at least reaches the lower connection section is preferably deep. In other words, the thickness of the insulating layer where the opening constituting the contact hole is formed is preferably large.

In the source terminal section ST of the TFT substrate 101A, since the lower connection section 3s is included in the gate metal layer 3, the contact hole CH_s that at least reaches the lower connection section 3s includes the opening 4s formed in the gate insulating layer 4, the opening 11s formed in the first insulating layer 11, and the opening 17s formed in the second insulating layer 17. A depth of the contact hole CH_s is a sum of a thickness of the gate insulating layer 4, a thickness of the first insulating layer 11, and a thickness of the second insulating layer 17. In contrast, in a case where the lower connection section is included in the source metal layer 7, for example, the contact hole that at least reaches the lower connection section includes only an opening formed in the first insulating layer 11 and an opening formed in the second insulating layer 17, and a depth of the contact hole is a sum of the thickness of the first insulating layer 11 and the thickness of the second insulating layer 17 and is smaller than the depth of the contact hole CH_s. Here, the depth of the contact hole and the thickness of the insulating layer are respectively a depth and a thickness in the normal direction of the dielectric substrate 1. The same holds for other contact holes and insulating layers unless otherwise specifically described. In this way, the source terminal section ST of the TFT substrate 101A includes the lower connection section 3s included in the gate metal layer 3, and therefore, has excellent reliability as compared with the case that the lower connection section is included in the source metal layer 7, for example.

The opening 4s formed in the gate insulating layer 4 is formed to expose only a portion of the lower connection section 3s. The opening 4s formed in the gate insulating layer 4 is inside the lower connection section 3s when viewed from the normal direction of the dielectric substrate 1. Therefore, an entire region within the opening 4s has a layered structure including the lower connection section 3s and the upper connection section 19s on the dielectric substrate 1. In the source terminal section ST, an entirety of a region not including the lower connection section 3s has a layered structure including the gate insulating layer 4, the first insulating layer 11, and the second insulating layer 17. With this configuration, the source terminal section ST of the TFT substrate 101A has excellent reliability. From the viewpoint of obtaining the excellent reliability, the sum of the thicknesses of the gate insulating layer 4, the thickness of the first insulating layer 11, and the thickness of the second insulating layer 17 is preferably large.

A portion of the lower connection section 3s exposed by the opening 4s is covered by the upper connection section 19s.

In a case where a thickness of the upper connection section of the terminal section is large (that is, a thickness of the upper conductive layer 19 is large), corrosion of the lower connection section is suppressed. In order to effectively suppress the corrosion of the lower connection section, the upper conductive layer 19 may have the layered structure including the first upper conductive layer including the transparent conductive layer (for example, ITO layer), and the second upper conductive layer formed under the first upper conductive layer and formed of one layer or two or more layers selected from the group consisting of a Ti layer, a MoNbNi layer, a MoNb layer, a MoW layer, a W layer and a Ta layer, as described above. In order to effectively suppress the corrosion of the lower connection section, the thickness of the second upper conductive layer may be over 100 nm, for example.

Gate Terminal Section GT

The TFT substrate 101A includes the gate terminal section GT in the non-transmission and/or reception region R2 as illustrated in FIG. 3(b). The gate terminal section GT may have the same configuration as the source terminal section ST as illustrated in FIG. 3(b). The gate terminal section GT is provided for each gate bus line GL, in general.

As illustrated in FIG. 3(b), in this example, the gate terminal section GT includes a gate terminal lower connection section 3g (also simply referred to as a "lower connection section 3g"), an opening 4g formed in the gate insulating layer 4, an opening 11g formed in the first insulating layer 11, an opening 17g formed in the second insulating layer 17, and a gate terminal upper connection section 19g (also simply referred to as an "upper connection section 19g").

The lower connection section 3g is included in the gate metal layer 3 and electrically connected to the gate bus line GL. In this example, the lower connection section 3g extends from the gate bus line GL and is formed integrally with the gate bus line GL.

The opening 4g formed in the gate insulating layer 4 at least reaches the lower connection section 3g.

The opening 11g formed in the first insulating layer 11 overlaps the opening 4g formed in the gate insulating layer 4 when viewed from the normal direction of the dielectric substrate 1.

The opening 17g formed in the second insulating layer 17 overlaps the opening 11g formed in the first insulating layer 11 when viewed from the normal direction of the dielectric substrate 1. The opening 4g formed in the gate insulating layer 4, the opening 11g formed in the first insulating layer 11, and the opening 17g formed in the second insulating layer 17 constitute a contact hole CH_g.

The upper connection section 19g is included in the upper conductive layer 19. The upper connection section 19g is formed on the second insulating layer 17 and within the contact hole CH_g, and is connected to the lower connection section 3g within the contact hole CH_g. For example, the upper connection section 19g is in contact with the lower connection section 3g within the opening 4g formed in the gate insulating layer 4.

An entirety of the upper connection section 19g may overlap the lower connection section 3g when viewed from the normal direction of the dielectric substrate 1.

In this example, the gate terminal section GT does not include the conductive portion included in the source metal layer 7, the conductive portion included in the lower conductive layer 13, and the conductive portion included in the patch metal layer 151.

The gate terminal section GT, which includes the lower connection section 3g included in the gate metal layer 3, has excellent reliability similar to the source terminal section ST.

CS Terminal Section CT

The TFT substrate 101A includes the CS terminal section CT in the non-transmission and/or reception region R2 as illustrated in FIG. 3(b). The CS terminal section CT here has the same configuration as the source terminal section ST and gate terminal section GT as illustrated in FIG. 3(b). The CS terminal section CT may be provided corresponding to each CS bus line CL, for example.

As illustrated in FIG. 3(b), the CS terminal section CT includes a CS terminal lower connection section 3c (also simply referred to as a "lower connection section 3c"), an opening 4c formed in the gate insulating layer 4, an opening 11c formed in the first insulating layer 11, an opening 17c formed in the second insulating layer 17, and a CS terminal upper connection section 19c (also simply referred to as an "upper connection section 19c").

The lower connection section 3c is included in the gate metal layer 3. The lower connection section 3c is electrically connected to the CS bus line CL. In this example, the lower connection section 3c extends from the CS bus line CL and is formed integrally with the CS bus line CL.

The opening 4c formed in the gate insulating layer 4 at least reaches the lower connection section 3c.

The opening 11c formed in the first insulating layer 11 overlaps the opening 4c formed in the gate insulating layer 4 when viewed from the normal direction of the dielectric substrate 1.

The opening 17c formed in the second insulating layer 17 overlaps the opening 11c formed in the first insulating layer 11 when viewed from the normal direction of the dielectric substrate 1. The opening 4c formed in the gate insulating layer 4, the opening 11c formed in the first insulating layer 11, and the opening 17c formed in the second insulating layer 17 constitute a contact hole CH_c.

The upper connection section 19c is included in the upper conductive layer 19. The upper connection section 19c is formed on the second insulating layer 17 and within the contact hole CH_c, and is connected to the lower connection section 3c within the contact hole CH_c. For example, the upper connection section 19c is in contact with the lower connection section 3c within the opening 4c formed in the gate insulating layer 4.

An entirety of the upper connection section 19c may overlap the lower connection section 3c when viewed from the normal direction of the dielectric substrate 1.

In this example, the CS terminal section CT does not include the conductive portion included in the source metal layer 7, the conductive portion included in the lower conductive layer 13, and the conductive portion included in the patch metal layer 151.

The CS terminal section CT, which includes the lower connection section 3c included in the gate metal layer 3, has excellent reliability similar to the source terminal section ST.

Transfer Terminal Section PT

The TFT substrate 101A includes the first transfer terminal section PT1 in the non-transmission and/or reception region R2 as illustrated in FIG. 3(b). The first transfer terminal section PT1 is provided in the seal region Rs, here (that is, the first transfer terminal section PT1 is provided in the sealing portion surrounding the liquid crystal layer).

The first transfer terminal section PT1 includes a first transfer terminal lower connection section 3p1 (also simply referred to as a "lower connection section 3p1"), an opening 4p1 formed in the gate insulating layer 4, an opening 11p1 formed in the first insulating layer 11, an opening 14p1 formed in the flattened layer 14, a first transfer terminal conductive portion 15p1 (also simply referred to as a "conductive portion 15p1"), an opening 17p1 formed in the second insulating layer 17, and a first transfer terminal upper connection section 19p1 (also simply referred to as the "upper connection section 19p1"), as illustrated in FIG. 3(b) and FIG. 4(b).

The lower connection section 3p1 is included in the gate metal layer 3. That is, the lower connection section 3p1 is formed of the same conductive film as that of the gate bus line GL. The lower connection section 3p1 is electrically separate from the gate bus line GL. For example, in a case where the CS bus line CL is supplied with the same voltage as the slot voltage, the lower connection section 3p1 is electrically connected to, for example, the CS bus line CL. As is illustrated, the lower connection section 3p1 may extend from the CS bus line. However, the lower connection section 3p1 is not limited to the illustrated example and may be electrically separate from the CS bus line.

The opening 4p1 formed in the gate insulating layer 4 at least reaches the lower connection section 3p1.

The opening 11p1 formed in the first insulating layer 11 overlaps the opening 4p1 formed in the gate insulating layer 4 when viewed from the normal direction of the dielectric substrate 1.

The opening 14p1 formed in the flattened layer 14 overlaps the opening 11p1 formed in the first insulating layer 11 when viewed from the normal direction of the dielectric substrate 1. The opening 4p1 formed in the gate insulating layer 4, the opening 11p1 formed in the first insulating layer 11, and the opening 14p1 formed in the flattened layer 14 constitute a contact hole CH_p1.

The conductive portion 15p1 is included in the patch metal layer 151. The conductive portion 15p1 is formed on the flattened layer 14 and within the contact hole CH_p1, and is connected to the lower connection section 3p1 within the contact hole CH_p1. Here, the conductive portion 15p1 is in contact with the lower connection section 3p1 within the opening 4p1.

The opening 17p1 formed in the second insulating layer 17 at least reaches the conductive portion 15p1.

The upper connection section 19p1 is included in the upper conductive layer 19. The upper connection section 19p1 is formed on the second insulating layer 17 and within the opening 17p1, and is connected to the conductive portion 15p1 within the opening 17p1. Here, the upper connection section 19p1 is in contact with the conductive portion 15p1 within the opening 17p1. The upper connection section 19p1 is connected to a transfer terminal upper connection section on the slot substrate side by a sealing member containing conductive particles, for example (see FIG. 9(b)).

In this example, the first transfer terminal section PT1 does not include the conductive portion included in the source metal layer 7 and the conductive portion included in the lower conductive layer 13.

The upper conductive layer 19 includes, for example, a transparent conductive layer (for example, ITO layer). The upper conductive layer 19 may be formed of only a transparent conductive layer, for example. Alternatively, the upper conductive layer 19 may include a first upper conductive layer including a transparent conductive layer and a second upper conductive layer formed under the first upper conductive layer. The second upper conductive layer is formed of one layer or two or more layers selected from the group consisting of a Ti layer, a MoNbNi layer, a MoNb layer, a MoW layer, a W layer and a Ta layer, for example.

The first transfer terminal section PT1 includes the conductive portion 15$p$1 between the lower connection section 3$p$1 and the upper connection section 19$p$1. This allows the first transfer terminal section PT1 to have an advantage that an electric resistance between the lower connection section 3$p$1 and the upper connection section 19$p$1 is low. It also has an advantage that the electrical connection between the lower connection section 3$p$1 and the upper connection section 19$p$1 can be stabilized even in a case where the thickness of the flattened layer 14 is large.

An entirety of the upper connection section 19$p$1 may overlap the conductive portion 15$p$1 when viewed from the normal direction of the dielectric substrate 1.

In this example, the lower connection section 3$p$1 is disposed between two gate bus lines GL adjacent to each other. Two lower connection sections 3$p$1 disposed with the gate bus line GL being interposed therebetween may be electrically connected to each other via a conductive connection section (not illustrated). The conductive connection section electrically connecting two lower connection sections 3$p$1 may be included, for example, in the source metal layer 7.

Here, a plurality of contact holes CH_p1 are provided so that the lower connection section 3$p$1 is connected to the upper connection section 19$p$1 with the conductive portion 15$p$1 interposed therebetween, but one or more contact holes CH_p1 may be provided to one lower connection section 3$p$1. One contact hole may be provided to one lower connection section 3$p$1. The number of contact holes or the shapes thereof are not limited to the illustrated example.

Here, the upper connection section 19$p$1 is connected to the conductive portion 15$p$1 through one opening 17$p$1, but one or more openings 17$p$1 may be provided to one upper connection section 19$p$1. A plurality of openings may be provided to one upper connection section 19$p$1. The number of openings or the shapes thereof are not limited to the illustrated example.

Figure 3:
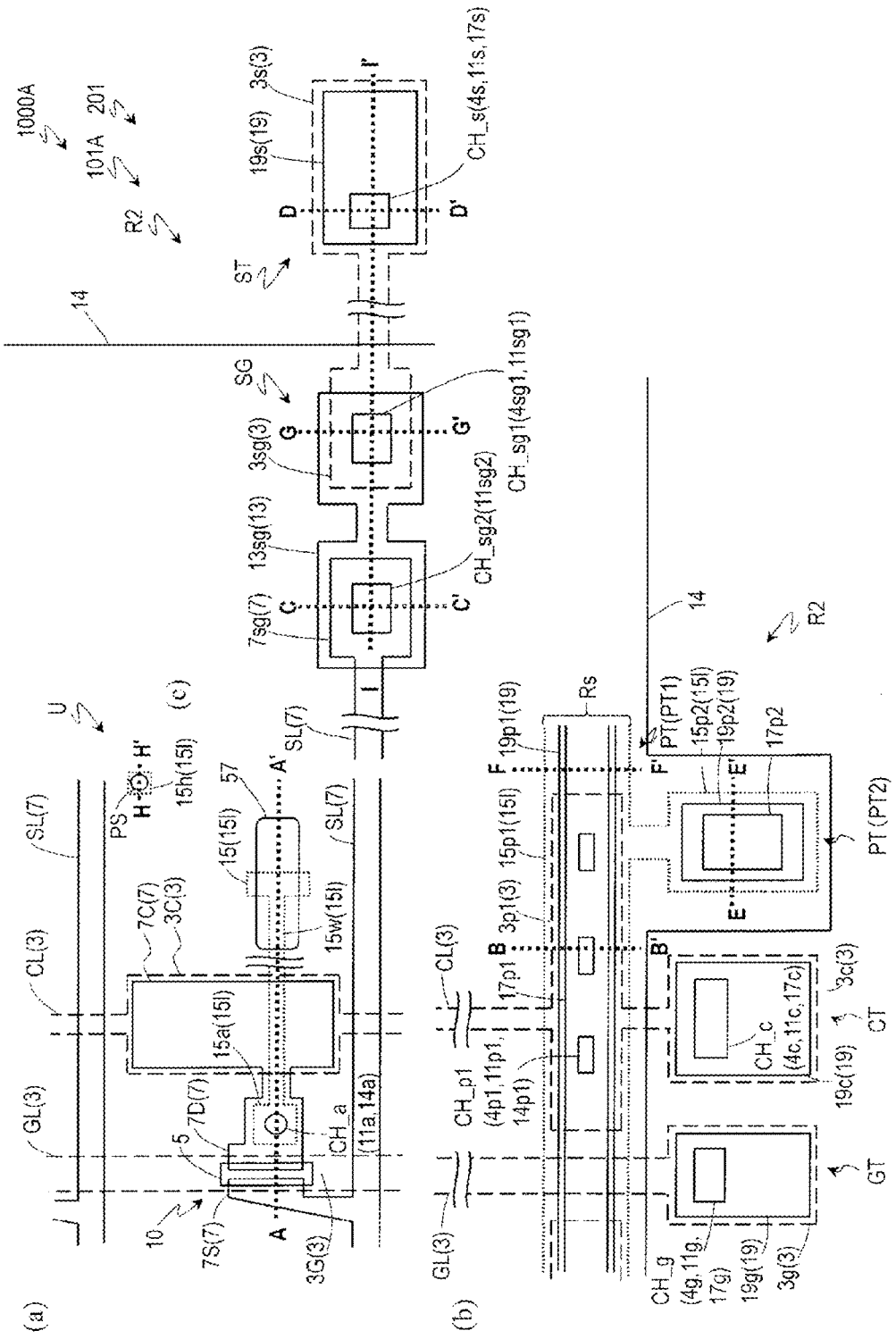
FIG. 3(a) is a schematic plan view of an antenna unit region U in a transmission and/or reception region R1 of the scanning antenna 1000A.
FIGS. 3(b) and 3(c) are schematic plan views of non-transmission and/or reception region R2 of the scanning antenna 1000A.
Figure 4:
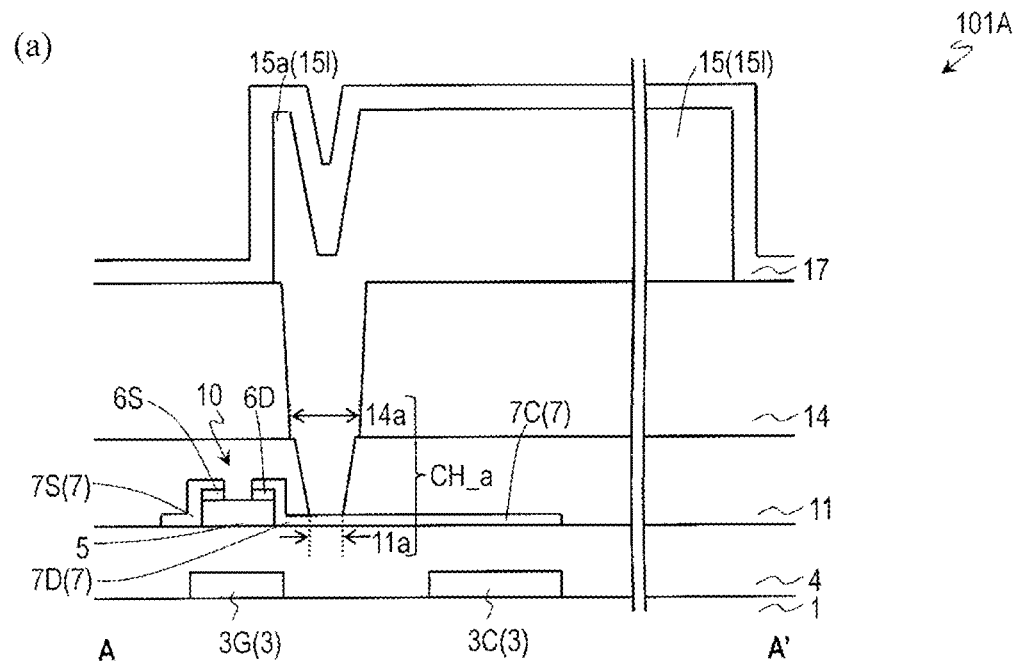
FIGS. 4(a) to 4(c) are schematic cross-sectional views of the TFT substrate 101A.
Figure 4:
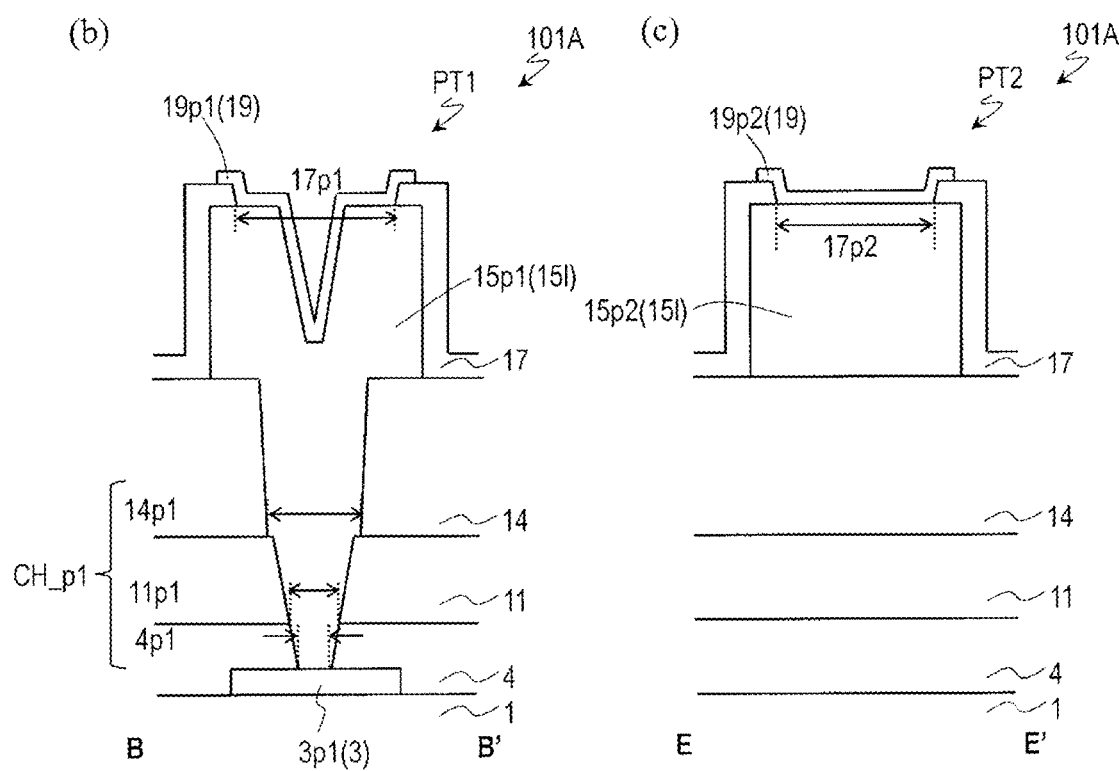

The second transfer terminal section PT2 is provided outside the seal region Rs (opposite to the transmission and/or reception region R1). The second transfer terminal section PT2 includes a second transfer terminal lower connection section 15$p$2 (also simply referred to as a "lower connection section 15$p$2"), an opening 17$p$2 formed in the second insulating layer 17, and a second transfer terminal upper connection section 19$p$2 (also simply referred to as an "upper connection section 19$p$2") as illustrated in FIG. 3($b$) and FIG. 4($c$).

Figure 5:
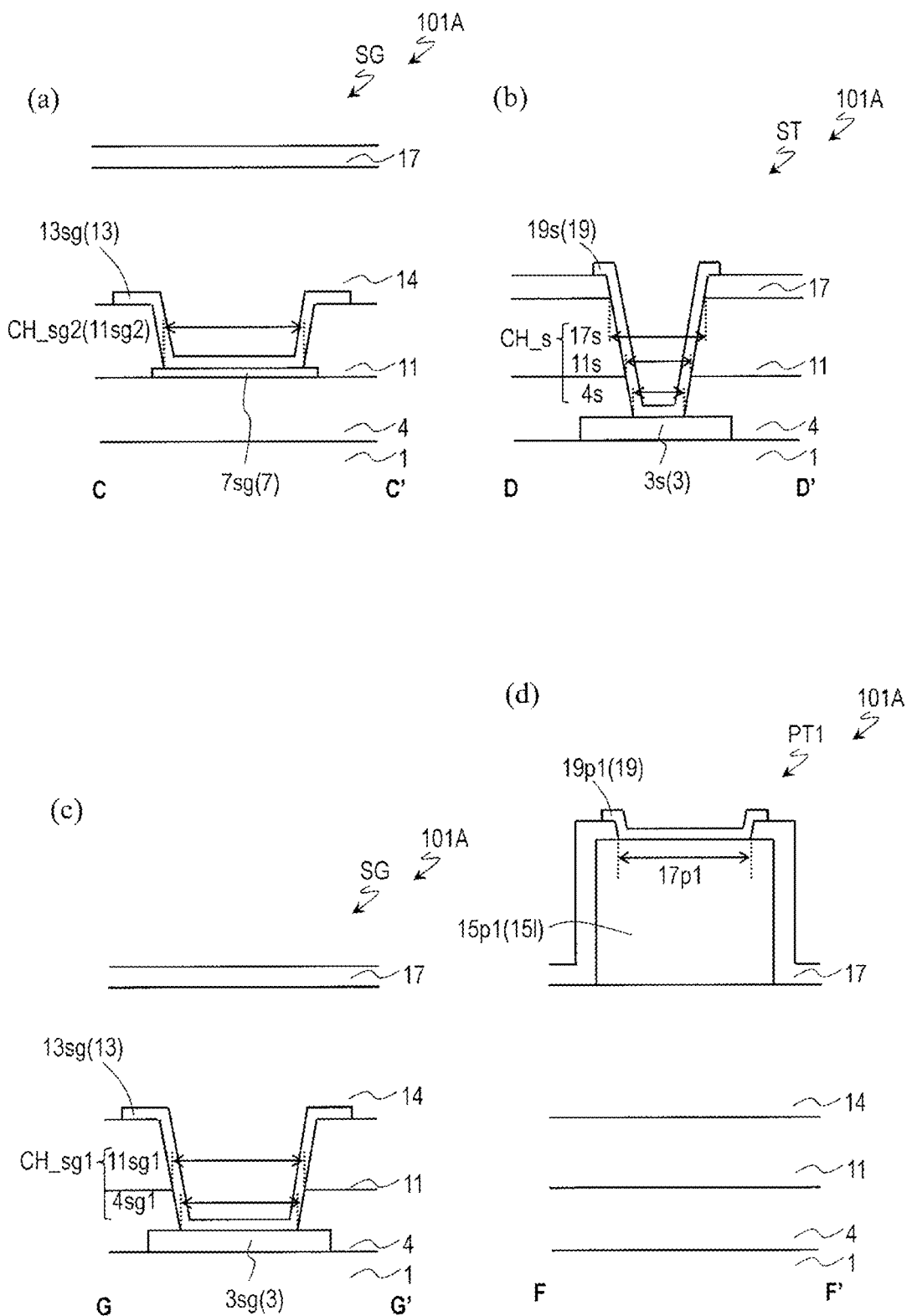
FIGS. 5(a) to 5(d) are schematic cross-sectional views of the TFT substrate 101A.
Figure 6:
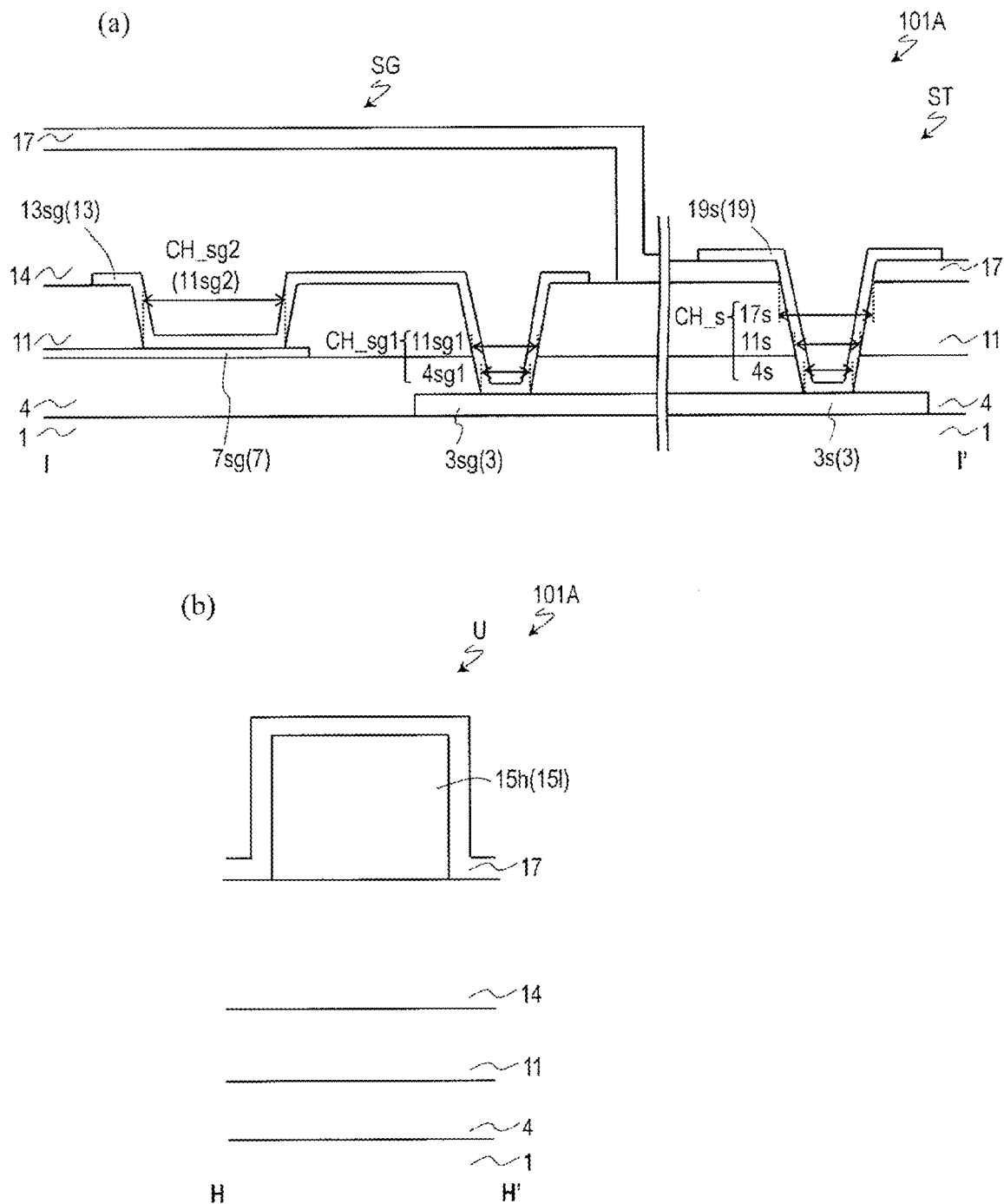
FIGS. 6(a) and 6(b) are schematic cross-sectional views of the TFT substrate 101A.

The second transfer terminal section PT2 has a cross-sectional structure the same as a portion of the first transfer terminal section PT1 not including the lower connection section 3$p$1, the contact hole CH_p1, and the opening 14$p$1 (see FIG. 5($d$)).

The lower connection section 15$p$2 is included in the patch metal layer 151. Here, the lower connection section 15$p$2 extends from the first transfer terminal conductive portion 15$p$1 and is formed integrally with the first transfer terminal conductive portion 15$p$1.

The opening (contact hole) 17$p$2 formed in the second insulating layer 17 at least reaches the lower connection section 15$p$2.

The upper connection section 19$p$2 is included in the upper conductive layer 19. The upper connection section 19$p$2 is formed on the second insulating layer 17 and within the opening 17$p$2, and is connected to the lower connection section 15$p$2 within the opening 17$p$2. Here, the upper connection section 19$p$2 is in contact with the lower connection section 15$p$2 within the opening 17$p$2.

In this example, the second transfer terminal section PT2 does not include the conductive portion included in the gate metal layer 3, the conductive portion included in the source metal layer 7, and the conductive portion included in the lower conductive layer 13.

In the second transfer terminal section PT2 also, the upper connection section 19$p$2 may be connected to a transfer terminal connection section on the slot substrate side by a sealing member containing conductive particles, for example.

Structure of Slot Substrate 201 (Non-Transmission and/or Reception Region R2)

Figure 9:
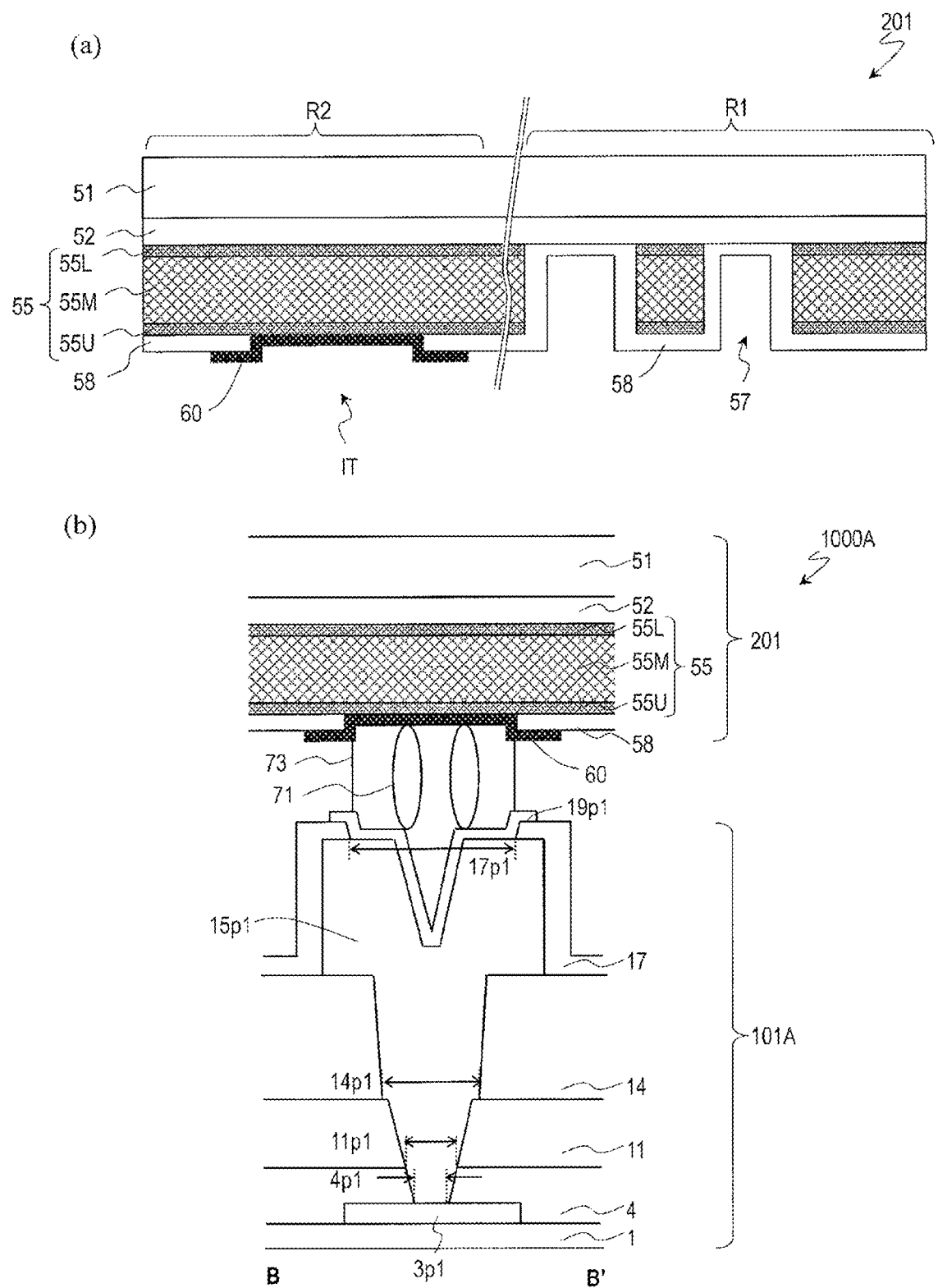
FIG. 9(a) is a cross-sectional view schematically illustrating the slot substrate 201.
FIG. 9(b) is a schematic cross-sectional view for illustrating a transfer section in the TFT substrate 101A and the slot substrate 201.
Figure 10:
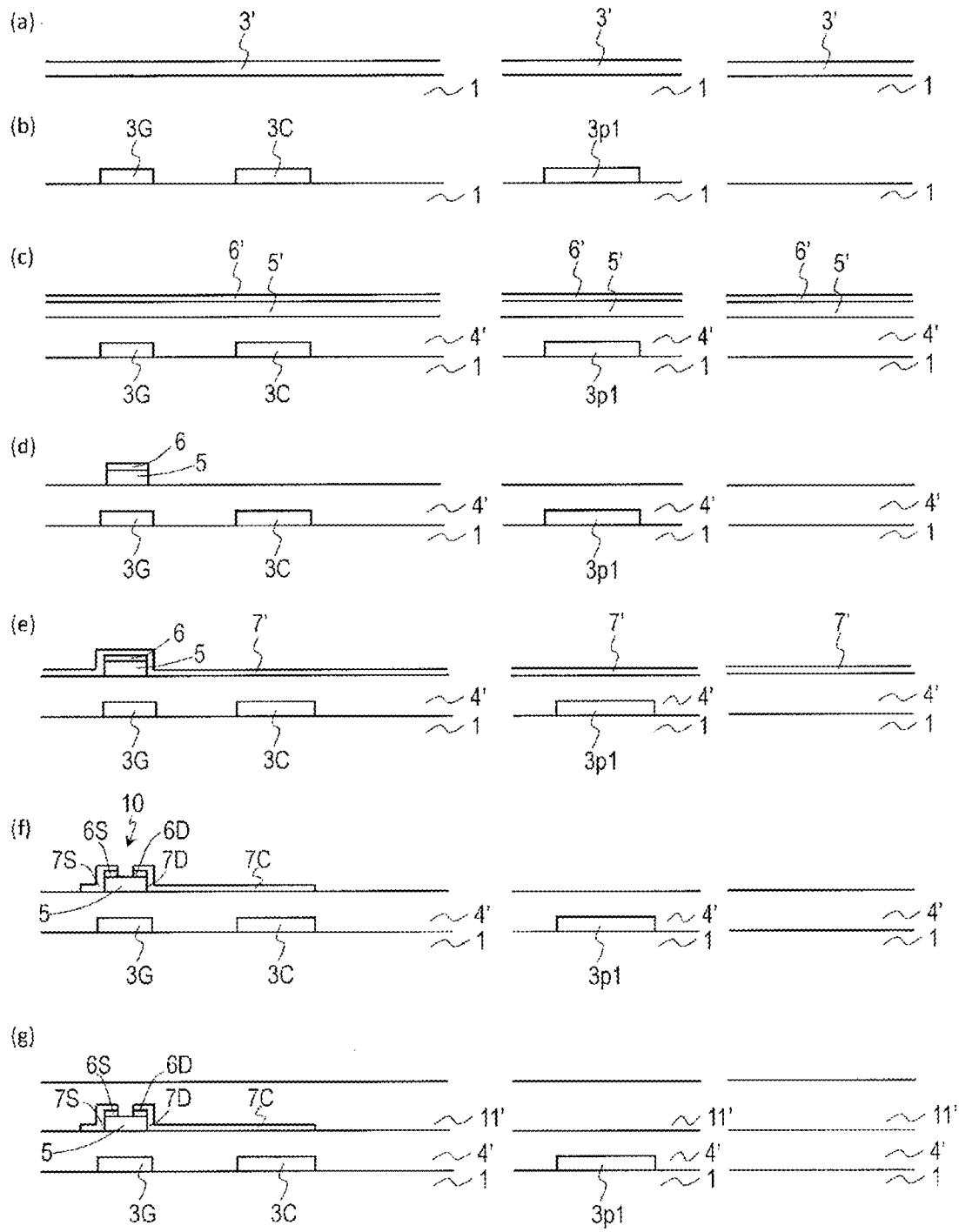
FIGS. 10(a) to 10(g) are process cross-sectional views illustrating an example of a manufacturing method of the TFT substrate 101A.
Figure 11:
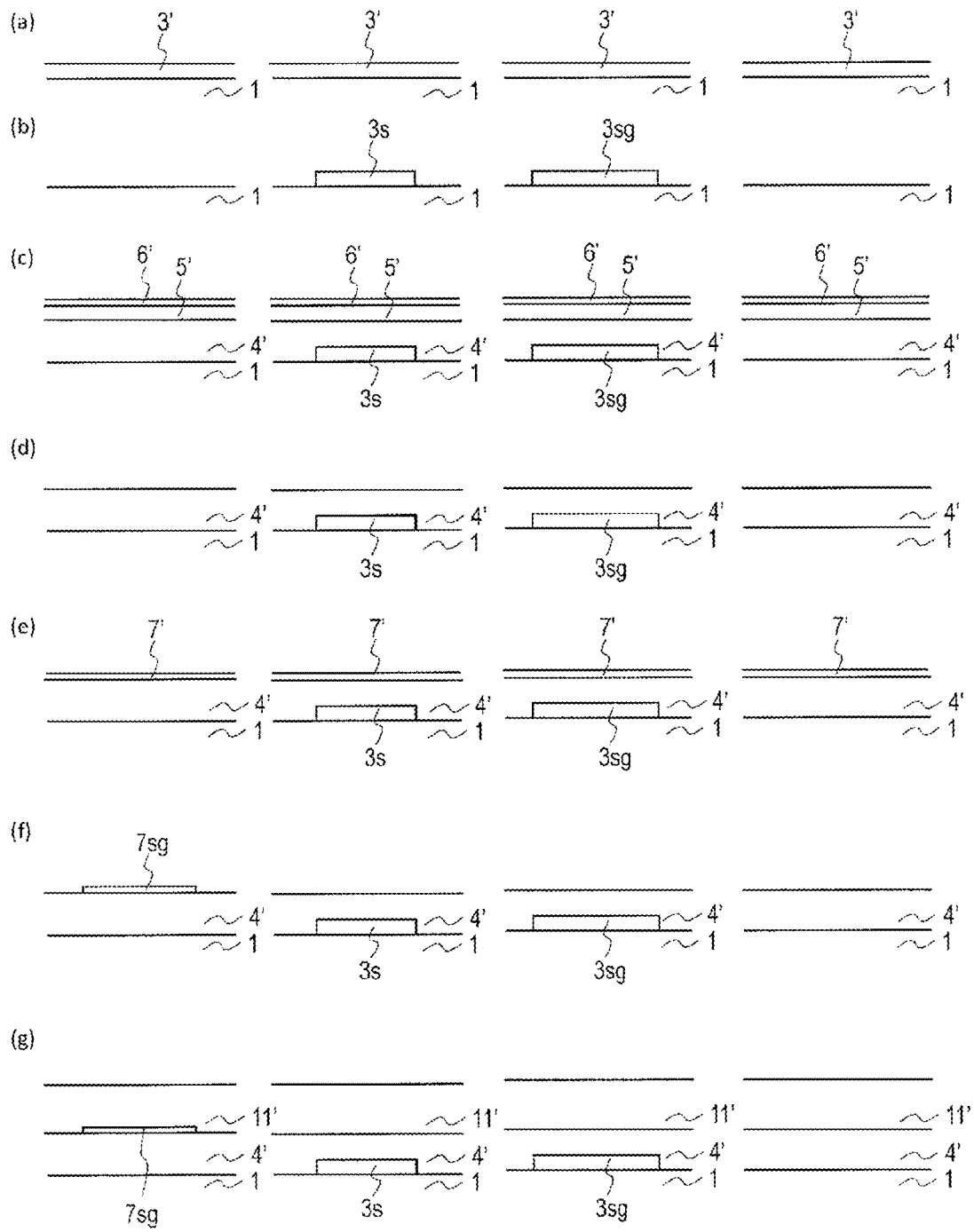
FIGS. 11(a) to 11(g) are process cross-sectional views illustrating an example of the manufacturing method of the TFT substrate 101A.

FIG. 9($a$) is a cross-sectional view schematically illustrating the antenna unit region U and the terminal section IT in the non-transmission and/or reception region R2 of the slot substrate 201. FIG. 9($b$) is a schematic cross-sectional view for illustrating the transfer section connecting the first transfer terminal section PT1 of the TFT substrate 101A and the terminal section IT of the slot substrate 201.

As illustrated in FIG. 9($a$), the terminal sections IT are provided in the non-transmission and/or reception region R2 of the slot substrate 201. The terminal section IT includes the slot electrode 55, the fourth insulating layer 58 covering the slot electrode 55, and an upper connection section 60. The fourth insulating layer 58 includes an opening that at least reaches the slot electrode 55. The upper connection section 60 is in contact with the slot electrode 55 within the opening. In the present embodiment, the terminal section IT is disposed in the seal region Rs, and is connected to the transfer terminal section on the TFT substrate (transfer section) by a seal resin containing conductive particles.

As illustrated in FIG. 9($b$), in the transfer section, the upper connection section 60 of the terminal section IT is electrically connected to the first transfer terminal upper connection section 19$p$1 of the first transfer terminal section PT1 in the TFT substrate 101A. In the present embodiment, the upper connection section 60 is connected to the upper connection section 19$p$1 with a resin (sealing resin) 73 (also referred to as a sealing portion 73) including conductive beads 71 interposed therebetween.

Each of the upper connection sections 60 and 19$p$1 is a transparent conductive layer such as an ITO film or an IZO film, and there is a possibility that an oxide film is formed on the surface thereof. When an oxide film is formed, the electrical connection between the transparent conductive layers cannot be ensured, and the contact resistance may increase. In contrast, in the present embodiment, since these transparent conductive layers are bonded with a resin including conductive beads (for example, Au beads) 71 therebetween, even in a case where a surface oxide film is formed, the conductive beads pierce (penetrate) the surface oxide film, allowing an increase in contact resistance to be suppressed. The conductive beads 71 may penetrate not only the surface oxide film but also the upper connection sections 60 and 19$p$1 which are the transparent conductive layers, and directly contact the conductive portion 15$p$1 and the slot electrode 55.

The transfer section may be disposed at both a center portion and a peripheral portion of the scanning antenna 1000A (that is, inside and outside of the donut-shaped transmission and/or reception region R1 when viewed from the normal direction of the scanning antenna 1000A), or alternatively may be disposed at only one of them. The transfer section may be disposed in the seal region Rs in which the liquid crystals are sealed, or may be disposed outside the seal region Rs (opposite to the liquid crystal layer).

Manufacturing Method of TFT Substrate 101A

A description is given of a manufacturing method of the TFT substrate 101A with reference to FIG. 10 to FIG. 17.

FIGS. 10(a) to 10(g), FIGS. 11(a) to 11(g), FIGS. 12(a) to 12(d), FIGS. 13(a) to 13(d), FIGS. 14(a) to 14(d), FIGS. 15(a) to 15(d), FIGS. 16(a) to 16(c), and FIGS. 17(a) to 17(c) are process cross-sectional views illustrating an example of the manufacturing method of the TFT substrate 101A. These drawings illustrate the cross sections corresponding to FIGS. 4(a) to 4(c), FIGS. 5(a) to 5(c), and FIG. 6(b) (the cross-sections along lines A-A', B-B', E-E', C-C', D-D', G-G', and H-H' of the TFT substrate 101A). Note that the cross-section corresponding to FIG. 5(d) (cross section along a line F-F' of the TFT substrate 101A) is formed by the same method of the cross-section corresponding to FIG. 4(c) (cross section along a line E-E' of the TFT substrate 101A), although the illustration thereof is omitted.

First, as illustrated in FIG. 10(a) and FIG. 11(a), a gate conductive film 3' is formed on the dielectric substrate 1 by sputtering or the like. Materials of the gate conductive film 3' are not specifically limited, and, for example, a film containing a metal such as aluminum (Al), tungsten (W), molybdenum (Mo), tantalum (Ta), chromium (Cr), titanium (Ti), and copper (Cu), or an alloy thereof or a metal nitride thereof can be appropriately used. Here, as the gate conductive film 3', a layered film (MoN/Al) is formed by layering an Al film (having a thickness of 150 nm, for example) and a MoN film (having a thickness of 100 nm, for example) in this order.

Next, the gate conductive film 3' is patterned to obtain the gate metal layer 3 as illustrated in FIG. 10(b) and FIG. 11(b). Specifically, the gate electrode 3G, the gate bus line GL, the auxiliary capacitance counter electrode 3C, and the CS bus line CL are formed in an antenna unit formation region, the source lower connection wiring line 3sg is formed in the source-gate connection section formation region, and the lower connection sections 3s, 3g, 3c, and 3p1 are formed in respective terminal section formation regions. Here, patterning of the gate conductive film 3' is performed by wet etching.

After that, as illustrated in FIG. 10(c) and FIG. 11(c), a gate insulating film 4', an intrinsic amorphous silicon film 5', and an n+ type amorphous silicon film 6' are formed in this order to cover the gate metal layer 3. The gate insulating film 4' can be formed by CVD or the like. As the gate insulating film 4', a silicon oxide ($SiO_2$) film, a silicon nitride ($Si_xN_y$) film, a silicon oxynitride ($SiO_xN_y$; x>y) film, a silicon nitride oxide ($SiN_xO_y$; x>y) film, or the like may be used as appropriate. Here, as the gate insulating film 4', a silicon nitride ($Si_xN_y$) film having a thickness of 350 nm, for example, is formed. The intrinsic amorphous silicon film 5' having a thickness of 120 nm, for example, and the n+ type amorphous silicon film 6' having a thickness of 30 nm, for example, are formed.

Next, the intrinsic amorphous silicon film 5' and the n+ type amorphous silicon film 6' are patterned to obtain the island-shaped semiconductor layer 5 and the contact layer 6 as illustrated in FIG. 10(d) and FIG. 11(d). Note that the semiconductor film used for the semiconductor layer 5 is not limited to an amorphous silicon film. For example, an oxide semiconductor layer may be formed as the semiconductor layer 5. In this case, it is not necessary to provide a contact layer between the semiconductor layer 5, and the source electrode and drain electrode.

Next, a source conductive film 7' is formed on the gate insulating film 4' and on the contact layer 6 as illustrated in FIG. 10(e) and FIG. 11(e) by sputtering or the like. Materials of the source conductive film 7' are not specifically limited, and, for example, a film containing a metal such as aluminum (Al), tungsten (W), molybdenum (Mo), tantalum (Ta), chromium (Cr), titanium (Ti), and copper (Cu), or an alloy thereof or a metal nitride thereof can be appropriately used. Here, as the source conductive film 7', a layered film (MoN/Al/MoN) is formed by layering MoN (having a thickness of 50 nm, for example), Al (having a thickness of 150 nm, for example), and MoN (having a thickness of 100 nm, for example) in this order.

Next, the source conductive film 7' is patterned to form the source metal layer 7 as illustrated in FIG. 10(f) and FIG. 11(f). Specifically, the source electrode 7S, the drain electrode 7D, the source bus line SL, and the auxiliary capacitance electrode 7C are formed in the antenna unit formation region, and the source bus line connection section 7sg is formed in the source-gate connection section formation region. At this time, the contact layer 6 is also etched, and the source contact layer 6S and the drain contact layer 6D separated from each other are formed. Here, patterning of the source conductive film 7' is performed by wet etching. For example, an aqueous solution containing phosphoric acid, nitric acid, and acetic acid is used to simultaneously pattern the MoN film and the Al film by wet etching. After that, a portion of the contact layer located on the region that will serve as the channel region of the semiconductor layer 5 is removed by dry etching, for example, to form a gap portion, and the source contact layer 6S and the drain contact layer 6D are separated. At this time, in the gap portion, the area around the surface of the semiconductor layer 5 is also etched (overetching). In this manner, the TFT 10 is obtained.

Note that, when a layered film in which a Ti film and an Al film layered in this order is used as a source conductive film, for example, after patterning the Al film by wet etching using, for example, an aqueous solution of phosphoric acid, acetic acid, and nitric acid, the Ti film and the contact layer (n+ type amorphous silicon layer) 6 may be simultaneously patterned by dry etching. Alternatively, it is also possible to collectively etch the source conductive film and the contact layer. However, in the case of simultaneously etching the source conductive film or the lower layer thereof and the contact layer 6, it may be difficult to control the distribution of the etching amount of the semiconductor layer 5 (the amount of excavation of the gap portion) of the entire substrate. In contrast, as described above, in a case where etching is performed in an etching step separate from the source/drain separation and the gap portion formation, the etching amount of the gap portion can be more easily controlled.

Here, in the source-gate connection section formation region, the source metal layer 7 is formed such that at least a portion of the source lower connection wiring line 3sg does not overlap the source bus line connection section 7sg. Each terminal section formation region does not include the conductive portion included in the source metal layer 7.

Next, as illustrated in FIG. 10(g) and FIG. 11(g), a first insulating film 11' is formed to cover the TFT 10 and the source metal layer 7. The first insulating film 11' is formed by CVD or the like, for example. As the first insulating film 11', a silicon oxide ($SiO_2$) film, a silicon nitride ($Si_xN_y$) film, a silicon oxynitride ($SiO_xN_y$; x>y) film, a silicon nitride oxide ($SiN_xO_y$; x>y) film, or the like may be used as appropriate. In this example, the first insulating film 11' is formed to be in contact with the channel region of the semiconductor layer 5. Here, as the first insulating film 11', a silicon nitride (SixNy) film having a thickness of 330 nm, for example, is formed.

Figure 12:
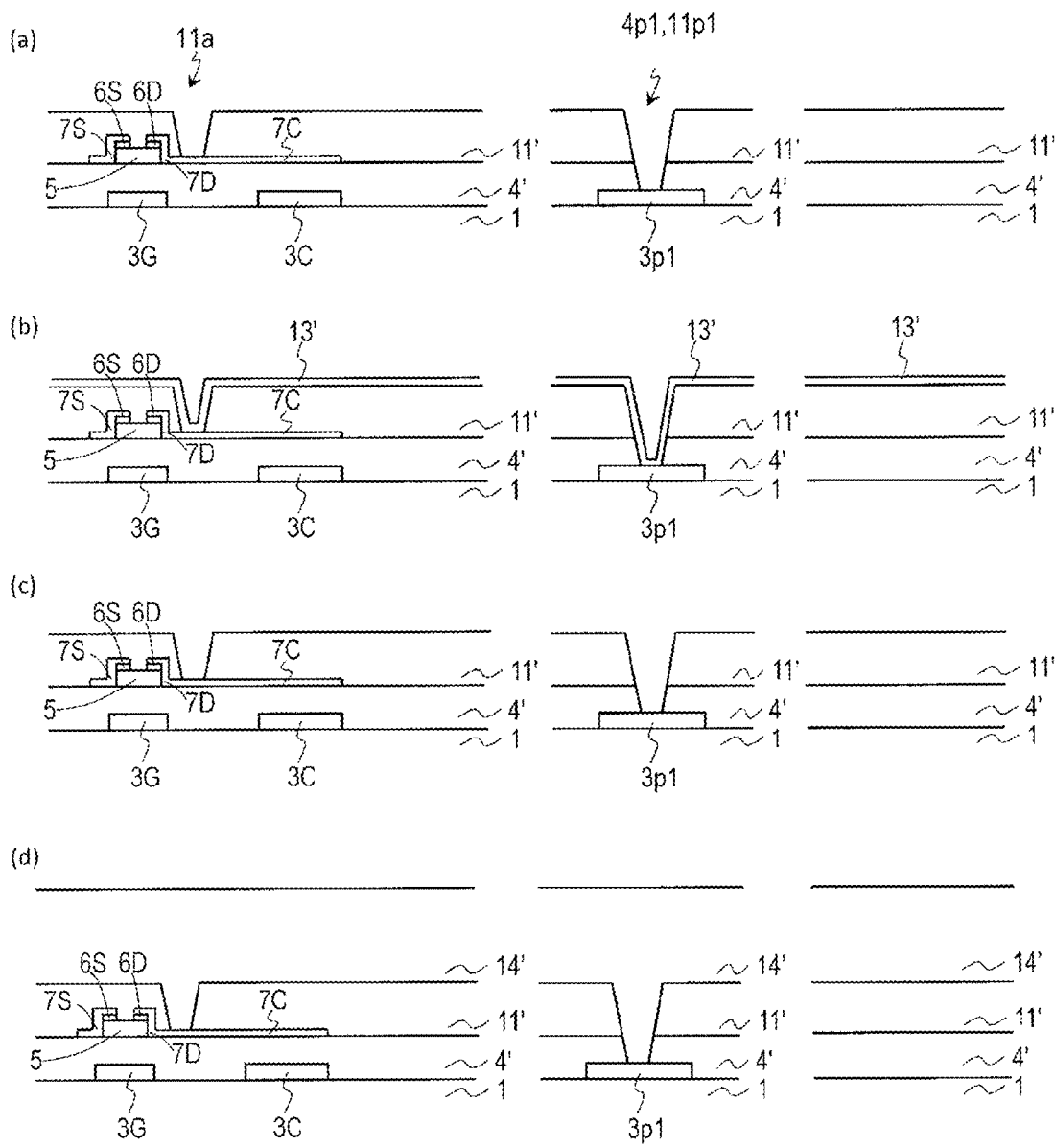
FIGS. 12(a) to 12(d) are process cross-sectional views illustrating an example of the manufacturing method of the TFT substrate 101A.

Subsequently, the first insulating film 11' and the gate insulating film 4' are etched through a known photolithography process as illustrated in FIG. 12(*a*) and FIG. 13(*a*). Specifically, in the antenna unit formation region, the opening 11*a* at least reaching the portion extending from the drain electrode 7D is formed in the first insulating film 11'. In a first transfer terminal section formation region, a contact hole that at least reaches the lower connection section 3*p*1 is formed in the gate insulating film 4' and the first insulating film 11'. In the source-gate connection section formation region, the contact hole CH_sg1 at least reaching the source lower connection wiring line 3*sg* is formed in the gate insulating film 4' and the first insulating film 11', and the opening 11*sg*2 (contact hole CH_sg2) at least reaching the source bus line connection section 7*sg* is formed in the first insulating film 11'.

In this etching process, the source metal layer 7 is used as an etch stop to etch the first insulating film 11' and the gate insulating film 4'.

In the source-gate connection section formation region, the first insulating film 11' and the gate insulating film 4' are collectively etched in a region overlapping the source lower connection wiring line 3*sg*, and the source bus line connection section 7*sg* functions as the etch stop to etch the first insulating film 11' in a region overlapping the source bus line connection section 7*sg*. This allows the contact holes CH_sg1 and CH_sg2 to be obtained.

The contact hole CH_sg1 includes the opening 4*sg*1 formed in the gate insulating film 4' and the opening 11*sg*1 formed in the first insulating film 11'. Here, since at least a portion of the source lower connection wiring line 3*sg* is formed not to overlap the source bus line connection section 7*sg*, the contact hole CH_sg1 is formed in the gate insulating film 4' and the first insulating film 11'. A side surface of the opening 4*sg*1 and a side surface of the opening 11*sg*1 may be aligned on a side surface of the contact hole CH_sg1. In the present embodiment, the expression that "the side surfaces" of different two or more layers "are aligned" within the contact hole refers to not only a case that the side surfaces exposed in the contact hole in these layers are flush in the vertical direction, but also a case that those side surfaces continuously form an inclined surface such as a tapered shape. Such a structure can be obtained, for example, by etching these layers using the same mask, or alternatively by using one of these layers as a mask to etch the other layer.

The first insulating film 11' and the gate insulating film 4' are collectively etched using the same etchant, for example. Here, the first insulating film 11' and the gate insulating film 4' are etched by dry etching using a fluorine gas. The first insulating film 11' and the gate insulating film 4' may be etched using different etchants.

In the first transfer terminal section formation region, the first insulating film 11' and the gate insulating film 4' are collectively etched to form the opening 4*p*1 in the gate insulating film 4', and the opening 11*p*1 is formed in the first insulating film 11'. A side surface of the opening 4*p*1 and a side surface of the opening 11*p*1 may be aligned with each other.

In this process, the opening is not formed in the gate insulating film 4' and first insulating film 11' in the source terminal section formation region, the gate terminal section formation region, the CS terminal section formation region, and the second transfer terminal section formation region.

Figure 13:
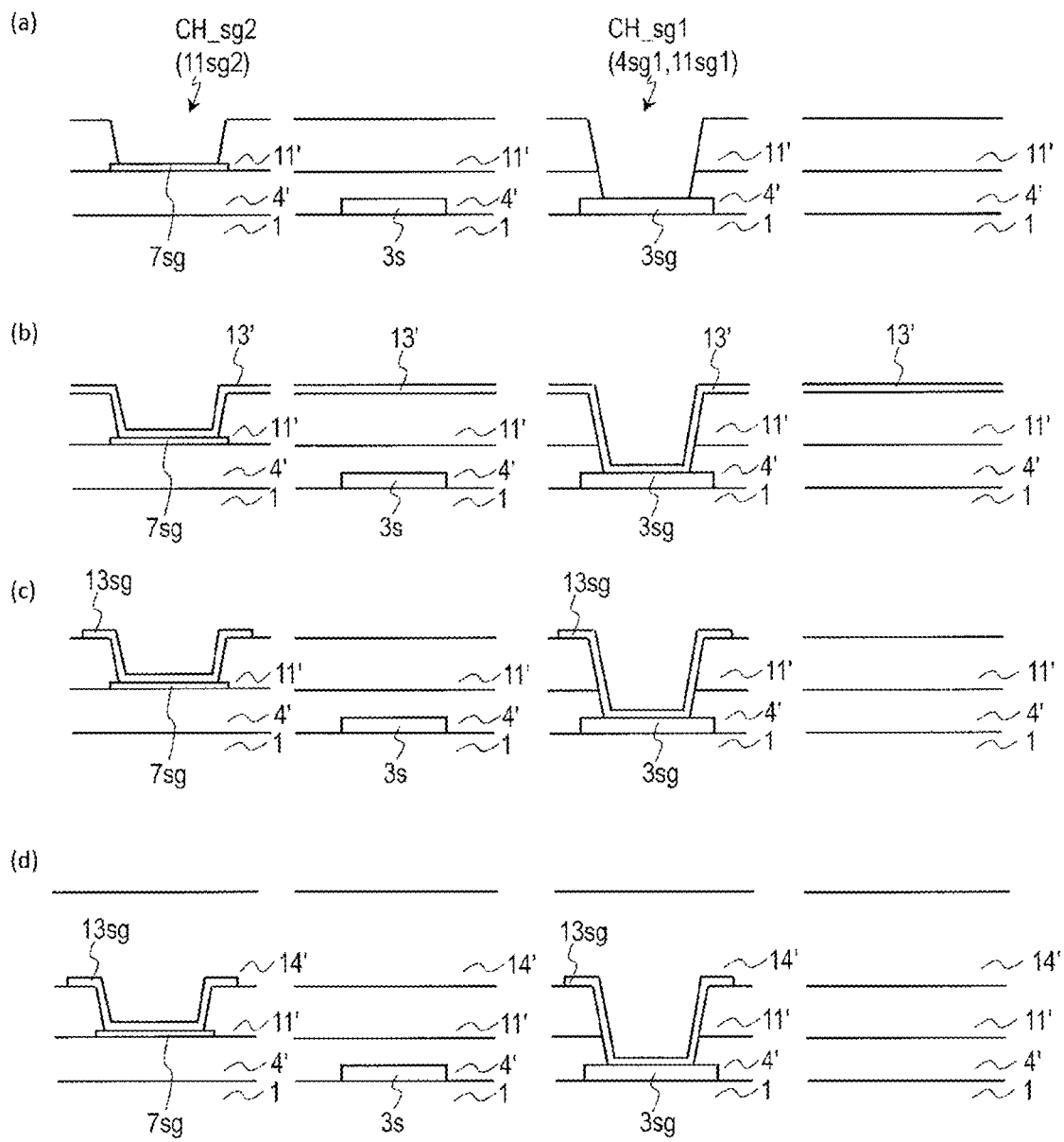
FIGS. 13(a) to 13(d) are process cross-sectional views illustrating an example of the manufacturing method of the TFT substrate 101A.

Next, as illustrated in FIG. 12(*b*) and FIG. 13(*b*), a lower conductive film 13' is formed on the first insulating film 11', within the opening 11*a*, within the contact hole CH_sg1, within the contact hole CH_sg2, and within the opening 4*p*1 by sputtering, for example. The lower conductive film 13' includes a transparent conductive film, for example. An indium tin oxide (ITO) film, an IZO film, a zinc oxide (ZnO) film or the like can be used as the transparent conductive film. Here, an ITO film having a thickness of 70 nm, for example, is formed as the lower conductive film 13'.

Next, the lower conductive film 13' is patterned to form the lower conductive layer 13 as illustrated in FIG. 12(*c*) and FIG. 13(*c*). Specifically, formed in the source-gate connection section formation region is the source bus line upper connection section 13*sg* that is in contact with the source lower connection wiring line 3*sg* within the contact hole CH_sg1 and is in contact with the source bus line connection section 7*sg* within the contact hole CH_sg2.

Next, as illustrated in FIG. 12(*d*) and FIG. 13(*d*), a flattening film 14' is formed on the lower conductive layer 13 and on the first insulating film 11'. Here, an acrylic resin film having a thickness of 480 nm, for example, is formed as the flattening film 14'.

Figure 14:
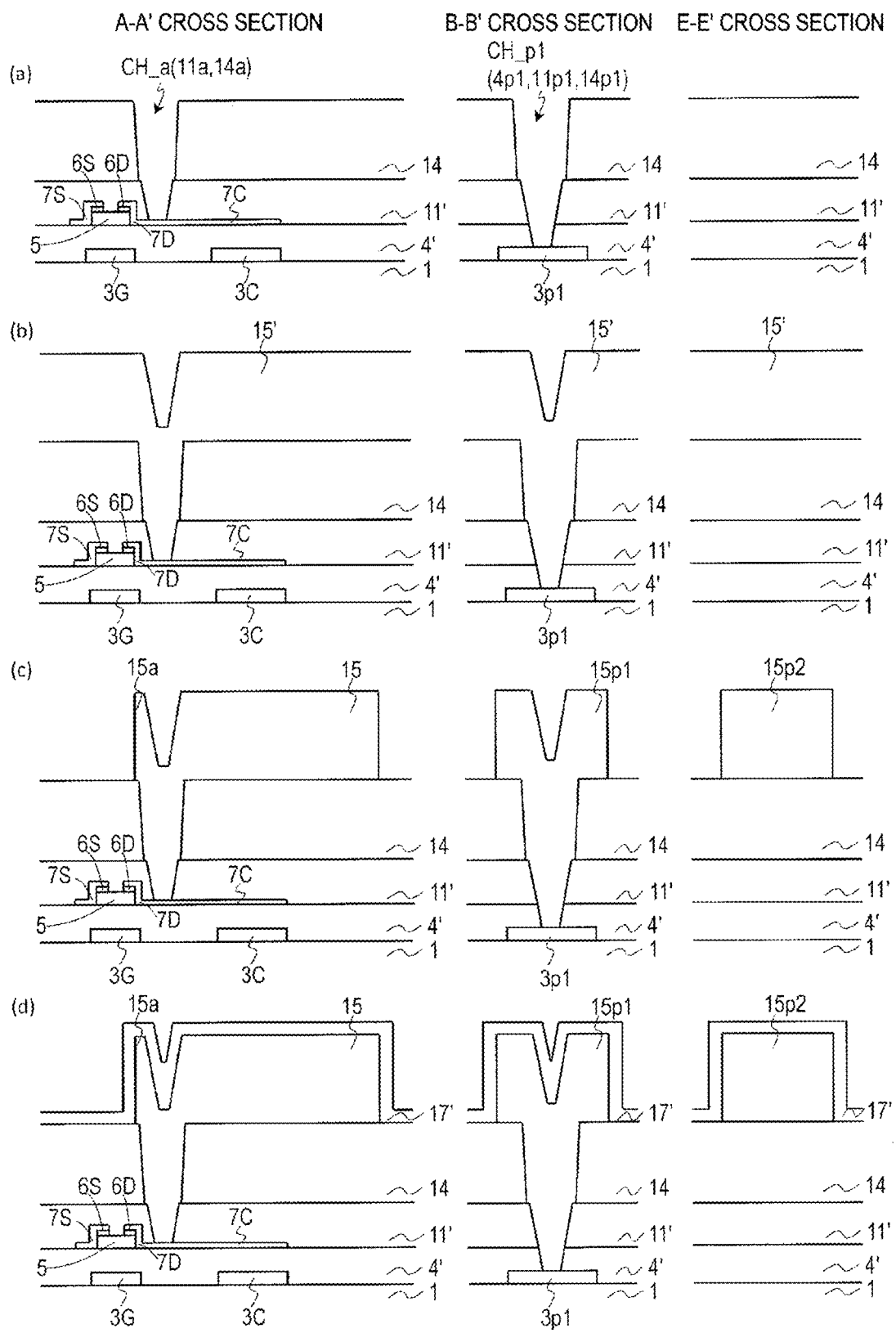
FIGS. 14(a) to 14(d) are process cross-sectional views illustrating an example of the manufacturing method of the TFT substrate 101A.

Subsequently, as illustrated in FIG. 14(*a*) and FIG. 15(*a*), the flattening film 14' is patterned to form the flattened layer 14. Here, since the flattening film 14' is photosensitive, the flattening film 14' can be exposed and developed to be patterned without forming a resist layer on the flattening film 14'. Specifically, the opening 14*a* overlapping the opening 11*a* formed in the first insulating film 11' is formed in the antenna unit formation region. This allows the contact hole CH_a to be obtained. In the first transfer terminal section formation region, the opening 14*p*1 overlapping the opening 11*p*1 formed in the first insulating film 11' is formed. This allows the contact holes CH_p1 to be obtained. The flattened layer 14 is not formed in the source terminal section formation region, the gate terminal formation region, and the CS terminal formation region. For example, the flattened layer 14 is formed not to overlap the lower connection sections 3*s*, 3*g*, and 3*c* when viewed from the normal direction of the dielectric substrate 1.

Figure 15:
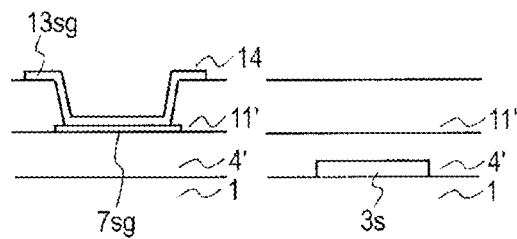
FIGS. 15(a) to 15(d) are process cross-sectional views illustrating an example of the manufacturing method of the TFT substrate 101A.
Figure 15:
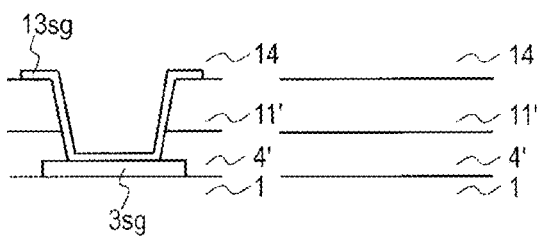
Figure 15:
Figure 15:
Figure 15:
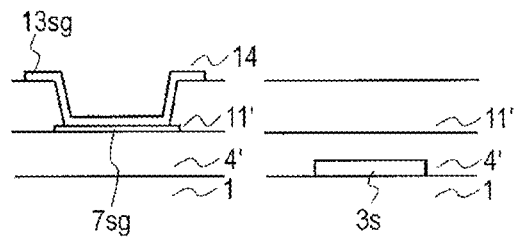
Figure 15:
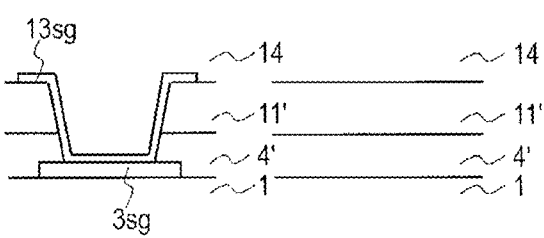
Figure 15:
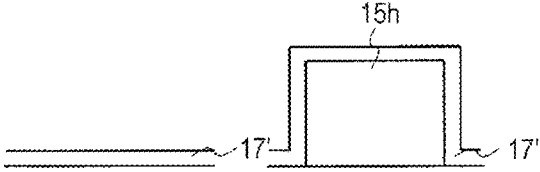
Figure 15:
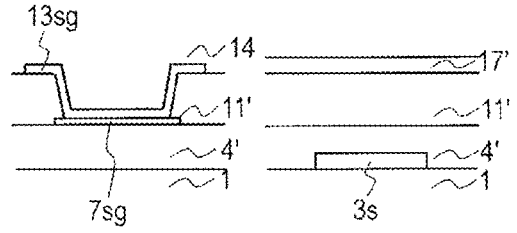
Figure 15:
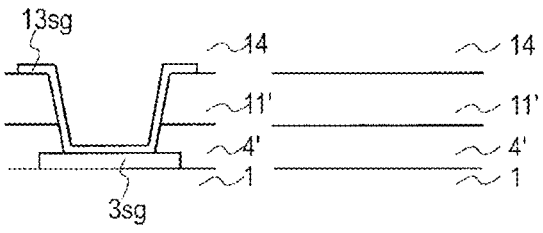
Figure 16:
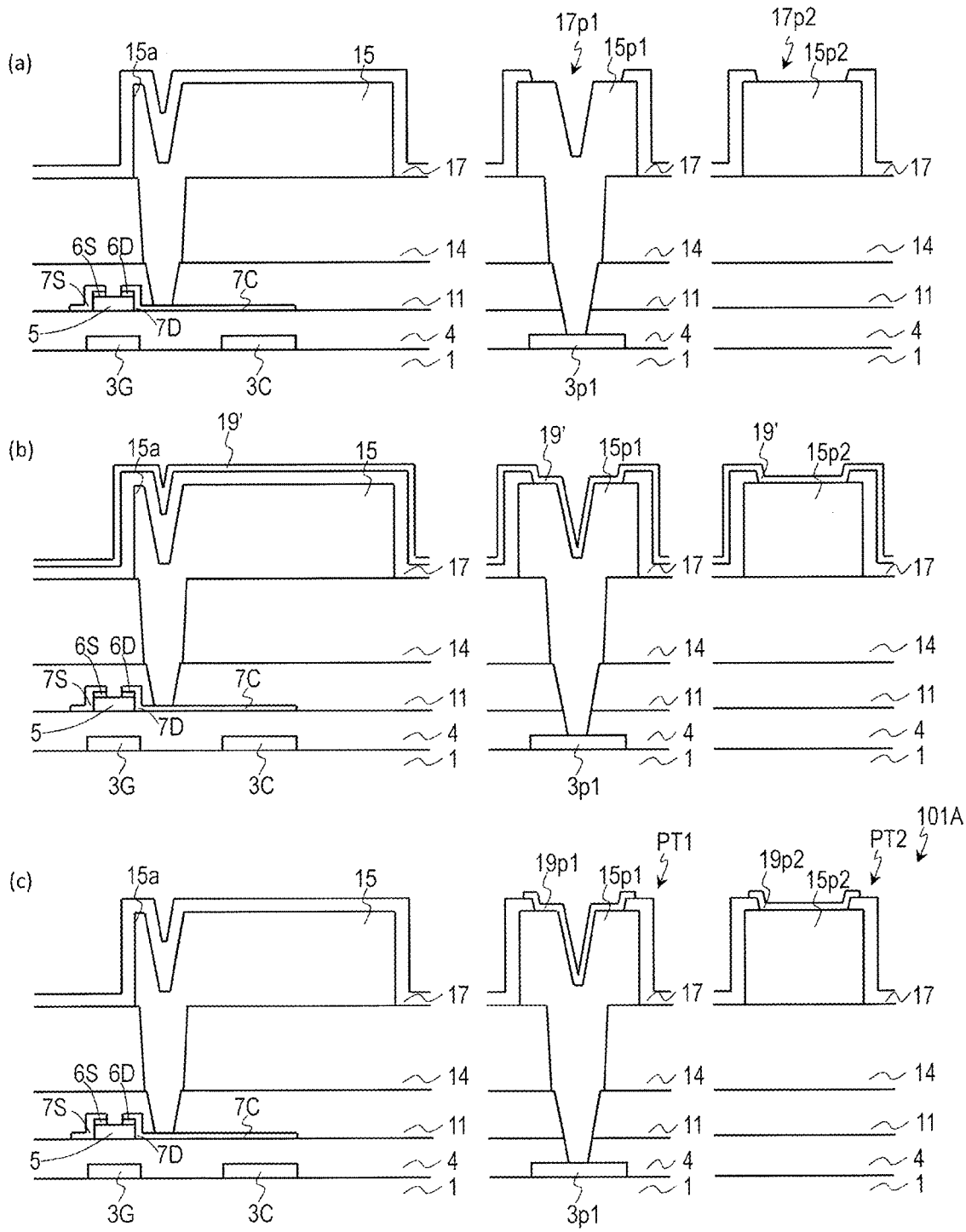
FIGS. 16(a) to 16(c) are process cross-sectional views illustrating an example of the manufacturing method of the TFT substrate 101A.
Figure 17:
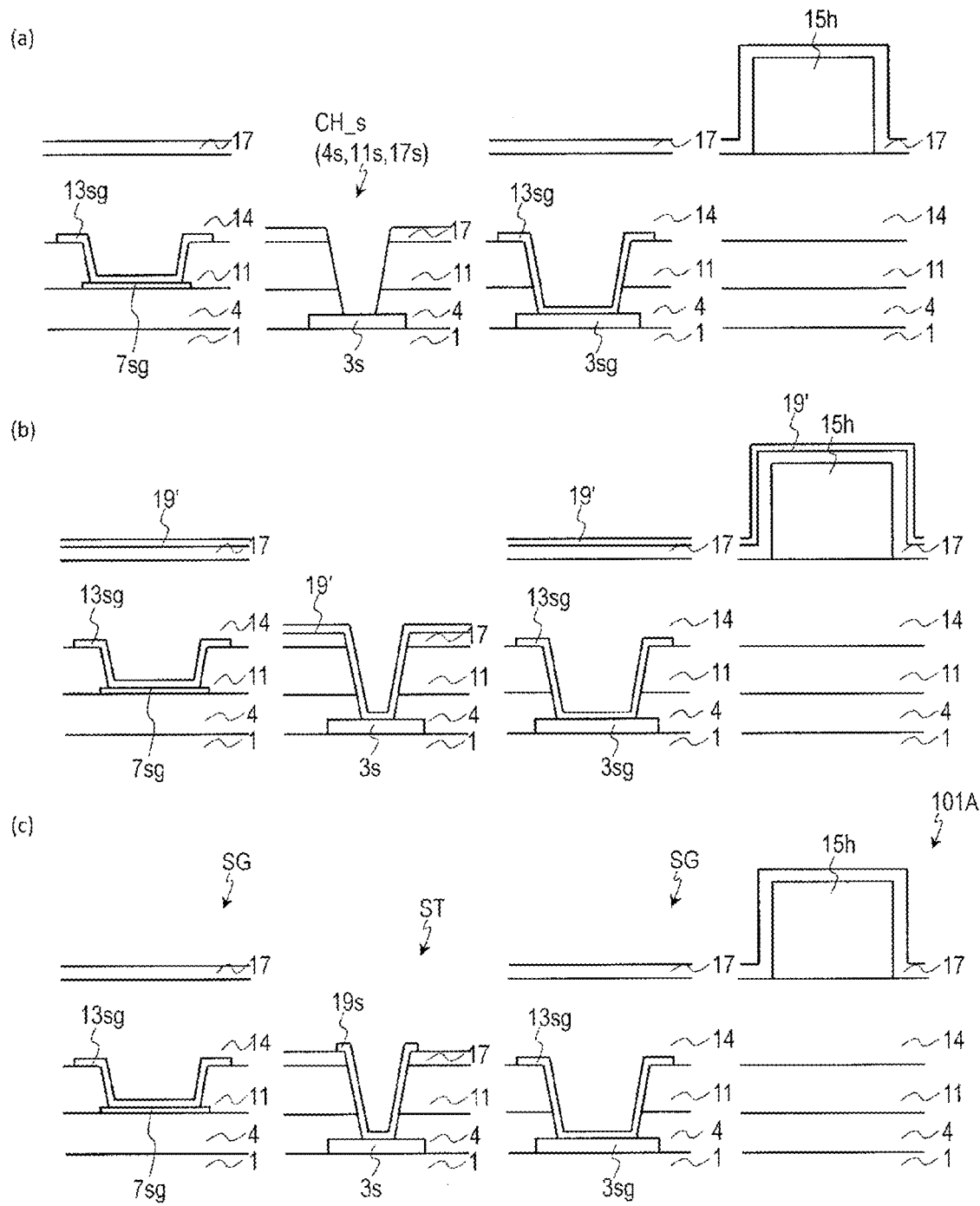
FIGS. 17(a) to 17(c) are process cross-sectional views illustrating an example of the manufacturing method of the TFT substrate 101A.

Next, as illustrated in FIG. 14(*b*) and FIG. 15(*b*), a patch conductive film 15' is formed on the lower conductive layer 13, on the first insulating film 11', and on the flattened layer 14. The same material as that of the gate conductive film 3' or the source conductive film 7' can be used as the material of the patch conductive film 15'. Here, as the patch conductive film 15', a layered film (Cu/Ti) is formed which includes a Ti film (having a thickness of 20 nm, for example) and a Cu film (having a thickness of 500 nm, for example) in this order. Alternatively, as the patch conductive film 15', a layered film (MoN/Al/MoN) may be formed which includes a MoN film (having a thickness of 50 nm, for example), an Al film (having a thickness of 1000 nm, for example), and a MoN film (having a thickness of 50 nm, for example) in this order.

The patch conductive film is preferably set to be thicker than the gate conductive film and the source conductive film. Accordingly, by reducing the sheet resistance of the patch electrode, the loss resulting from the oscillation of free electrons in the patch electrode changing to heat can be reduced. A suitable thickness of the patch conductive film is, for example, greater than or equal to 0.3 μm. In a case where the thickness of the patch conductive film becomes thinner than this, the sheet resistance becomes greater or equal to 0.10 Ω/sq, and there is a possibility that the loss increases. The thickness of the patch conductive film is, for example, less than or equal to 3 μm, and more preferably less than or equal to 2 μm. In a case where the thickness is thicker than this, warping of the substrate may be caused by a thermal stress in the process. In a case where the warping is large, problems such as conveyance troubles, chipping of the substrate, or cracking of the substrate may occur in the mass production process.

Next, the patch conductive film 15' is patterned to form the patch metal layer 151 as illustrated in FIG. 14(c) and FIG. 15(c). Specifically, the patch electrode 15, the connection section 15a, and the protruding portion 15h are formed in the antenna unit formation region, the conductive portion 15p1 is formed in the first transfer terminal section formation region, and the lower connection section 15p2 is formed in the second transfer terminal section formation region.

In the antenna unit formation region, the connection section 15a is formed to be connected to the portion extending from the drain electrode 7D within the opening 11a. In the first transfer terminal section formation region, the conductive portion 15p1 is formed to be connected to the lower connection section 3p1 within the contact hole CH_p1.

In the case that the layered film (MoN/Al/MoN) is formed as the patch conductive film 15' by layering MoN, Al, and MoN in this order, patterning of the patch conductive film 15' is performed by wet etching using, as an etching solution, an aqueous solution containing phosphoric acid, nitric acid, and acetic acid, for example, to simultaneously pattern the MoN film and the Al film. In the case that the layered film (Cu/Ti) is formed as the patch conductive film 15' by layering Ti and Cu in this order, the patch conductive film 15' can be patterned by wet etching using, as an etching solution, an acid mixed aqueous solution, for example.

The patch conductive film 15' in the source-gate connection section formation region is removed in the process of patterning the patch conductive film 15'. Since the source bus line upper connection section 13sg is formed within the contact hole CH_sg1 and within the contact hole CH_sg2, damage by etching to the source lower connection wiring line 3sg and/or source bus line connection section 7sg is reduced in the process of patterning the patch conductive film 15'.

Here, a portion of the source lower connection wiring line 3sg exposed by the contact hole CH_sg1 is covered by the source bus line upper connection section 13sg, and a portion of the source bus line connection section 7sg exposed by the contact hole CH_sg2 is covered by the source bus line upper connection section 13sg. This effectively reduces the etching damage to the source bus line connection section 7sg and/or source lower connection wiring line 3sg.

Next, as illustrated in FIG. 14(d) and FIG. 15(d), a second insulating film 17' is formed on the patch metal layer 151, on the flattened layer 14, on the lower conductive layer 13, and on the first insulating layer 11. The second insulating film 17' is formed by CVD, for example. As the second insulating film 17', a silicon oxide ($SiO_2$) film, a silicon nitride ($Si_xN_y$) film, a silicon oxynitride ($SiO_xN_y$; x>y) film, a silicon nitride oxide ($SiN_xO_y$; x>y) film, or the like may be used as appropriate. Here, as the second insulating film 17', a silicon nitride ($Si_xN_y$) film having a thickness of 100 nm, for example, is formed. The second insulating film 17' is formed to cover the patch metal layer 151 and the flattened layer 14.

Next, the gate insulating film 4', the first insulating film 11', and the second insulating film 17' are etched through a known photolithography process to form the gate insulating layer 4, the first insulating layer 11, and the second insulating layer 17 as illustrated in FIG. 16(a) and FIG. 17(a). Specifically, in the source terminal section formation region, the contact hole CH_s at least reaching the lower connection section 3s is formed in the second insulating film 17', the first insulating film 11', and the gate insulating film 4'. In the gate terminal section formation region, the contact hole CH_g at least reaching the lower connection section 3g is formed in the second insulating film 17', the first insulating film 11', and the gate insulating film 4'. In the CS terminal section formation region, the contact hole CH_c at least reaching the lower connection section 3c is formed in the second insulating film 17', the first insulating film 11', and the gate insulating film 4'. In the first transfer terminal section formation region, the opening 17p1 at least reaching the conductive portion 15p1 is formed in the second insulating film 17'. In the second transfer terminal section formation region, the opening 17p2 at least reaching the lower connection section 15p2 is formed in the second insulating film 17'.

The second insulating film 17', the first insulating film 11', and the gate insulating film 4' are collectively etched using the same etchant, for example. Here, the second insulating film 17', the first insulating film 11', and the gate insulating film 4' are etched by dry etching using a fluorine gas. The second insulating film 17', the first insulating film 11', and the gate insulating film 4' may be etched using different etchants.

In this etching process, the patch metal layer 151 is used as an etch stop to etch the second insulating film 17', the first insulating film 11', and the gate insulating film 4'. Since the conductive portions included in the source metal layer 7 and patch metal layer 151 are not formed in each of the source terminal section formation region, the gate terminal section formation region, and the CS terminal section formation region, the second insulating film 17', the first insulating film 11', and the gate insulating film 4' are collectively etched.

In the source terminal section formation region, the second insulating film 17', the first insulating film 11', and the gate insulating film 4' are collectively etched to form the contact hole CH_s. The contact hole CH_s includes the opening 4s that is formed in the gate insulating layer 4 and at least reaches the lower connection section 3s, the opening 11s that is formed in the first insulating layer 11 and overlaps the opening 4s, and the opening 17s that is formed in the second insulating layer 17 and overlaps the opening 11s. A side surface of the opening 4s, a side surface of the opening 11s, and a side surface of the opening 17s may be aligned on a side surface of the contact hole CH_s.

In the gate terminal section formation region, the second insulating film 17', the first insulating film 11', and the gate insulating film 4' are collectively etched to form the contact hole CH_g. The contact hole CH_g includes the opening 4g that is formed in the gate insulating layer 4 and at least reaches the lower connection section 3g, the opening 11g that is formed in the first insulating layer 11 and overlaps the opening 4g, and the opening 17g that is formed in the second insulating layer 17 and overlaps the opening 11g. A side surface of the opening 4g, a side surface of the opening 11g, and a side surface of the opening 17g may be aligned on a side surface of the contact hole CH_g.

In the CS terminal section formation region, the second insulating film 17', the first insulating film 11', and the gate insulating film 4' are collectively etched to form the contact hole CH_c. The contact hole CH_c includes the opening 4c that is formed in the gate insulating layer 4 and at least reaches the lower connection section 3c, the opening 11c that is formed in the first insulating layer 11 and overlaps the opening 4c, and the opening 17c that is formed in the second insulating layer 17 and overlaps the opening 11c. A side surface of the opening 4c, a side surface of the opening 11c, and a side surface of the opening 17c may be aligned on a side surface of the contact hole CH_c.

Next, as illustrated in FIG. 16(b) and FIG. 17(b), an upper conductive film 19' is formed on the second insulating layer 17, within the contact hole CH_s, within the contact hole CH_g, within the contact hole CH_c, within the opening 17p1, and within the opening 17p2 by sputtering, for example. The upper conductive film 19' includes a transparent conductive film, for example. An indium tin oxide (ITO) film, an IZO film, a zinc oxide (ZnO) film or the like can be used as the transparent conductive film. Here, an ITO film having a thickness of 70 nm, for example, is used as the upper conductive film 19'. Alternatively, a layered film (ITO/Ti) formed by layering Ti (having a thickness of 50 nm, for example) and ITO (having a thickness of 70 nm, for example) in this order may be used as the upper conductive film 19'. In place of the Ti film, a layered film formed of one film or two or more films selected from the group consisting of a MoNbNi film, a MoNb film, a MoW film, a W film, and a Ta film may be used. Specifically, as the upper conductive film 19', a layered film may be used that is formed by layering a layered film formed of one film or two or more films selected from the group consisting of a Ti film, a MoNbNi film, a MoNb film, a MoW film, a W film, and a Ta film, and an ITO film in this order.

Next, the upper conductive film 19' is patterned to form the upper conductive layer 19 as illustrated in FIG. 16(c) and FIG. 17(c). Specifically, formed are the upper connection section 19s in contact with the lower connection section 3s within the contact hole CH_s in the source terminal section formation region, the upper connection section 19g in contact with the lower connection section 3g within the contact hole CH_g in the gate terminal section formation region, the upper connection section 19c in contact with the lower connection section 3c within the contact hole CH_c in the CS terminal section formation region, the upper connection section 19p1 in contact with the conductive portion 15p1 within the opening 17p1 in the first transfer terminal section formation region, and the upper connection section 19p2 connected with the lower connection section 15p2 within the opening 17p2 in the second transfer terminal section formation region. This provides the antenna unit region U, the source-gate connection section SG, the source terminal section ST, the gate terminal section GT, the CS terminal section CT, the first transfer terminal section PT1, and the second transfer terminal section PT2.

In this manner, the TFT substrate 101A is manufactured.

Manufacturing Method of Slot Substrate 201

The slot substrate 201 can be manufactured by the following method, for example.

First, the third insulating layer (having a thickness of 200 nm, for example) 52 is formed on the dielectric substrate. A substrate such as a glass substrate or a resin substrate having a high transmittance to electromagnetic waves (the dielectric constant EM and the dielectric loss tan $\delta_M$ are small) can be used as the dielectric substrate. The dielectric substrate is preferably thin in order to suppress the attenuation of the electromagnetic waves. For example, after forming the constituent elements such as the slot electrode 55 on the front surface of the glass substrate by a process to be described later, the glass substrate may be thinned from the rear side. This allows the thickness of the glass substrate to be reduced to 500 μm or less, for example.

When a resin substrate is used as the dielectric substrate, constituent elements such as TFTs may be formed directly on the resin substrate, or may be formed on the resin substrate by a transfer method. In a case of the transfer method, for example, a resin film (for example, a polyimide film) is formed on the glass substrate, and after the constituent elements are formed on the resin film by the process to be described later, the resin film on which the constituent elements are formed is separated from the glass substrate. Generally, the dielectric constant EM and the dielectric loss tan $\delta_M$ of resin are smaller than those of glass. The thickness of the resin substrate is, for example, from 3 μm to 300 μm. Besides polyimide, for example, a liquid crystal polymer can also be used as the resin material.

The third insulating layer 52 is not particularly limited to a specific film, and, for example, a silicon oxide ($SiO_2$) film, a silicon nitride (SiNx) film, a silicon oxynitride (SiOxNy; x>y) film, a silicon nitride oxide (SiNxOy; x>y) film, or the like can be used as appropriate.

Next, a metal film is formed on the third insulating layer 52, and this is patterned to obtain the slot electrode 55 including the plurality of slots 57. As the metal film, a Cu film (or Al film) having a thickness of from 2 μm to 5 μm may be used. Here, as the metal film, a layered film formed by layering a Ti (having a thickness of 20 nm, for example) and a Cu (having a thickness of 3000 nm, for example) in this order is used. Note that a layered film may be formed by layering a Ti film, a Cu film, and a Ti film in this order.

After that, the fourth insulating layer (having a thickness of 100 nm or 200 nm, for example) 58 is formed on the slot electrode 55 and within the slot 57. The material of the fourth insulating layer 58 may be the same as the material of the third insulating layer. Subsequently, in the non-transmission and/or reception region R2, an opening that at least reaches the slot electrode 55 is formed in the fourth insulating layer 58.

Next, a transparent conductive film is formed on the fourth insulating layer 58 and within the opening of the fourth insulating layer 58, and is patterned to form the upper connection section 60 in contact with the slot electrode 55 within the opening. In this way, the terminal section IT is obtained.

After that, a photosensitive resin film is formed on the fourth insulating layer 58 and the upper connection section 60, and the photosensitive resin film is exposed and developed via a photomask having openings with a predetermined pattern to form the columnar spacer PS. The photosensitive resin may be negative-working or positive-working. Here, an acrylic resin film (thickness: 2.7 μm, for example) is used.

In this manner, the slot substrate 201 is manufactured.

Note that in the case that the TFT substrate includes the columnar spacer PS, the columnar spacer PS may be formed by that the TFT substrate 101A is manufactured by the above method, and thereafter, a photosensitive resin film is formed on the second insulating layer 17 and the upper conductive layer 19, and then exposed and developed.

Material and Structure of TFT 10

In the present embodiment, a TFT including a semiconductor layer 5 as an active layer is used as a switching element disposed in each pixel. The semiconductor layer 5 is not limited to an amorphous silicon layer, and may be a polysilicon layer or an oxide semiconductor layer.

In a case where an oxide semiconductor layer is used, the oxide semiconductor included in the oxide semiconductor layer may be an amorphous oxide semiconductor or a crystalline oxide semiconductor including a crystalline portion. Examples of the crystalline oxide semiconductor include a polycrystalline oxide semiconductor, a microcrystalline oxide semiconductor, or a crystalline oxide semiconductor having a c-axis oriented substantially perpendicular to the layer surface.

The oxide semiconductor layer may have a layered structure including two or more layers. In a case where the oxide semiconductor layer includes a layered structure, the oxide semiconductor layer may include an amorphous oxide semiconductor layer and a crystalline oxide semiconductor layer. Alternatively, the oxide semiconductor layer may include a plurality of crystalline oxide semiconductor layers having different crystal structures. In addition, the oxide semiconductor layer may include a plurality of amorphous oxide semiconductor layers. In a case where the oxide semiconductor layer has a dual-layer structure including an upper layer and a lower layer, an energy gap of the oxide semiconductor included in the upper layer is preferably greater than an energy gap of the oxide semiconductor included in the lower layer. However, when a difference in the energy gap between these layers is relatively small, the energy gap of the oxide semiconductor in the lower layer may be greater than the energy gap of the oxide semiconductor in the upper layer.

Materials, structures, and film formation methods of an amorphous oxide semiconductor and the above-described crystalline oxide semiconductors, a configuration of an oxide semiconductor layer including a layered structure, and the like are described in, for example, JP 2014-007399 A. The entire contents of the disclosure of JP 2014-007399 A are incorporated herein as reference.

The oxide semiconductor layer may include, for example, at least one metal element selected from In, Ga, and Zn. In the present embodiment, the oxide semiconductor layer includes, for example, an In—Ga—Zn—O based semiconductor (for example, an indium gallium zinc oxide). Here, the In—Ga—Zn—O based semiconductor is a ternary oxide of In (indium), Ga (gallium), and Zn (zinc), and a ratio (composition ratio) of In, Ga, and Zn is not particularly limited. For example, the ratio includes In:Ga:Zn=2:2:1, In:Ga:Zn=1:1:1, or In:Ga:Zn=1:1:2. Such an oxide semiconductor layer can be formed of an oxide semiconductor film including an In—Ga—Zn—O based semiconductor.

The In—Ga—Zn—O based semiconductor may be an amorphous semiconductor, or may be a crystalline semiconductor. A crystalline In—Ga—Zn—O based semiconductor in which a c-axis is oriented substantially perpendicular to a layer surface is preferable as the crystalline In—Ga—Zn—O based semiconductor.

Note that a crystal structure of the crystalline In—Ga—Zn—O based semiconductor is disclosed in, for example, JP 2014-007399 A, JP 2012-134475 A, and JP 2014-209727 A as described above. The entire contents of the disclosure of JP 2012-134475 A and JP 2014-209727 A are incorporated herein as reference. Since a TFT including an In—Ga—Zn—O based semiconductor layer has high mobility (more than 20 times in comparison with a-Si TFTs) and low leakage current (less than 1/100th in comparison with a-Si TFTs), such a TFT can suitably be used as a driving TFT (for example, a TFT included in a driving circuit provided in the non-transmission and/or reception region) and a TFT provided in each antenna unit region.

In place of the In—Ga—Zn—O based semiconductor, the oxide semiconductor layer may include another oxide semiconductor. For example, the oxide semiconductor layer may include an In—Sn—Zn—O based semiconductor (for example, $In_2O_3$—$SnO_2$—ZnO; InSnZnO). The In—Sn—Zn—O based semiconductor is a ternary oxide of In (indium), Sn (tin), and Zn (zinc). Alternatively, the oxide semiconductor layer may include an In—Al—Zn—O based semiconductor, an In—Al—Sn—Zn—O based semiconductor, a Zn—O based semiconductor, an In—Zn—O based semiconductor, a Zn—Ti—O based semiconductor, a Cd—Ge—O based semiconductor, a Cd—Pb—O based semiconductor, a CdO (cadmium oxide), an Mg—Zn—O based semiconductor, an In—Ga—Sn—O based semiconductor, an In—Ga—O based semiconductor, a Zr—In—Zn—O based semiconductor, an Hf—In—Zn—O based semiconductor, an Al—Ga—Zn—O based semiconductor, or a Ga—Zn—O based semiconductor.

In the example illustrated in FIG. 3, the TFT 10 is a channel etch type TFT having a bottom gate structure. The "channel etch type TFT" does not include an etch stop layer formed on the channel region, and a lower face of an end portion of each of the source and drain electrodes, which is closer to the channel, is provided so as to be in contact with an upper face of the semiconductor layer. The channel etch type TFT is formed by, for example, forming a conductive film for a source/drain electrode on a semiconductor layer and performing source/drain separation. In the source/drain separation process, the surface portion of the channel region may be etched.

Note that the TFT 10 may be an etch stop type TFT in which an etch stop layer is formed on the channel region. In the etch stop type TFT, the lower face of an end portion of each of the source and drain electrodes, which is closer to the channel, is located, for example, on the etch stop layer. The etch stop type TFT is formed as follows; after forming an etch stop layer covering the portion that will become the channel region in a semiconductor layer, for example, a conductive film for the source and drain electrodes is formed on the semiconductor layer and the etch stop layer, and source/drain separation is performed.

In addition, although the TFT 10 has a top contact structure in which the source and drain electrodes are in contact with the upper face of the semiconductor layer, the source and drain electrodes may be disposed to be in contact with the lower face of the semiconductor layer (a bottom contact structure). Furthermore, the TFT 10 may have a bottom gate structure having a gate electrode on the dielectric substrate side of the semiconductor layer, or a top gate structure having a gate electrode above the semiconductor layer.

Modification Example 2

A scanning antenna 1000Aa and a TFT substrate 101Aa included in the scanning antenna 1000Aa in Modification Example 2 of the present embodiment will be described with reference to FIGS. 18 and 19. The constitutions common to the scanning antenna 1000A and the TFT substrate 101A are denoted by the same reference signs and the descriptions thereof are omitted.

Structure of TFT Substrate 101Aa

FIGS. 18(a) to 18(c) are schematic plan views of the scanning antenna 1000Aa, and FIGS. 19(a) to 19(c) are schematic cross-sectional views of the TFT substrate 101Aa. FIG. 18(a) illustrates the antenna unit region U in the transmission and/or reception region R1, FIG. 18(b) illustrates the transfer terminal section PT, the gate terminal section GT, and the CS terminal section CT provided in the non-transmission and/or reception region R2, and FIG. 18(c) illustrates the source-gate connection section SG and the source terminal section ST provided in the non-transmission and/or reception region R2. FIG. 19(a) illustrates a cross section of the antenna unit region U along a line A-A' in FIG. 18(a), FIG. 19(b) illustrates a cross section of the first transfer terminal section PT1 along a line B-B' in FIG. 18(b), and FIG. 19(c) illustrates a cross section of the second transfer terminal section PT2 along a line E-E' in FIG. 18(b). Note that other cross sections of the TFT substrate 101Aa are the same as the TFT substrate 101A, and thus, illustrations and descriptions thereof will be omitted.

Figure 18:
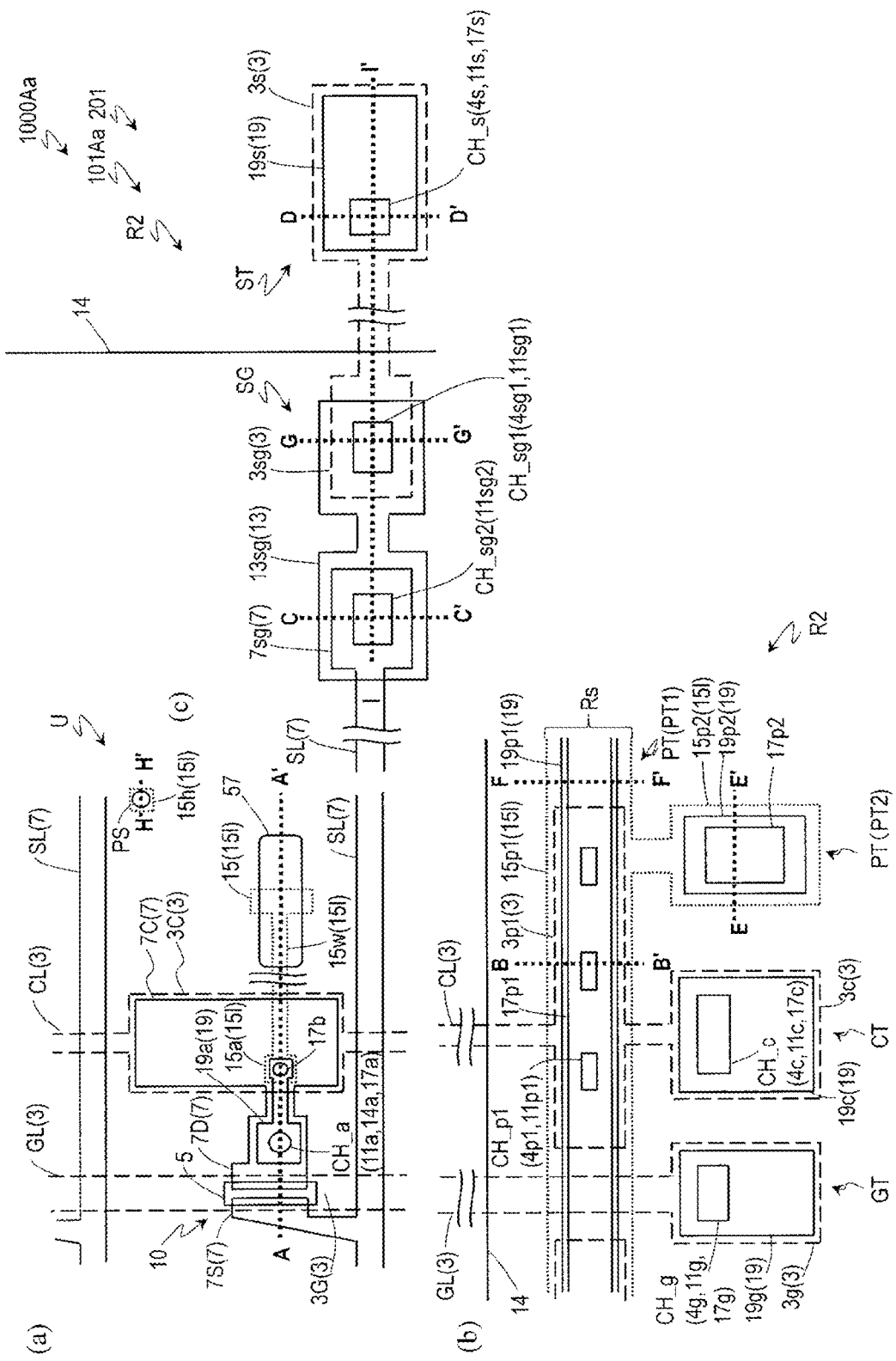
FIGS. 18(a) to 18(c) are schematic plan views illustrating a scanning antenna 1000Aa according to Modification Example 2 of the first embodiment.
Figure 19:
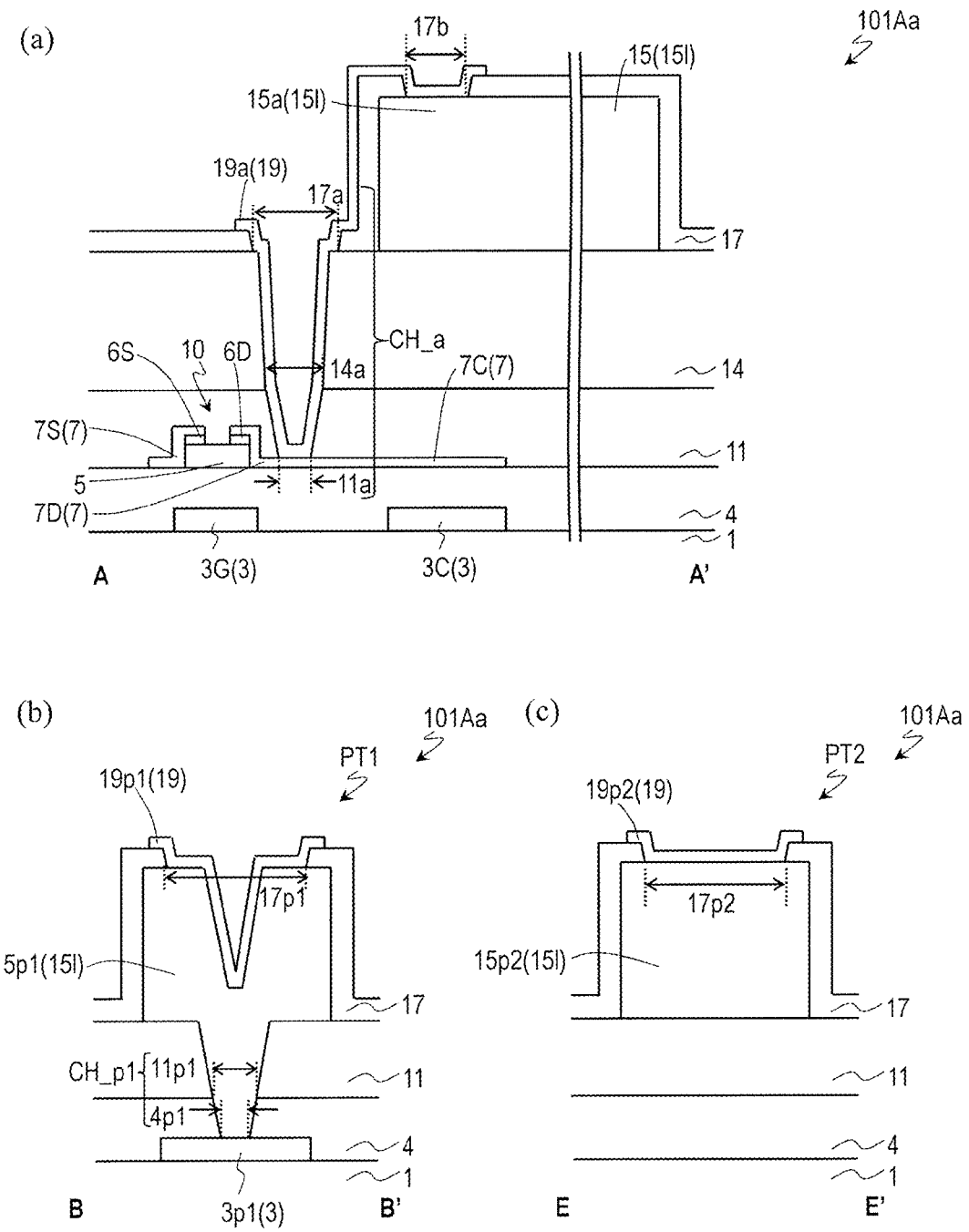
FIGS. 19(a) to 19(c) are schematic cross-sectional views of a TFT substrate 101Aa included in the scanning antenna 1000Aa.

As illustrated in FIG. 18 and FIG. 19, the TFT substrate 101Aa included in the scanning antenna 1000Aa differs from the TFT substrate 101A included in the scanning antenna 1000A in a shape of the flattened layer 14. In the TFT substrate 101A, the flattened layer 14 is formed on the transfer terminal section and on the source-gate connection section, but is not formed on the source terminal section, on the gate terminal section, and on the CS terminal section. In contrast, the flattened layer 14 of the TFT substrate 101Aa differs from the TFT substrate 101A in that the flattened layer 14 is not formed also on the transfer terminal section.

The first transfer terminal section PT1 of the TFT substrate 101Aa illustrated in FIG. 18(b) and FIG. 19(b) corresponds to the first transfer terminal section PT1 of the TFT substrate 101A illustrated in FIG. 3(b) and FIG. 4(b) with the flattened layer 14 being omitted.

The first transfer terminal section PT1 includes the lower connection section 3p1, the opening 4p1 formed in the gate insulating layer 4, the opening 11p1 formed in the first insulating layer 11, the conductive portion 15p1, the opening 17p1 formed in the second insulating layer 17, and the upper connection section 19p1, as illustrated in FIG. 18(b) and FIG. 19(b). The opening 4p1 formed in the gate insulating layer 4 and the opening 11p1 formed in the first insulating layer 11 constitute the contact hole CH_p1. The conductive portion 15p1 included in the patch metal layer 151 is formed on the first insulating layer 11 and within the contact hole CH_p1, and is connected to the lower connection section 3p1 within the contact hole CH_p1.

The second transfer terminal section PT2 of the TFT substrate 101Aa illustrated in FIG. 18(c) and FIG. 19(c) corresponds to the second transfer terminal section PT2 of the TFT substrate 101A illustrated in FIG. 3(c) and FIG. 4(c) with the flattened layer 14 being omitted.

In the scanning antenna 1000Aa having such a structure also, the same effect as in the scanning antenna 1000A can be obtained.

As illustrated in FIG. 18(a) and FIG. 19(a), the TFT substrate 101Aa differs from the TFT substrate 101A in an electrical connection method between the drain electrode 7D and the patch electrode 15. However, the TFT substrate 101Aa is not limited to the illustrated example in the structure that electrically connects the drain electrode 7D and the patch electrode 15, and may be the same as the TFT substrate 101A.

As illustrated in FIG. 18(a) and FIG. 19(a), in the antenna unit region U of the TFT substrate 101Aa, the upper conductive layer 19 includes a connection section 19a which is electrically connected to the patch electrode 15 and the drain electrode 7D. Specifically, the drain electrode 7D is electrically connected to the patch electrode 15 through the connection section 19a.

A specific configuration is described. As illustrated in FIG. 18(a) and FIG. 19(a), the opening 11a that at least reaches the portion extending from the drain electrode 7D is formed in the first insulating layer 11. The opening 14a overlapping the opening 11a when viewed from the normal direction of the dielectric substrate 1 is formed in the flattened layer 14. The patch metal layer 151 includes the patch electrode 15 and the connection section 15a. The connection section 15a is formed on the flattened layer 14. In this example, the connection section 15a is formed integrally with the wiring line 15w extending from the patch electrode 15. An opening 17a overlapping the opening 14a when viewed from the normal direction of the dielectric substrate 1 and an opening 17b at least reaching the connection section 15a are formed in the second insulating layer 17. The opening 11a formed in the first insulating layer 11, the opening 14a formed in the flattened layer 14, and the opening 17a formed in the second insulating layer 17 constitute the contact hole CH_a. The upper conductive layer 19 includes the connection section 19a. The connection section 19a is formed on the second insulating layer 17, within the contact hole CH_a, and within the opening 17b, and is connected to the portion extending from the drain electrode 7D within the contact hole CH_a and is connected to the connection section 15a within the opening 17b. For example, the connection section 19a is in contact with the portion extending from the drain electrode 7D within the opening 11a and is in contact with the connection section 15a within the opening 17b.

Manufacturing Method of TFT Substrate 101Aa

Figure 20:
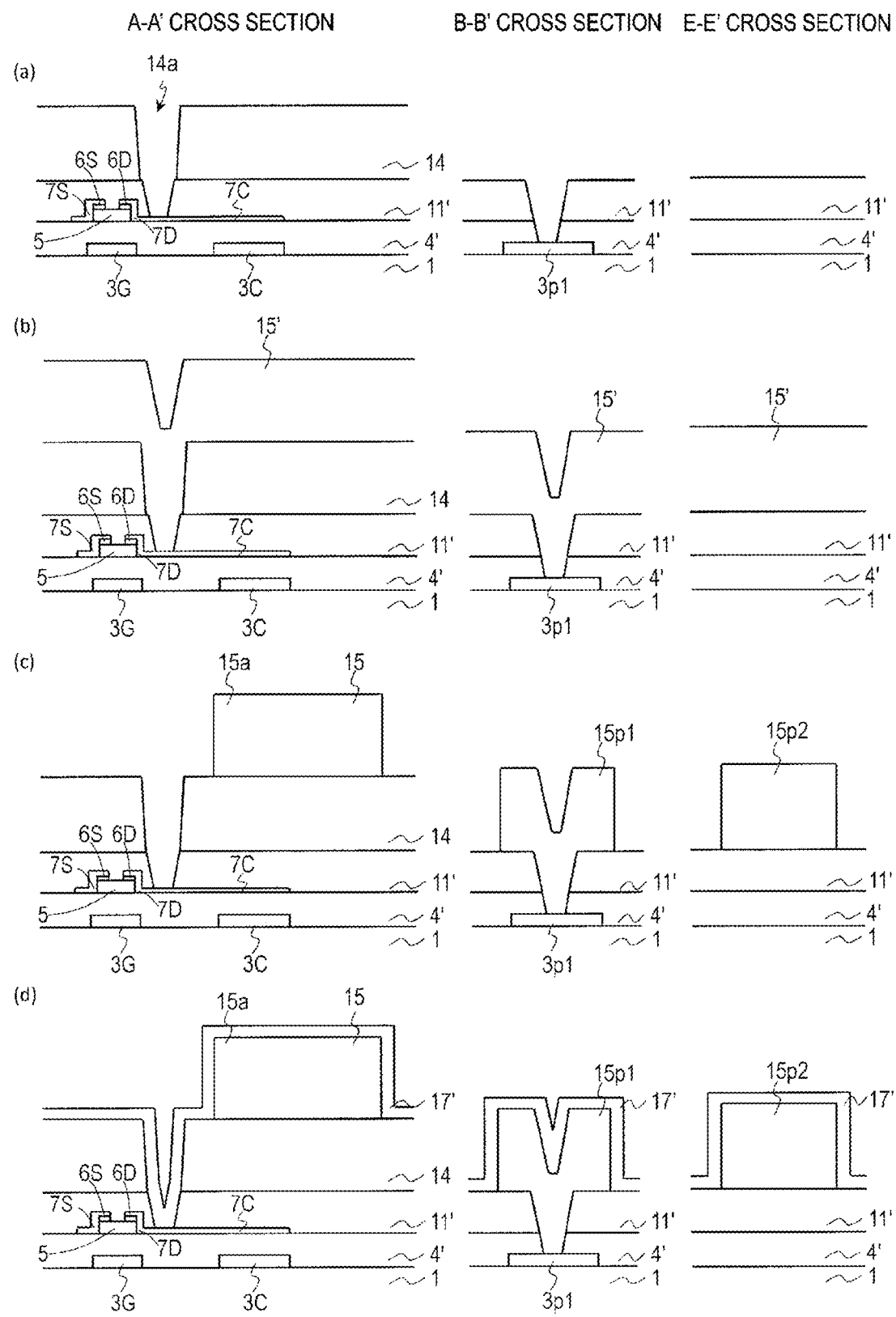
FIGS. 20(a) to 20(d) are process cross-sectional views illustrating an example of a manufacturing method of the TFT substrate 101Aa.
Figure 21:
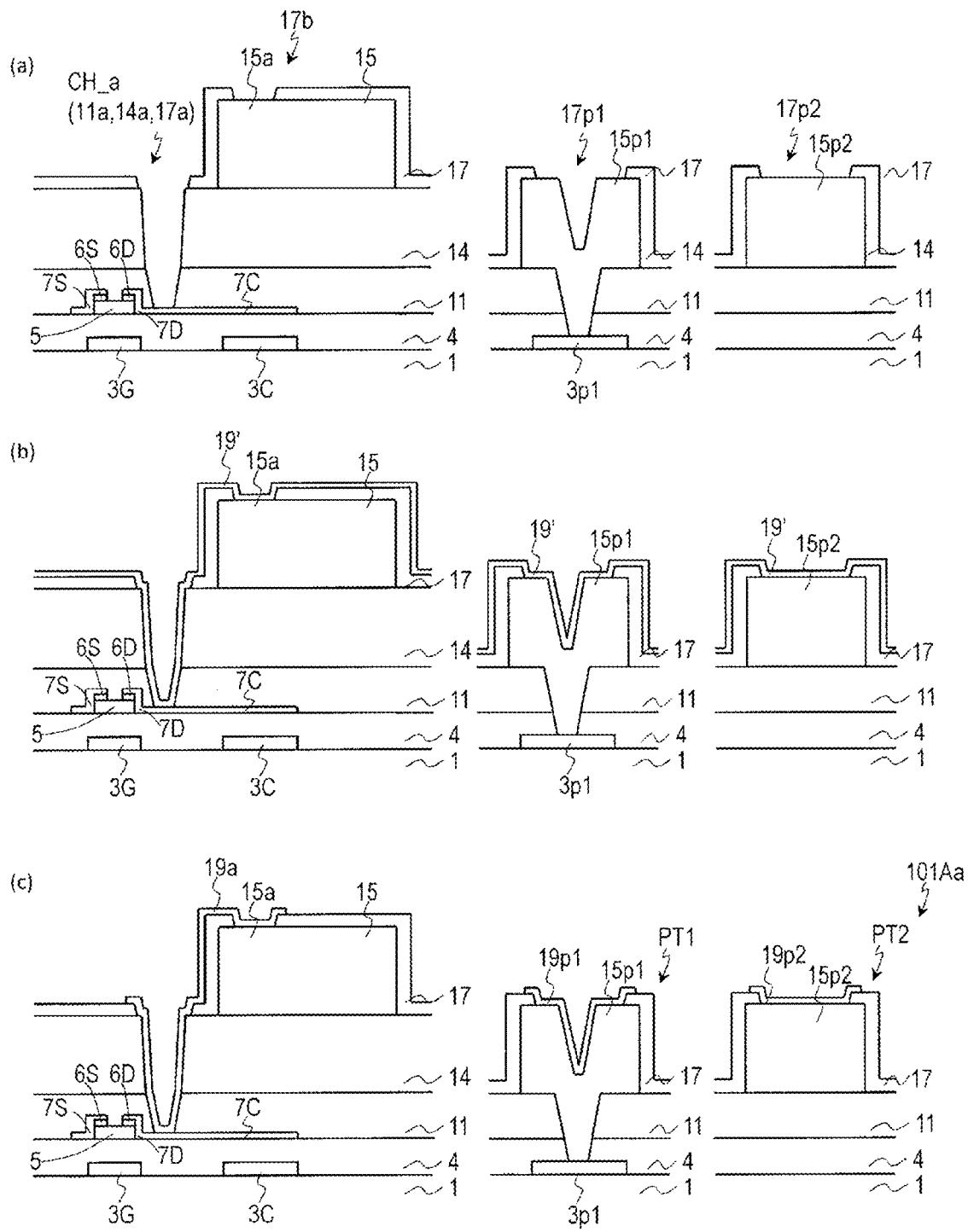
FIGS. 21(a) to 21(c) are process cross-sectional views illustrating an example of the manufacturing method of the TFT substrate 101Aa.

A description is given of a manufacturing method of the TFT substrate 101Aa with reference to FIG. 20 and FIG. 21.

FIGS. 20(a) to 20(d) and FIGS. 21(a) to 21(c) are process cross-sectional views illustrating an example of the manufacturing method of the TFT substrate 101Aa. These drawings illustrate the cross sections corresponding to FIGS. 19(a) to 19(c) (the cross-sections along lines A-A', B-B' and E-E' of the TFT substrate 101Aa). The following description mainly describes differences from the manufacturing method of the TFT substrate 101A described referring to FIG. 10 to FIG. 17.

First, as illustrated in FIGS. 10(a) to 10(g), FIGS. 11(a) to 11(g), FIGS. 12(a) to 12(d), and FIGS. 13(a) to 13(d), formed on the dielectric substrate 1 are the gate metal layer 3, the gate insulating film 4', the island-shaped semiconductor layer 5, the contact layers 6S and 6D, the source metal layer 7, the first insulating film 11', the lower conductive layer 13, and the flattening film 14'.

Subsequently, as illustrated in FIG. 20(a), the flattening film 14' is patterned to form the flattened layer 14. Here, a difference from the manufacturing method of the TFT substrate 101A is in that the flattened layer 14 is not formed in the first transfer terminal formation region and the second transfer terminal formation region. For example, the flattened layer 14 is formed not to overlap the lower connection section 3p1.

Next, as illustrated in FIG. 20(b), the patch conductive film 15' is formed on the lower conductive layer 13, on the first insulating film 11', and on the flattened layer 14.

Next, the patch conductive film 15' is patterned to form the patch metal layer 151 as illustrated in FIG. 20(c). Here, in the antenna unit formation region, the connection section 15a is formed on the flattened layer 14. In the first transfer terminal section formation region, the conductive portion 15p1 is formed to be connected to the lower connection section 3p1 within the contact hole CH_p1.

Next, as illustrated in FIG. 20(d), the second insulating film 17' is formed on the patch metal layer 151, on the flattened layer 14, on the lower conductive layer 13, and on the first insulating layer 11.

Next, the gate insulating film 4', the first insulating film 11', and the second insulating film 17' are etched through a known photolithography process to form the gate insulating layer 4, the first insulating layer 11, and the second insulating layer 17 as illustrated in FIG. 21(a). Here, a difference from the method of manufacturing the TFT substrate 101A is in that the opening 17a that overlaps the opening 14a formed in the flattened layer 14 and the opening 17b that at least reaches the connection section 15a are formed in the antenna unit formation region. This allows the contact hole CH_a to be obtained.

Next, as illustrated in FIG. 21(b), the upper conductive film 19' is formed on the second insulating layer 17, within the opening 11a, within the opening 17b, within the contact hole CH_s, within the contact hole CH_g, within the contact hole CH_c, within the opening 17p1, and within the opening 17p2.

Next, the upper conductive film 19' is patterned to form the upper conductive layer 19 as illustrated in FIG. 21(c). Here, formed in the antenna unit formation region is the connection section 19a that is connected to the portion extending from the drain electrode 7D within the opening 11a and is connected to the connection section 15a within the opening 17b.

In this manner, the TFT substrate 101Aa is manufactured.

Second Embodiment

In the embodiment described above, the gate metal layer including the gate electrode of the TFT is closer to the dielectric substrate than the source metal layer including the source electrode of the TFT. The TFT substrate used in the scanning antenna according to the present embodiment has an arrangement relationship between the gate metal layer and the source metal layer that is reversed as compared to the embodiment described above. Specifically, in the TFT substrate according the present embodiment, the source metal layer including the source electrode of the TFT is closer to the dielectric substrate than the gate metal layer including the gate electrode of the TFT.

Figure 22:
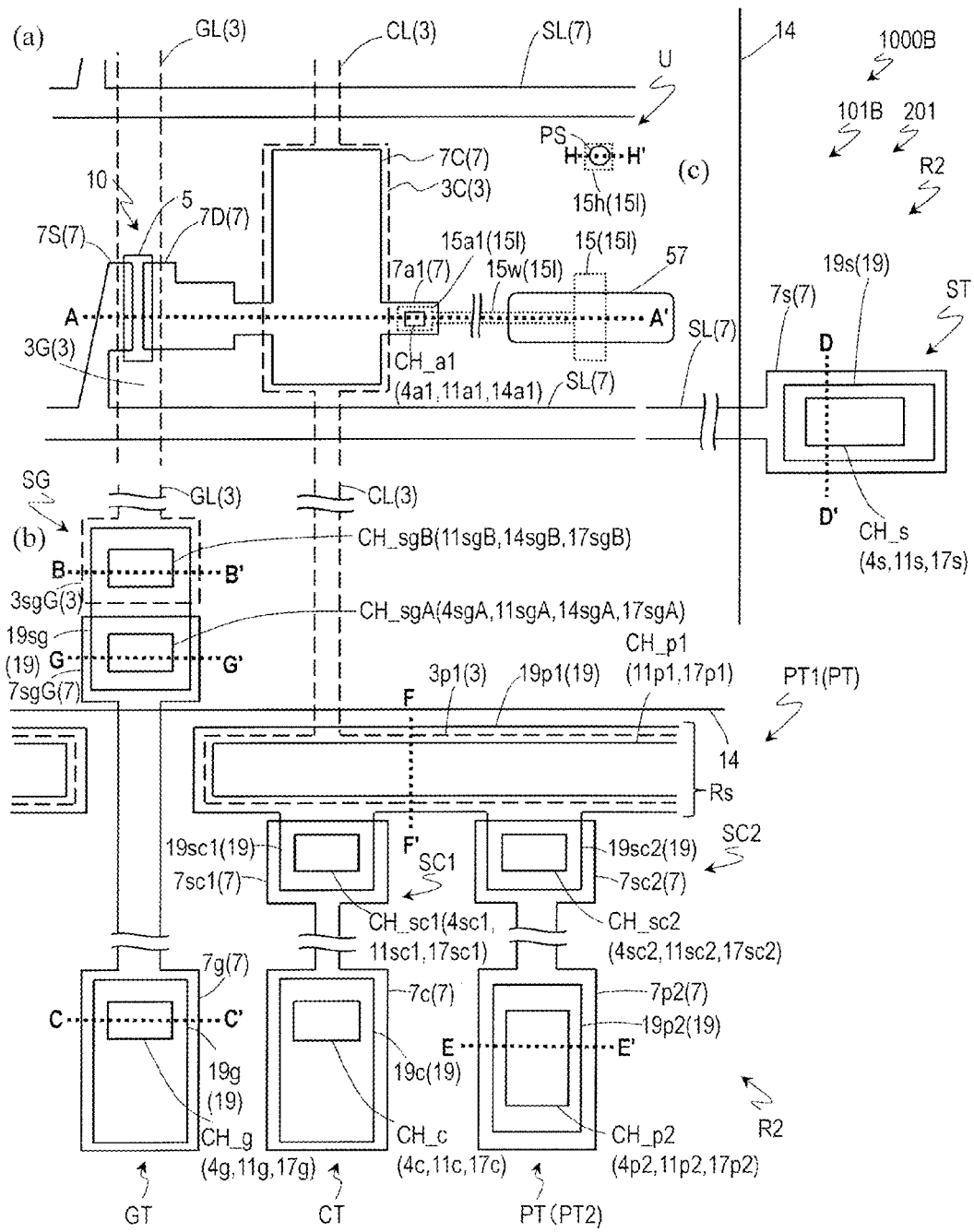
FIGS. 22(a) to 22(c) are schematic plan views illustrating a scanning antenna 1000B according to a second embodiment.
Figure 23:
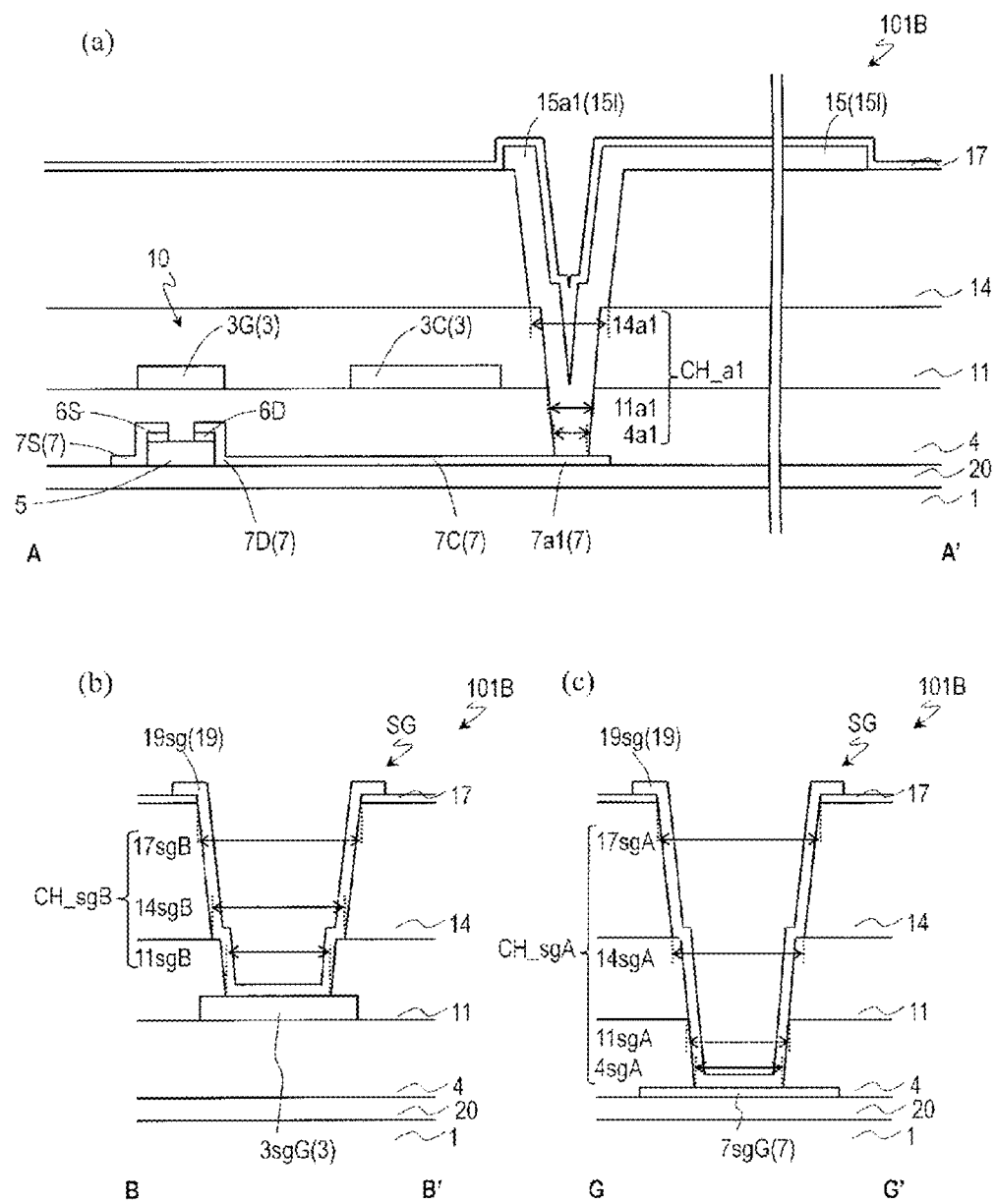
FIGS. 23(a) to 23(c) are schematic cross-sectional views of a TFT substrate 101Ba included in the scanning antenna 1000B.
Figure 24:
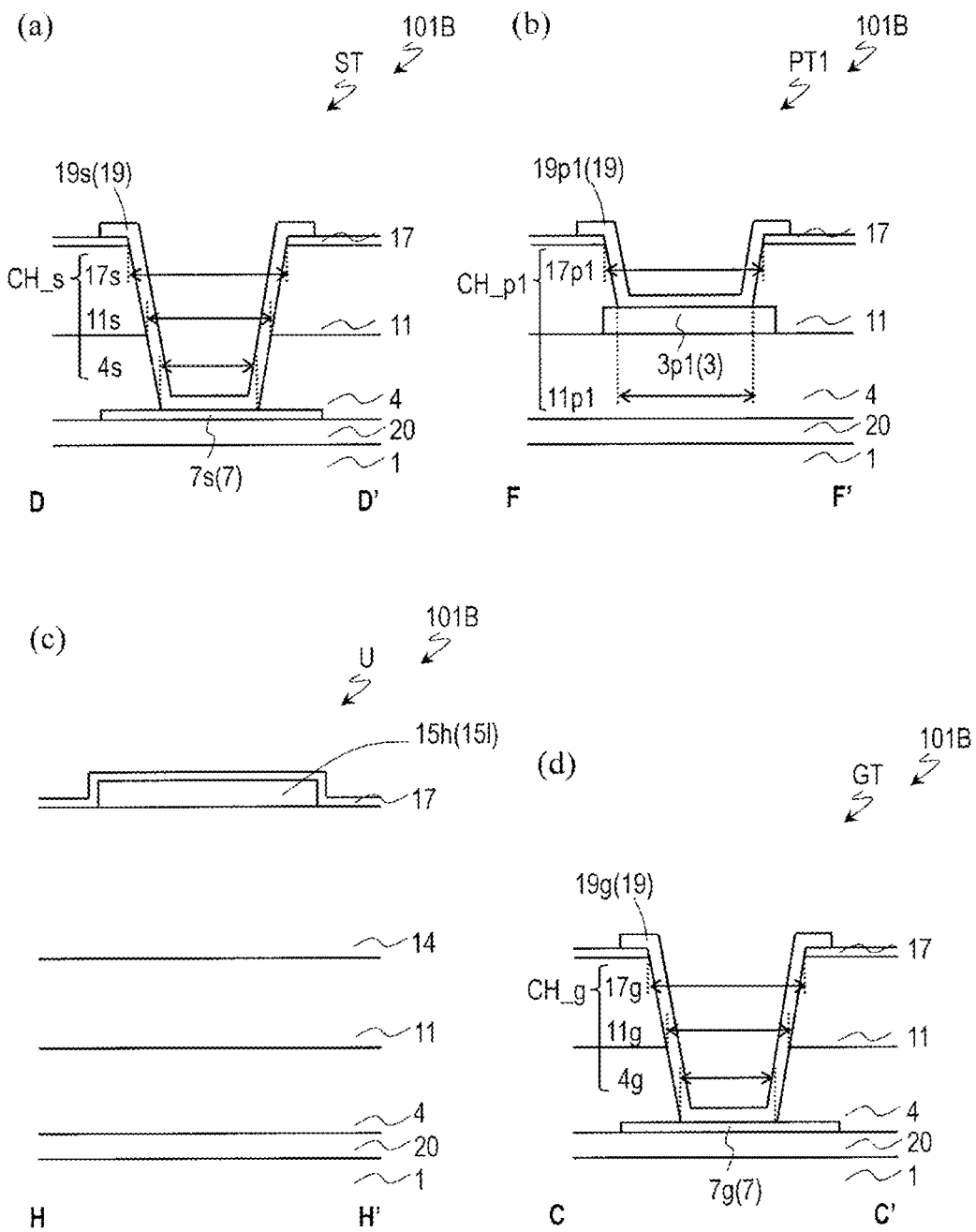
FIGS. 24(a) to 24(d) are schematic cross-sectional views of the TFT substrate 101Ba included in the scanning antenna 1000B.
Figure 25:
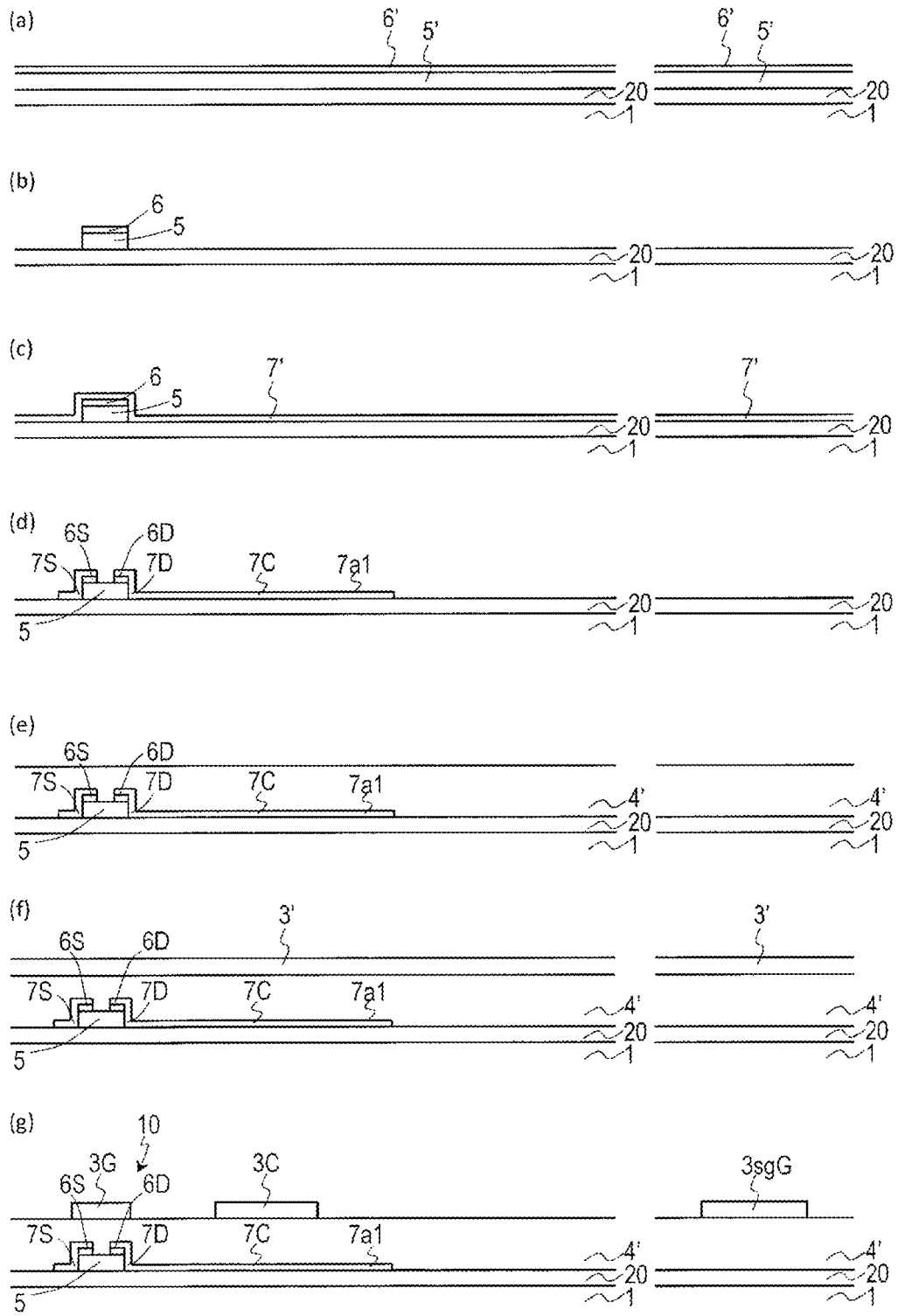
FIGS. 25(a) to 25(g) are process cross-sectional views illustrating an example of a manufacturing method of the TFT substrate 101B.
Figure 26:
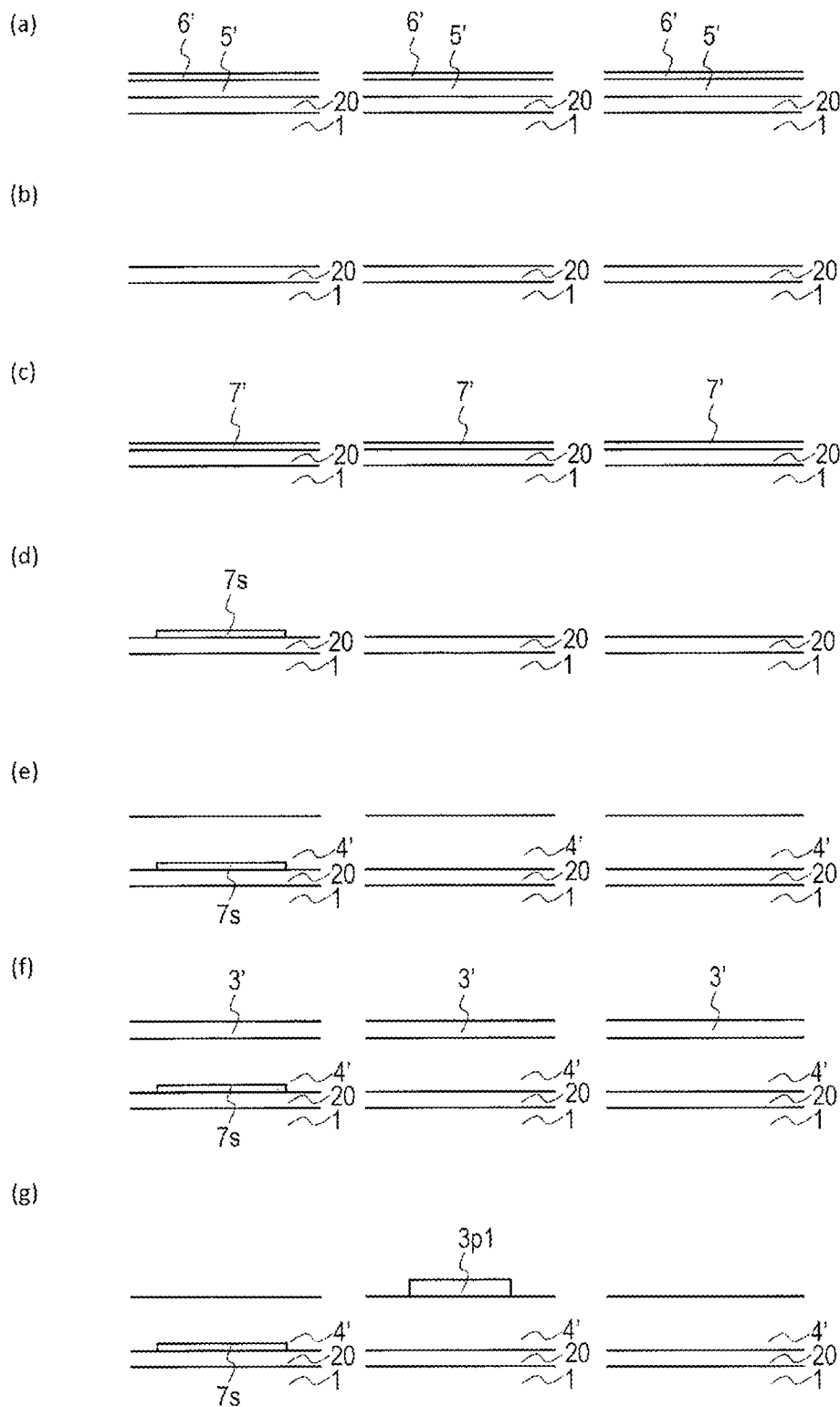
FIGS. 26(a) to 26(g) are process cross-sectional views illustrating an example of the manufacturing method of the TFT substrate 101B.
Figure 27:
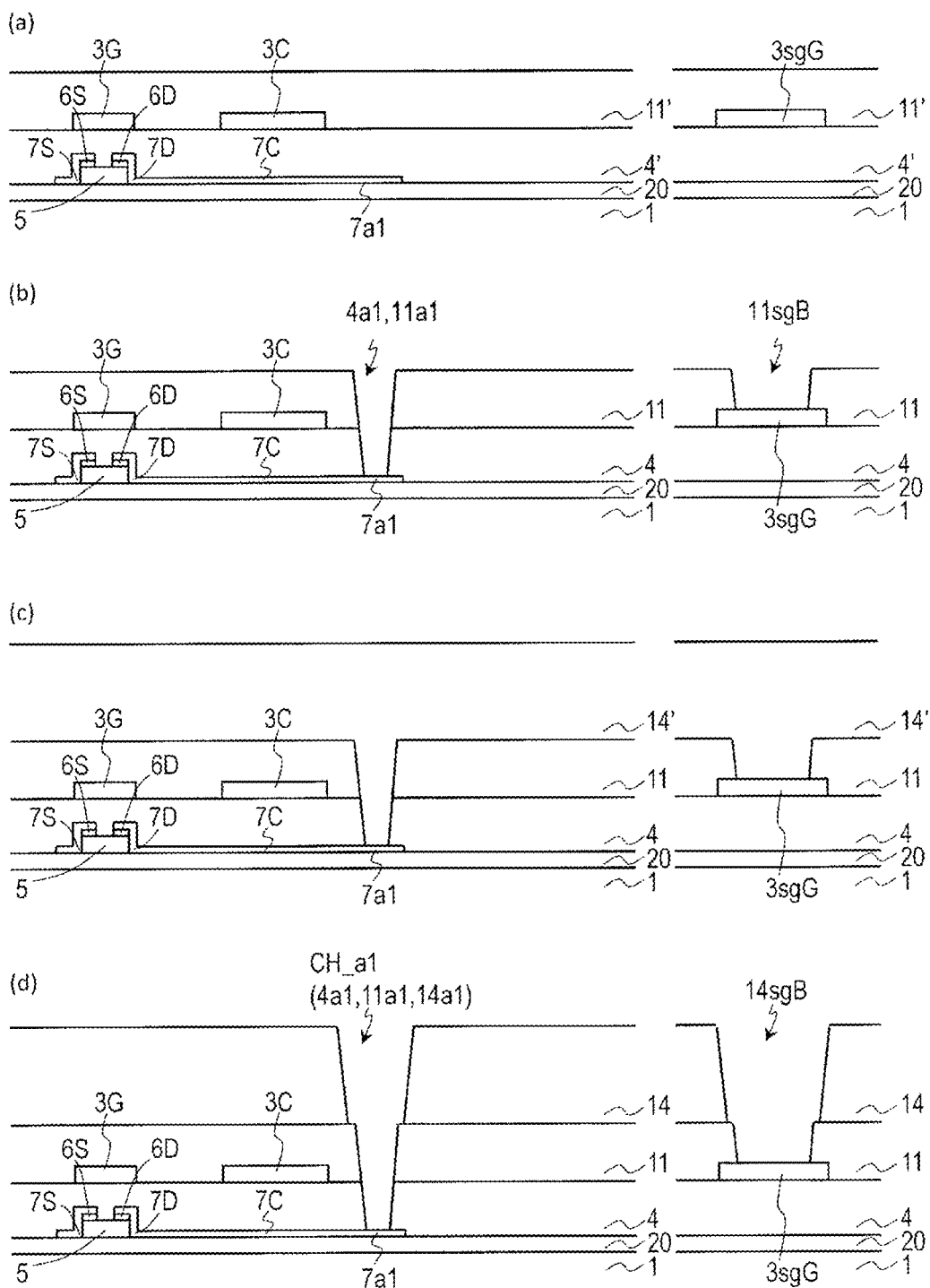
FIGS. 27(a) to 27(d) are process cross-sectional views illustrating an example of the manufacturing method of the TFT substrate 101B.
Figure 28:
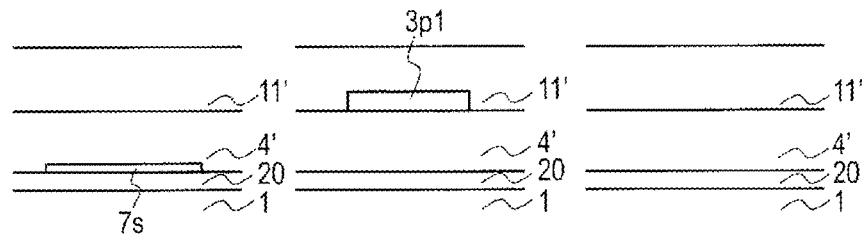
FIGS. 28(a) to 28(d) are process cross-sectional views illustrating an example of the manufacturing method of the TFT substrate 101B.
Figure 28:
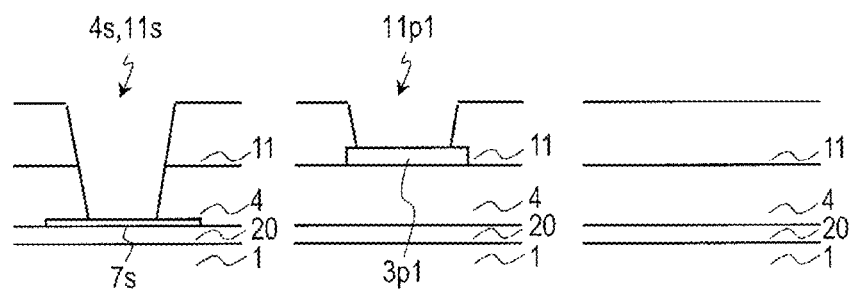
Figure 28:
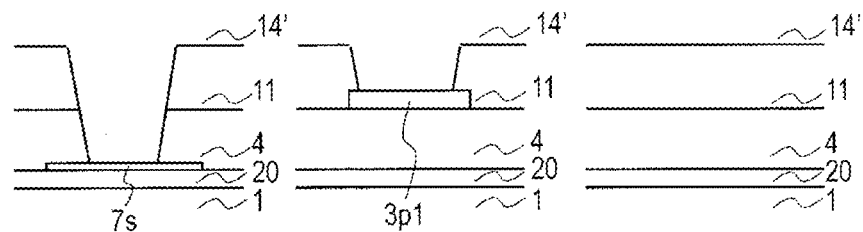
Figure 28:
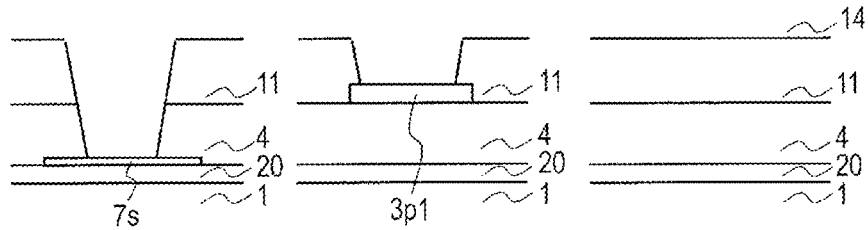
Figure 29:
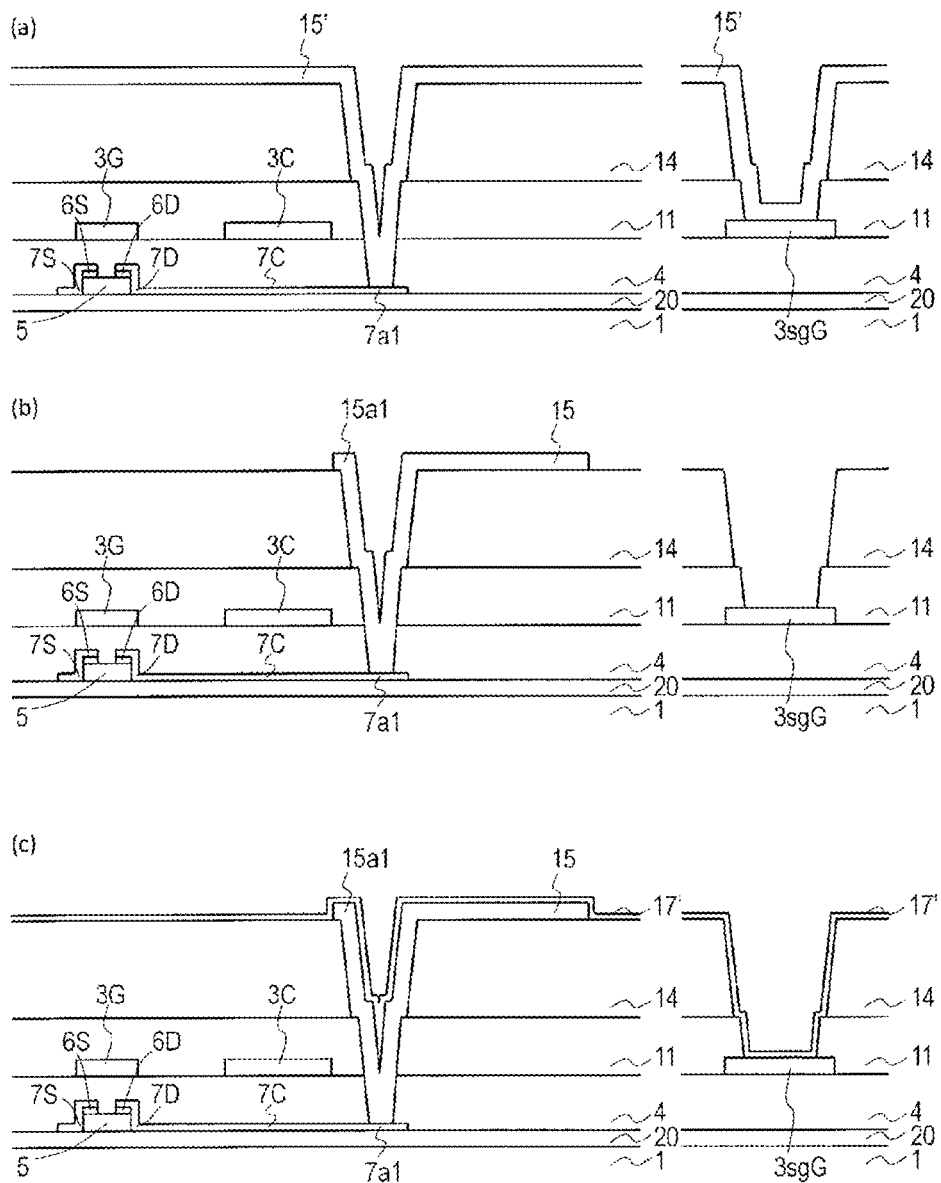
FIGS. 29(a) to 29(c) are process cross-sectional views illustrating an example of the manufacturing method of the TFT substrate 101B.
Figure 30:
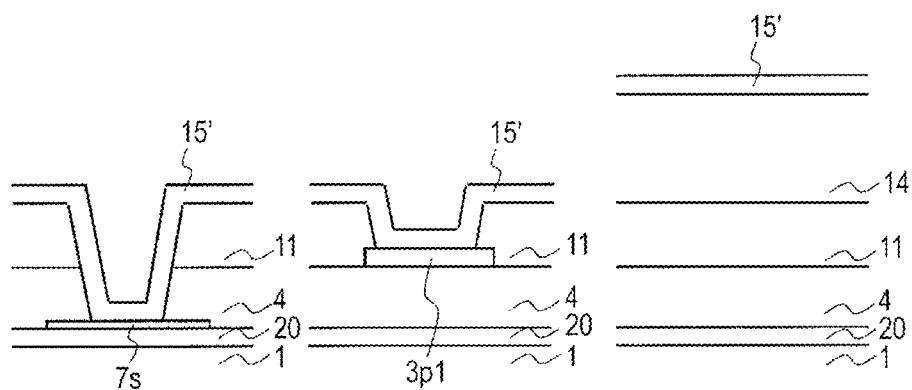
FIGS. 30(a) to 30(c) are process cross-sectional views illustrating an example of the manufacturing method of the TFT substrate 101B.
Figure 30:
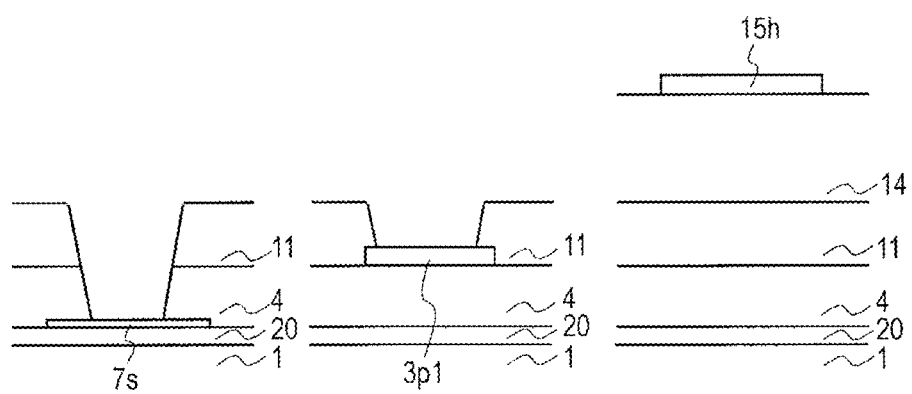
Figure 30:
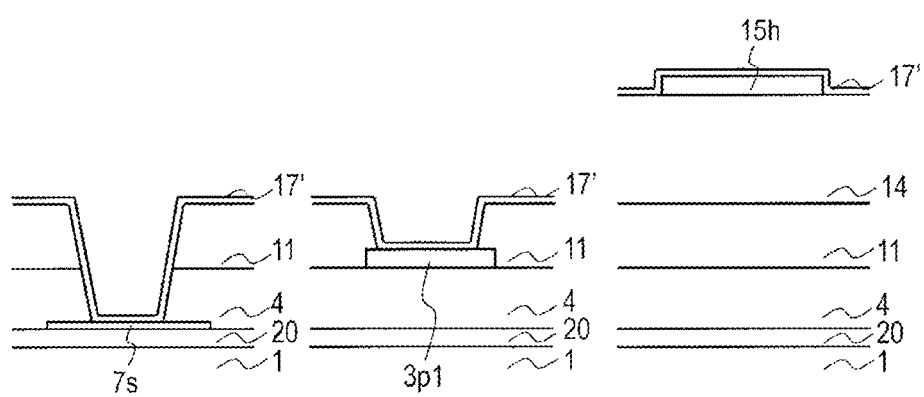
Figure 31:
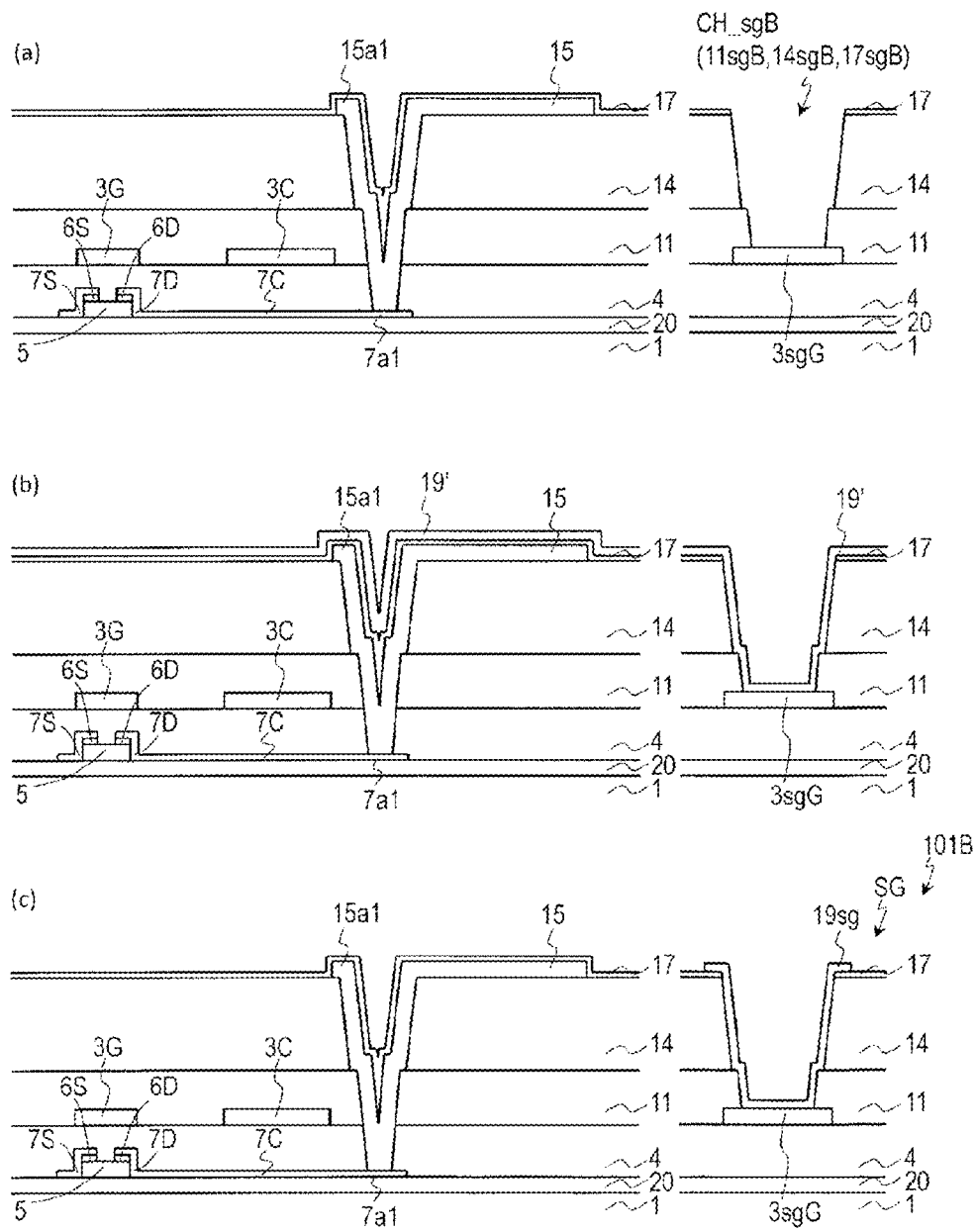
FIGS. 31(a) to 31(c) are process cross-sectional views illustrating an example of the manufacturing method of the TFT substrate 101B.
Figure 32:
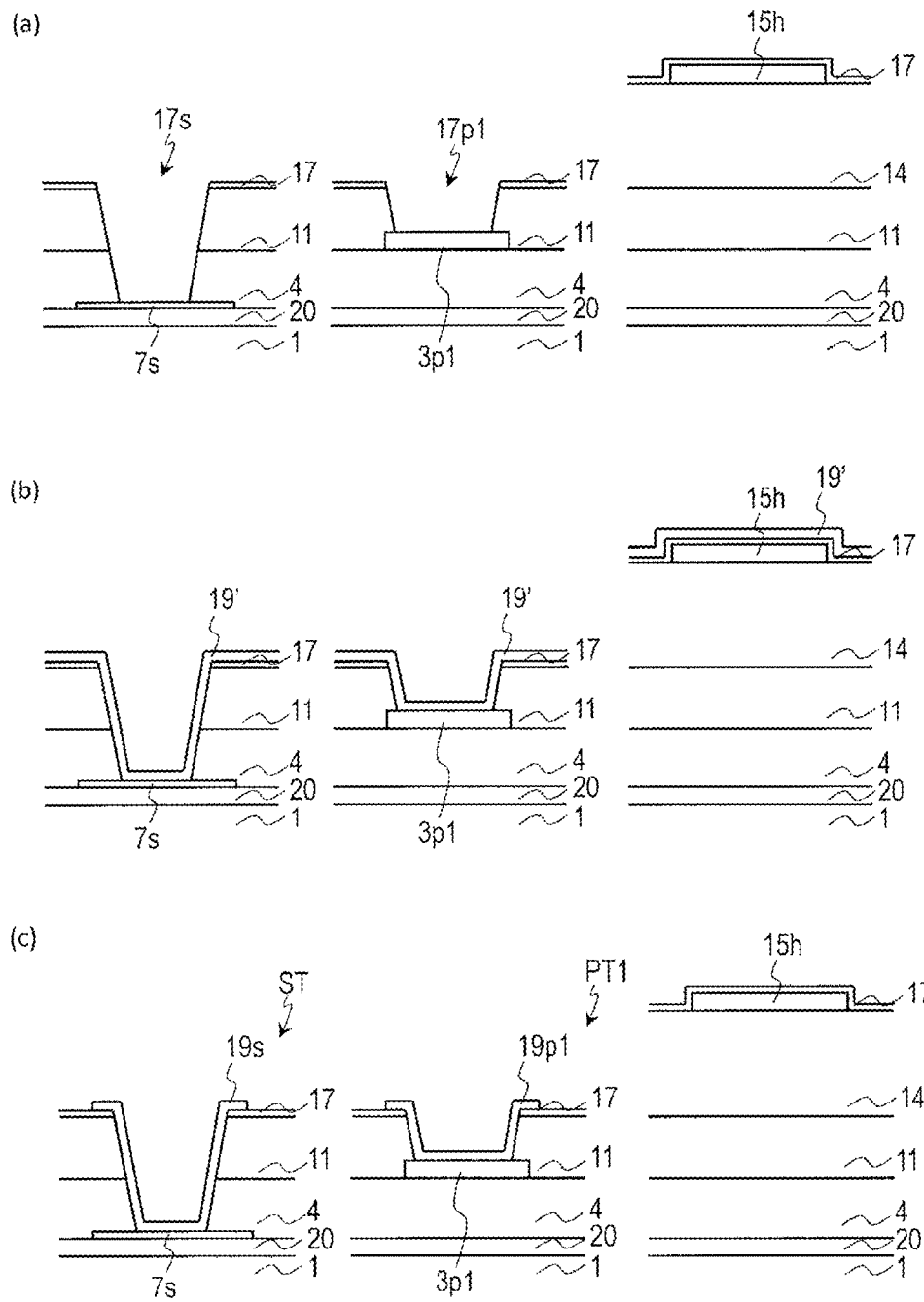
FIGS. 32(a) to 32(c) are process cross-sectional views illustrating an example of the manufacturing method of the TFT substrate 101B.

A scanning antenna 1000B and a TFT substrate 101B included in the scanning antenna 1000B according to the present embodiment will be described with reference to FIG. 22 to FIG. 24. The constitutions common to the embodiment described above are denoted by the same reference signs and the descriptions thereof may be omitted.

Structure of TFT Substrate 101B (Antenna Unit Region U)

A structure of the antenna unit region U of the transmission and/or reception region R1 of the scanning antenna 1000B according to the present embodiment will be described with reference to FIG. 22(a), FIG. 23(a), and FIG. 24(c).

FIG. 22(a) is a schematic plan view of the antenna unit region U in the transmission and/or reception region R1 of the scanning antenna 1000B. FIG. 23(a) and FIG. 24(c) are schematic cross-sectional views of the TFT substrate 101B included in the scanning antenna 1000B, and illustrate cross sections along lines A-A' and H-H' in FIG. 22(a), respectively.

As illustrated in FIG. 22(a), FIG. 23(a), and FIG. 24(c), the TFT substrate 101B includes the dielectric substrate 1 and a plurality of antenna unit regions U arranged on the dielectric substrate 1, each antenna unit region U having the TFT 10 and the patch electrode 15 electrically connected to the drain electrode 7D of the TFT 10. The TFT substrate 101B includes the gate metal layer 3 supported by the dielectric substrate 1 and including the gate electrode 3G of the TFT 10, the source metal layer 7 supported on the dielectric substrate 1 and including the source electrode 7S of the TFT 10, the semiconductor layer 5, supported by the dielectric substrate 1, of the TFT 10, the gate insulating layer 4 formed between the gate metal layer 3 and the semiconductor layer 5, and the flattened layer 14 formed over the gate insulating layer 4 and formed from an organic insulating material.

Because the TFT substrate 101B has the flattened layer 14 formed over the gate insulating layer 4, a thickness of the liquid crystal layer LC of the scanning antenna 1000B has high uniformity. This allows the scanning antenna 1000B to suppress a decrease in the antenna performance due to variations in the thickness of the liquid crystal layer LC.

The structure of the TFT substrate 101B in the antenna unit region U will be described in more detail.

The TFT substrate 101B includes the semiconductor layer 5 supported by the dielectric substrate 1, the source metal layer 7 formed on the semiconductor layer 5, the gate metal layer 3 formed over the source metal layer 7, the gate insulating layer 4 formed between the semiconductor layer 5 and the gate metal layer 3, the first insulating layer 11 formed on the gate metal layer 3, the patch metal layer 151 formed over the first insulating layer 11, and the second insulating layer 17 formed on the patch metal layer 151, as illustrated in FIG. 22(a), FIG. 23(a), and FIG. 24(c). The TFT substrate 101B further includes the upper conductive layer 19 formed on the second insulating layer 17. In this example, the TFT substrate 101B does not include the lower conductive layer 13.

The TFT substrate 101B may further include a base insulating layer 20 between the dielectric substrate 1 and the semiconductor layer 5. The base insulating layer 20 may be formed on an entire surface of the dielectric substrate 1, for example. Note that the base insulating layer 20 can be omitted.

The TFT 10 in the TFT substrate 101B differs from the embodiment described above (for example, the TFT substrate 101A in FIG. 3) in including a top gate structure. In the TFT 10 in the TFT substrate 101B, the gate electrode 3G is disposed on the semiconductor layer 5 with the gate insulating layer 4 interposed therebetween.

The source metal layer 7 includes the source electrode 7S and drain electrode 7D of the TFT 10, the source bus line SL, the auxiliary capacitance electrode 7C, and a connection section 7a1 electrically connected to the drain electrode 7D. In this example, the connection section 7a1 extends from the auxiliary capacitance electrode 7C.

The gate insulating layer 4 includes an opening 4a1 that at least reaches the connection section 7a1.

The gate metal layer 3 includes the gate electrode 3G of the TFT 10, the gate bus line GL, the auxiliary capacitance counter electrode 3C, and the CS bus line CL.

The first insulating layer 11 includes an opening 11a1 overlapping the opening 4a1 formed in the gate insulating layer 4 when viewed from the normal direction of the dielectric substrate 1.

The flattened layer 14 includes an opening 14a1 overlapping the opening 11a1 formed in the first insulating layer 11 when viewed from the normal direction of the dielectric substrate 1. The opening 4a1 formed in the gate insulating layer 4, the opening 11a1 formed in the first insulating layer 11, and the opening 14a1 formed in the flattened layer 14 constitute a contact hole CH_a1.

The patch metal layer 151 includes the patch electrode 15 and a connection section 15a1. The connection section 15a1 is formed on the flattened layer 14 and within the contact hole CH_a1, and is connected to the connection section 7a1 within the contact hole CH_a1. For example, here, the connection section 15a1 is in contact with the connection section 7a1 within the opening 4a1. The connection section 15a1 is formed integrally with the wiring line 15w extending from the patch electrode 15. In this example, the drain electrode 7D is electrically connected to the patch electrode 15 through the connection sections 7a1 and 15a1, and the wiring line 15w.

The second insulating layer 17 is formed on the flattened layer 14 and the patch metal layer 151. The second insulating layer 17 is formed to cover the flattened layer 14, the patch electrode 15, the connection section 15a1, and the wiring line 15w.

Structure of TFT Substrate 101B (Non-Transmission and/or Reception Region R2)

A structure of the non-transmission and/or reception region R2 of the TFT substrate 101B will be described with reference to FIG. 22 to FIG. 24. In the TFT substrate 101B, the flattened layer 14 is formed on the source-gate connection section, but is not formed on the source terminal section, on the gate terminal section, on the CS terminal section, and on the transfer terminal section. However, the structure of the non-transmission and/or reception region R2 of the TFT substrate 101B is not limited to the illustrated example.

FIGS. 22(b) and 22(c) are schematic plan views of the non-transmission and/or reception region R2 of the TFT substrate 101B, and FIGS. 23(b) and 23(c) and FIGS. 24(a), 24(b) and 24(d) are schematic cross-sectional views of the non-transmission and/or reception region R2 of the TFT substrate 101B.

FIG. 22(b) illustrates the gate terminal section GT, the CS terminal section CT, the transfer terminal section PT, the source-gate connection section SG, the first source-CS connection section SC1, and the second source-CS connection section SC2 provided in the non-transmission and/or reception region R2, and FIG. 22(c) illustrates the source terminal section ST provided in the non-transmission and/or reception region R2.

FIG. 23(b) illustrates a cross section of the source-gate connection section SG along a line B-B' in FIG. 22(b), FIG. 23(c) illustrates a cross section of the source-gate connection section SG along a line G-G' in FIG. 22(b), FIG. 24(a) illustrates a cross section of the source terminal section ST along a line D-D' in FIG. 22(c), FIG. 24(b) illustrates a cross section of the first transfer terminal section PT1 along a line F-F' in FIG. 22(b), FIG. 24(c) illustrates a cross section of the antenna unit region along a line H-H' in FIG. 22(a), and FIG. 24(d) illustrates a cross section of the gate terminal section GT along a line C-C' in FIG. 22(b).

Source-Gate Connection Section SG

The TFT substrate 101B includes the source-gate connection section SG in the non-transmission and/or reception region R2 as illustrated in FIG. 22(b). The source-gate connection section SG is provided for each gate bus line GL, in general. The source-gate connection section SG electrically connects each gate bus line GL to a connection wiring line (also referred to as a "gate lower connection wiring line") formed in the source metal layer 7. A lower connection section of the gate terminal section GT can be formed of the source metal layer 7 by providing the source-gate connection section SG. The gate terminal section GT including the lower connection section formed of the source metal layer 7 is excellent in reliability. Details will be described below.

As illustrated in FIG. 22(b), FIG. 23(b), and FIG. 23(c), the source-gate connection section SG electrically connects the gate bus line GL to a gate lower connection wiring line 7sgG with a gate bus line upper connection section 19sg (also simply referred to as an "upper connection section 19sg") interposed therebetween.

Specifically, the source-gate connection section SG includes the gate lower connection wiring line 7sgG, an opening 4sgA formed in the gate insulating layer 4, a gate bus line connection section 3sgG connected to the gate bus line GL, an opening 11sgA and opening 11sgB formed in the first insulating layer 11, an opening 14sgA and opening 14sgB formed in the flattened layer 14, an opening 17sgA and opening 17sgB formed in the second insulating layer 17, and the gate upper connection section 19sg.

The gate lower connection wiring line 7sgG is included in the source metal layer 7 and electrically separate from the source bus line SL.

The opening 4sgA formed in the gate insulating layer 4 at least reaches the gate lower connection wiring line 7sgG.

The gate bus line connection section 3sgG is included in the gate metal layer 3 and connected to the gate bus line GL. In this example, the gate bus line connection section 3sgG extends from the gate bus line GL and is formed integrally with the gate bus line GL. A width of the gate bus line connection section 3sgG may be larger than a width of the gate bus line GL.

The opening 11sgA formed in the first insulating layer 11 overlaps the opening 4sgA formed in the gate insulating layer 4 when viewed from the normal direction of the dielectric substrate 1.

The opening 11sgB formed in the first insulating layer 11 at least reaches the gate bus line connection section 3sgG.

The opening 14sgA formed in the flattened layer 14 overlaps the opening 11sgA formed in the first insulating layer 11 when viewed from the normal direction of the dielectric substrate 1. The opening 14sgB formed in the flattened layer 14 overlaps the opening 11sgB formed in the first insulating layer 11 when viewed from the normal direction of the dielectric substrate 1.

The opening 17sgA formed in the second insulating layer 17 overlaps the opening 14sgA formed in the flattened layer 14 when viewed from the normal direction of the dielectric substrate 1. The opening 17sgB formed in the second insulating layer 17 overlaps the opening 14sgB formed in the flattened layer 14 when viewed from the normal direction of the dielectric substrate 1. The opening 4sgA formed in the gate insulating layer 4, the opening 11sgA formed in the first insulating layer 11, the opening 14sgA formed in the flattened layer 14, and the opening 17sgA formed in the second insulating layer 17 constitute a contact hole CH_sgA. The opening 11sgB formed in the first insulating layer 11, the opening 14sgB formed in the flattened layer 14, and the opening 17sgB formed in the second insulating layer 17 constitute a contact hole CH_sgB.

The gate upper connection section 19sg is included in the upper conductive layer 19. The gate upper connection section 19sg is formed on the second insulating layer 17, within the contact hole CH_sgA, and within the contact hole CH_sgB, is connected to the gate lower connection wiring line 7sgG within the contact hole CH_sgA, and is connected to the gate bus line connection section 3sgG within the contact hole CH_sgB. For example, the gate upper connection section 19sg is in contact with the gate lower connection wiring line 7sgG within the opening 4sgA formed in the gate insulating layer 4, and in contact with the gate bus line connection section 3sgG within the opening 11sgB formed in the first insulating layer 11.

In the illustrated example, the contact hole CH_sgB is formed at a position away from the contact hole CH_sgA. The present embodiment is not limited to the illustrated example, and the contact hole CH_sgA and the contact hole CH_sgB may be contiguous to each other (or, may be formed as a single contact hole). The contact hole CH_sgA and the contact hole CH_sgB may be formed as a single contact hole in the same process. Specifically, a single contact hole that at least reaches the gate lower connection wiring line 7sgG and gate bus line connection section 3sgG may be formed in the gate insulating layer 4, the first insulating layer 11, the flattened layer 14, and the second insulating layer 17, to form the gate upper connection section 19sg within this contact hole and on the second insulating layer 17.

In the illustrated example, the source-gate connection section SG is provided inside the seal region Rs (on a side closer to the liquid crystal layer). The present embodiment is not limited to the illustrated example, and the source-gate connection section SG may be provided outside the seal region Rs (on a side where the liquid crystal layer is not present).

Gate Terminal Section GT

The gate terminal section GT of the TFT substrate 101B differs from the gate terminal section GT of the TFT substrate 101A illustrated in FIG. 3(b) in that the lower connection section is included in the source metal layer 7.

The TFT substrate 101B includes the gate terminal section GT in the non-transmission and/or reception region R2 as illustrated in FIG. 22(b). The gate terminal section GT is provided corresponding to each gate bus line GL, in general. Here, the gate terminal section GT and the source-gate connection section SG are provided corresponding to each gate bus line GL.

The gate terminal section GT includes a gate terminal lower connection section 7g (also simply referred to as a "lower connection section 7g"), the opening 4g formed in the gate insulating layer 4, the opening 11g formed in the first insulating layer 11, the opening 17g formed in the second insulating layer 17, and the gate terminal upper connection section 19g (also simply referred to as the "upper connection section 19g") as illustrated in FIG. 22(b) and FIG. 24(d).

The lower connection section 7g is included in the source metal layer 7. The lower connection section 7g is connected to the gate lower connection wiring line 7sgG formed in the source-gate connection section SG. In this example, the lower connection section 7g extends from the gate lower connection wiring line 7sgG and is formed integrally with the gate lower connection wiring line 7sgG.

The opening 4g formed in the gate insulating layer 4 at least reaches the lower connection section 7g.

The opening 11g formed in the first insulating layer 11 overlaps the opening 4g formed in the gate insulating layer 4 when viewed from the normal direction of the dielectric substrate 1.

The opening 17g formed in the second insulating layer 17 overlaps the opening 11g formed in the first insulating layer 11 when viewed from the normal direction of the dielectric substrate 1. The opening 4g formed in the gate insulating layer 4, the opening 11g formed in the first insulating layer 11, and the opening 17g formed in the second insulating layer 17 constitute the contact hole CH_g.

The upper connection section 19g is included in the upper conductive layer 19. The upper connection section 19g is formed on the second insulating layer 17 and within the contact hole CH_g, and is connected to the lower connection section 7g within the contact hole CH_g. For example, here, the upper connection section 19g is in contact with the lower connection section 7g within the opening 4g formed in the gate insulating layer 4.

An entirety of the upper connection section 19g may overlap the lower connection section 7g when viewed from the normal direction of the dielectric substrate 1.

The gate terminal section GT does not include the conductive portion included in the gate metal layer 3 and the conductive portion included in the patch metal layer 151.

The gate terminal section GT of the TFT substrate 101B, which includes the lower connection section 7g included in the source metal layer 7, has excellent reliability similarly to each terminal section of the TFT substrate 101A.

Source Terminal Section ST

The source terminal section ST of the TFT substrate 101B differs from the source terminal section GT of the TFT substrate 101A illustrated in FIG. 3(c), FIG. 5(b), and FIG. 6(a) in that the lower connection section is included in the source metal layer 7.

The TFT substrate 101B includes the source terminal section ST in the non-transmission and/or reception region R2 as illustrated in FIG. 22(c). The source terminal section ST may include the same configuration as the gate terminal section GT as illustrated in FIG. 22(c) and FIG. 24(a). The source terminal section ST is provided for each source bus line, in general.

The source terminal section ST includes a source terminal lower connection section 7s (also simply referred to as a "lower connection section 7s"), the opening 4s formed in the gate insulating layer 4, the opening 11s formed in the first insulating layer 11, the opening 17s formed in the second insulating layer 17, and the source terminal upper connection section 19s (also simply referred to as the "upper connection section 19s").

The lower connection section 7s is included in the source metal layer 7 and connected to the source bus line SL. In this example, the lower connection section 7s extends from the source bus line SL and is formed integrally with the source bus line SL.

The opening 4s formed in the gate insulating layer 4 at least reaches the lower connection section 7s.

The opening 11s formed in the first insulating layer 11 overlaps the opening 4s formed in the gate insulating layer 4 when viewed from the normal direction of the dielectric substrate 1.

The opening 17s formed in the second insulating layer 17 overlaps the opening 11s formed in the first insulating layer 11 when viewed from the normal direction of the dielectric substrate 1. The opening 4s formed in the gate insulating layer 4, the opening 11s formed in the first insulating layer 11, and the opening 17s formed in the second insulating layer 17 constitute the contact hole CH_s.

The upper connection section 19s is included in the upper conductive layer 19. The upper connection section 19s is formed on the second insulating layer 17 and within the contact hole CH_s, and is connected to the lower connection section 7s within the contact hole CH_s. Here, the upper connection section 19s is in contact with the lower connection section 7s within the opening 4s formed in the gate insulating layer 4, for example.

An entirety of the upper connection section 19s may overlap the lower connection section 7s when viewed from the normal direction of the dielectric substrate 1.

The source terminal section ST does not include the conductive portion included in the gate metal layer 3 and the conductive portion included in the patch metal layer 151.

The source terminal section ST, which includes the lower connection section 7s included in the source metal layer 7, has excellent reliability similarly to the gate terminal section GT.

First Transfer Terminal Section PT1

The TFT substrate 101B includes the first transfer terminal section PT1 in the non-transmission and/or reception region R2 as illustrated in FIG. 22(b). The first transfer terminal section PT1 is provided in the seal region Rs, here (that is, the first transfer terminal section PT1 is provided in the sealing portion surrounding the liquid crystal layer).

The first transfer terminal section PT1 includes the first transfer terminal lower connection section 3p1 (also simply referred to as the "lower connection section 3p1"), the opening 11p1 formed in the first insulating layer 11, the opening 17p1 formed in the second insulating layer 17, and the first transfer terminal upper connection section 19p1 (also simply referred to as the "upper connection section 19p1") as illustrated in FIG. 22(b) and FIG. 24(b).

The lower connection section 3p1 is included in the gate metal layer 3 and electrically connected to the CS bus line CL. The lower connection section 3p1, in this example, is formed integrally with the CS bus line. The lower connection section 3p1 is electrically separate from the gate bus line GL.

The opening 11p1 formed in the first insulating layer 11 at least reaches the lower connection section 3p1.

The opening 17p1 formed in the second insulating layer 17 overlaps the opening 11p1 when viewed from the normal direction of the dielectric substrate 1. The opening 11p1 formed in the first insulating layer 11 and the opening 17p1 formed in the second insulating layer 17 constitute the contact hole CH_p1.

The upper connection section 19p1 is included in the upper conductive layer 19. The upper connection section 19p1 is formed on the second insulating layer 17 and within the contact hole CH_p1, and is connected to the lower connection section 3p1 within the contact hole CH_p1. For example, here, the upper connection section 19p1 is in contact with the lower connection section 3p1 within the opening 11p1 formed in the first insulating layer 11. The upper connection section 19p1 is connected to a transfer terminal upper connection section on the slot substrate side by a sealing member containing conductive particles, for example.

A portion of the lower connection section 3p1 exposed by the opening 11p1 is covered with the upper connection section 19p1.

In this example, the lower connection section 3p1 is disposed between two gate bus lines GL adjacent to each other. Two lower connection sections 3p1 disposed with the gate bus line GL being interposed therebetween may be electrically connected to each other via a conductive connection section (not illustrated). The conductive connection section may be formed of the source metal layer 7.

Note that, here, the lower connection section 3p1 is connected to the upper connection section 19p1 through one contact hole CH_p1, but a plurality of contact holes may be provided for one lower connection section 3p1.

CS Terminal Section CT, First Source-CS Connection Section SC1

The TFT substrate 101B includes the CS terminal section CT and the first source-CS connection section SC1 in the non-transmission and/or reception region R2 as illustrated in FIG. 22(b). The CS terminal section CT is provided corresponding to each CS bus line CL, for example. The first source-CS connection section SC1 is provided corresponding to the CS terminal section CT, here. For example, the CS terminal section CT and the first source-CS connection section SC1 are provided corresponding to each CS bus line CL. The lower connection section of the CS terminal section CT can be formed of the source metal layer 7 by providing the first source-CS connection section SC1. The CS terminal section CT including the lower connection section formed of the source metal layer 7 is excellent in reliability.

The first source-CS connection section SC1 and the second source-CS connection section SC2 may be provided corresponding to each CS bus line or a plurality of CS bus lines.

The CS terminal section CT has the same configuration as the gate terminal section GT as illustrated in FIG. 22(b) although illustration of cross-section structure thereof is omitted.

The CS terminal section CT includes a CS terminal lower connection section 7c (also simply referred to as a "lower connection section 7c"), the opening 4c formed in the gate insulating layer 4, the opening 11c formed in the first insulating layer 11, the opening 17c formed in the second insulating layer 17, and the CS terminal upper connection section 19c (also simply referred to as the "upper connection section 19c").

The lower connection section 7c is included in the source metal layer 7 and electrically connected to the CS bus line CL. The lower connection section 7c is connected to a CS lower connection wiring line 7sc1 formed in the first source-CS connection section SC1. In this example, the lower connection section 7c extends from the CS lower connection wiring line 7sc1 and is formed integrally with the CS lower connection wiring line 7sc1.

The opening 4c formed in the gate insulating layer 4 at least reaches the lower connection section 7c.

The opening 11c formed in the first insulating layer 11 overlaps the opening 4c formed in the gate insulating layer 4 when viewed from the normal direction of the dielectric substrate 1.

The opening 17c formed in the second insulating layer 17 overlaps the opening 11c formed in the first insulating layer 11 when viewed from the normal direction of the dielectric substrate 1. The opening 4c formed in the gate insulating layer 4, the opening 11c formed in the first insulating layer 11, and the opening 17c formed in the second insulating layer 17 constitute the contact hole CH_c.

The upper connection section 19c is included in the upper conductive layer 19. The upper connection section 19c is formed on the second insulating layer 17 and within the contact hole CH_c, and is connected to the lower connection section 7c within the contact hole CH_c. For example, here, the upper connection section 19c is in contact with the lower connection section 7c within the opening 4c formed in the gate insulating layer 4.

An entirety of the upper connection section 19c may overlap the lower connection section 7c when viewed from the normal direction of the dielectric substrate 1.

The CS terminal section CT does not include the conductive portion included in the gate metal layer 3 and the conductive portion included in the patch metal layer 151.

The CS terminal section CT, which includes the lower connection section 7c included in the source metal layer 7, has excellent reliability similar to the gate terminal section GT.

In this example, the first source-CS connection section SC1 has a configuration the same as the cross-section (see FIG. 23(c)) of the source-gate connection section SG along a line G-G' in FIG. 22(b). Illustration of cross-section structure of the first source-CS connection section SC1 is omitted.

The first source-CS connection section SC1 includes the CS lower connection wiring line 7sc1 (also simply referred to as the "lower connection wiring line 7sc1"), an opening 4sc1 formed in the gate insulating layer 4, an opening 11sc1 formed in the first insulating layer 11, an opening 17sc1 formed in the second insulating layer 17, and a CS upper connection section 19sc1.

The CS lower connection wiring line 7sc1 is included in the source metal layer 7 and electrically separate from the source bus line SL.

The opening 4sc1 formed in the gate insulating layer 4 at least reaches the CS lower connection wiring line 7sc1.

The opening 11sc1 formed in the first insulating layer 11 overlaps the opening 4sc1 formed in the gate insulating layer 4 when viewed from the normal direction of the dielectric substrate 1.

The opening 17sc1 formed in the second insulating layer 17 overlaps the opening 11sc1 formed in the first insulating layer 11 when viewed from the normal direction of the dielectric substrate 1. The opening 4sc1 formed in the gate insulating layer 4, the opening 11sc1 formed in the first insulating layer 11, and the opening 17sc1 formed in the second insulating layer 17 constitute a contact hole CH_sc1.

The CS upper connection section 19sc1 is included in the upper conductive layer 19. The CS upper connection section 19sc1 is formed on the second insulating layer 17 and within the contact hole CH_sc1, and is connected to the CS lower connection wiring line 7sc1 within the contact hole CH_sc1. For example, here, the CS upper connection section 19sc1 is in contact with the CS lower connection wiring line 7sc1 within the opening 4sc1 formed in the gate insulating layer 4.

In this example, the CS upper connection section 19sc1 extends from the first transfer terminal upper connection section 19p1 formed in the first transfer terminal section PT1 and is formed integrally with the upper connection section 19p1. In the first transfer terminal section PT1, the upper connection section 19p1 is connected to the lower connection section 3p1 formed integrally with the CS bus line CL. In this manner, the lower connection section 7c of the CS terminal section CT is electrically connected to the CS bus line.

Second Transfer Terminal Section PT2, Second Source-CS Connection Section SC2

The TFT substrate 101B includes the second transfer terminal section PT2 and the second source-CS connection section SC2 in the non-transmission and/or reception region R2 as illustrated in FIG. 22(b). The second transfer terminal section PT2 is provided outside the seal region Rs (opposite to the transmission and/or reception region R1). Specifically, the second transfer terminal section PT2 is provided outside the sealing portion surrounding the liquid crystal layer. The second source-CS connection section SC2 is provided corresponding to the second transfer terminal section PT2, here.

The second transfer terminal section PT2, as illustrated in FIG. 22(b), has the same cross-section structure as gate terminal section GT illustrated in FIG. 24(d). Illustration of cross-section structure of the second transfer terminal section PT2 is omitted. The second transfer terminal section PT2 includes a second transfer terminal lower connection section 7p2 (also simply referred to as a "lower connection section 7p2"), an opening 4p2 formed in the gate insulating layer 4, an opening 11p2 formed in the first insulating layer 11, the opening 17p2 formed in the second insulating layer 17, and the second transfer terminal upper connection section 19p2 (also simply referred to as the "upper connection section 19p2").

The lower connection section 7p2 is included in the source metal layer 7 and electrically connected to the CS bus line CL. The lower connection section 7p2 is electrically separate from the source bus line SL. In this example, the lower connection section 7p2 extends from a CS lower connection wiring line 7sc2 (also simply referred to as a "lower connection wiring line 7sc2") formed in the second source-CS connection section SC2 and is formed integrally with the CS lower connection wiring line 7sc2.

The opening 4p2 formed in the gate insulating layer 4 at least reaches the lower connection section 7p2.

The opening 11p2 formed in the first insulating layer 11 overlaps the opening 4p2 formed in the gate insulating layer 4 when viewed from the normal direction of the dielectric substrate 1.

The opening 17p2 formed in the second insulating layer 17 overlaps the opening 11p2 formed in the first insulating layer 11 when viewed from the normal direction of the dielectric substrate 1. The opening 4p2 formed in the gate insulating layer 4, the opening 11p2 formed in the first insulating layer 11, and the opening 17p2 formed in the second insulating layer 17 constitute a contact hole CH_p2.

The upper connection section 19p2 is included in the upper conductive layer 19. The upper connection section 19p2 is formed on the first insulating layer 11 and within the contact hole CH_p2, and is connected to the lower connection section 7p2 within the contact hole CH_p2. Here, for example, the upper connection section 19p2 is in contact with the lower connection section 7p2 within the opening 4p2 formed in the gate insulating layer 4.

In this example, the second transfer terminal section PT2 does not include the conductive portion included in the gate metal layer 3 and the conductive portion included in the patch metal layer 151.

The second transfer terminal section PT2, which includes the lower connection section 7p2 included in the source metal layer 7, has excellent reliability similar to the gate terminal section GT.

In the second transfer terminal section PT2 also, the upper connection section 19p2 may be connected to a transfer terminal connection section on the slot substrate side by a sealing member containing conductive particles, for example.

The second source-CS connection section SC2 in this example, similarly to the first source-CS connection section SC1, has a configuration the same as the cross-section (see FIG. 23(c)) of the source-gate connection section SG along a line G-G' in FIG. 22(b). Illustration of cross-section structure of the second source-CS connection section SC2 is omitted.

The second source-CS connection section SC2 includes the CS lower connection wiring line 7sc2, an opening 4sc2 formed in the gate insulating layer 4, an opening 11sc2 formed in the first insulating layer 11, an opening 17sc2 formed in the second insulating layer 17, and a CS upper connection section 19sc2.

The CS lower connection wiring line 7sc2 is included in the source metal layer 7 and electrically separate from the source bus line SL.

The opening 4sc2 formed in the gate insulating layer 4 at least reaches the CS lower connection wiring line 7sc2.

The opening 11sc2 formed in the first insulating layer 11 overlaps the opening 4sc2 formed in the gate insulating layer 4 when viewed from the normal direction of the dielectric substrate 1.

The opening 17sc2 formed in the second insulating layer 17 overlaps the opening 11sc2 formed in the first insulating layer 11 when viewed from the normal direction of the dielectric substrate 1. The opening 4sc2 formed in the gate insulating layer 4, the opening 11sc2 formed in the first insulating layer 11, and the opening 17sc2 formed in the second insulating layer 17 constitute a contact hole CH_sc2.

The CS upper connection section 19sc2 is included in the upper conductive layer 19. The CS upper connection section 19sc2 is formed on the second insulating layer 17 and within the contact hole CH_sc2, and is connected to the CS lower connection wiring line 7sc2 within the contact hole CH_sc2. For example, here, the CS upper connection section 19sc2 is in contact with the CS lower connection wiring line 7sc2 within the opening 4sc2 formed in the gate insulating layer 4.

In this example, the CS upper connection section 19sc2 extends from the first transfer terminal upper connection section 19p1 formed in the first transfer terminal section PT1 and is formed integrally with the upper connection section 19p1. In the first transfer terminal section PT1, the upper connection section 19p1 is connected to the lower connection section 3p1 formed integrally with the CS bus line CL. In this manner, the lower connection section 7p2 of the second transfer terminal section PT2 is electrically connected to the CS bus line.

The lower connection section of the second transfer terminal section PT2 can be formed of the source metal layer 7 by providing the second source-CS connection section SC2. With this configuration, the second transfer terminal section PT2 of the TFT substrate 101B has excellent reliability.

In the illustrated example, the TFT substrate 101B includes the first source-CS connection section SC1 and second source-CS connection section SC2 corresponding to each CS bus line, but the present embodiment is not limited thereto. The TFT substrate in the present embodiment may include one source-CS connection section corresponding to each CS bus line. As described above, the source-CS connection section is not necessarily provided corresponding to each CS bus line, and the TFT substrate in the present embodiment may include one source-CS connection section corresponding to a plurality of CS bus lines. In the illustrated example, the first source-CS connection section SC1 and the second source-CS connection section SC2 are provided outside the seal region Rs (on a side where the liquid crystal layer is not present). The present embodiment is not limited to the illustrated example, and the source-CS connection section may be provided inside the seal region Rs (on a side closer to the liquid crystal layer).

Manufacturing Method of TFT Substrate 101B

A description is given of a manufacturing method of the TFT substrate 101B with reference to FIG. 25 to FIG. 32.

FIGS. 25(a) to 25(g), FIGS. 26(a) to 26(g), FIGS. 27(a) to 27(d), FIGS. 28(a) to 28(d), FIGS. 29(a) to 29(c), FIGS. 30(a) to 30(c), FIGS. 31(a) to 31(c), and FIGS. 32(a) to 32(c) are process cross-sectional views illustrating an example of the manufacturing method of the TFT substrate 101B. These drawings illustrate the cross sections corresponding to FIGS. 23(a) and 23(b), and FIGS. 24(a) to 24(c) (the cross-sections along lines A-A', B-B', D-D', F-F', and H-H' of the TFT substrate 101B). The description of matters the same as those in the manufacturing method of the TFT substrate 101A described referring to FIG. 10 to FIG. 17 may be omitted.

First, as illustrated in FIG. 25(a) and FIG. 26(a), the base insulating layer 20, the intrinsic amorphous silicon film 5', and the $n^+$ type amorphous silicon film 6' are formed in this order on the dielectric substrate 1. Here, as the base insulating layer 20, a silicon nitride (SixNy) film having a thickness of 200 nm, for example, is formed. Furthermore, the intrinsic amorphous silicon film 5' having a thickness of 120 nm, for example, and the $n^+$ type amorphous silicon film 6' having a thickness of 30 nm, for example, are further formed.

Next, the intrinsic amorphous silicon film 5' and the $n^+$ type amorphous silicon film 6' are patterned to obtain the island-shaped semiconductor layer 5 and the contact layer 6 as illustrated in FIG. 25(b) and FIG. 26(b).

Next, the source conductive film 7' is formed on the base insulating layer 20 and on the contact layer 6 as illustrated in FIG. 25(c) and FIG. 26(c). Here, as the source conductive film 7', a layered film (MoN/Al/MoN) is formed by layering MoN (having a thickness of 50 nm, for example), Al (having a thickness of 150 nm, for example), and MoN (having a thickness of 100 nm, for example) in this order. Alternatively, as the source conductive film 7', a layered film (Ti/Al/Ti) may be formed by layering Ti (having a thickness of 50 nm, for example), Al (having a thickness of 200 nm, for example), and Ti (having a thickness of 50 nm, for example) in this order.

Next, the source conductive film 7' is patterned to obtain the source metal layer 7 as illustrated in FIG. 25(d) and FIG. 26(d). Specifically, the source electrode 7S and the drain electrode 7D, the auxiliary capacitance electrode 7C connected to the drain electrode 7D, the connection section 7a1 extending from the auxiliary capacitance electrode 7C, and the source bus line SL connected to the source electrode 7S are formed in the antenna unit formation region, the lower connection sections 7g, 7s, 7c, and 7p2 are formed in respective terminal formation regions, the gate lower connection wiring line 7sgG is formed in the source-gate connection section formation region, and the lower connection wiring lines 7sc1 and 7sc2 are formed in a source-CS connection section formation region. At this time, the contact layer 6 is also etched, and the source contact layer 6S and the drain contact layer 6D separated from each other are formed.

In the case that a layered film (MoN/Al/MoN) is formed, as the source conductive film 7', by layering MoN, Al, and MoN in this order, patterning of the source conductive film 7' is performed by wet etching, for example. For example, an aqueous solution of containing phosphoric acid, nitric acid, and acetic acid is used as an etching solution to simultaneously pattern the MoN film and the Al film. After patterning the MoN film and the Al film by wet etching, the contact layer ($n^+$ type amorphous silicon layer) 6 may be patterned by dry etching.

In the case that a layered film (Ti/Al/Ti) is formed, as the source conductive film 7', by layering Ti, Al, and Ti in this order, patterning of the source conductive film 7' is performed by dry etching, for example. For example, by dry etching, the Ti film, the Al film, and the contact layer ($n^+$ type amorphous silicon layer) 6 are collectively patterned.

Next, as illustrated in FIG. 25(e) and FIG. 26(e), the gate insulating film 4' is formed to cover the source metal layer 7 and the base insulating layer 20. In this example, the gate insulating film 4' is disposed to be in contact with the channel region of the semiconductor layer 5. Here, as the gate insulating film 4', a silicon nitride (SixNy) film having a thickness of 350 nm, for example, is formed.

Next, the gate conductive film 3' is formed on the gate insulating film 4' as illustrated in FIG. 25(f) and FIG. 26(f). Here, as the gate conductive film 3', a layered film (Cu/Ti) is formed by layering a Ti film (having a thickness of 20 nm, for example) and a Cu film layer (having a thickness of 500 nm, for example) in this order.

Next, the gate conductive film 3' is patterned to obtain the gate metal layer 3 as illustrated in FIG. 25(g) and FIG. 26(g). Specifically, the gate electrode 3G including a portion opposite to the semiconductor layer 5 with the gate insulating film 4' interposed therebetween, the gate bus line GL connected to the gate electrode 3G, the auxiliary capacitance counter electrode 3C including a portion opposite to the auxiliary capacitance electrode 7C with the gate insulating film 4' interposed therebetween, and the CS bus line CL connected to the auxiliary capacitance counter electrode 3C are formed in the antenna unit formation region, the lower connection section 3p1 is formed in the first transfer terminal section formation region, and the gate bus line connection section 3sgG is formed in the source-gate connection section formation region. Here, patterning of the gate conductive film 3' is performed by wet etching. In this manner, the TFT 10 is obtained.

Here, in the source-gate connection section formation region, at least a portion of the gate lower connection wiring line 7sgG is formed not to overlap the gate bus line connection section 3sgG. In the antenna unit formation region, at least a part of the drain electrode 7D and portion extending from the drain electrode 7D is formed not to overlap the gate metal layer 3. The gate metal layer 3 is not formed in the respective terminal section formation regions (except for the first transfer terminal section formation region), a first source-CS connection section formation region, and a second source-CS connection section formation region.

Next, as illustrated in FIG. 27(a) and FIG. 28(a), the first insulating film 11' is formed to cover the TFT 10 and the gate metal layer 3. Here, as the first insulating film 11', a silicon nitride (SixNy) film having a thickness of 100 nm, for example, is formed.

Next, the first insulating film 11' and the gate insulating film 4' are etched through a known photolithography process to obtain the first insulating layer 11 and gate insulating layer 4 as illustrated in FIG. 27(b) and FIG. 28(b). Specifically, in the antenna unit formation region, the contact hole that at least reaches the connection section 7a1 is formed in the gate insulating film 4' and the first insulating film 11'. In the gate terminal section formation region, the contact hole that at least reaches the lower connection section 7g is formed in the gate insulating film 4' and the first insulating film 11'. In the source terminal section formation region, the contact hole that at least reaches the lower connection section 7s is formed in the gate insulating film 4' and the first insulating film 11'. In the CS terminal section formation region, the contact hole that at least reaches the lower connection section 7c is formed in the gate insulating film 4' and the first insulating film 11'. In the first transfer terminal section formation region, the opening 11p1 that at least reaches the lower connection section 3p1 is formed in the first insulating film 11'. In the second transfer terminal section formation region, the contact hole that at least reaches the lower connection section '7p2 is formed in the gate insulating film 4' and the first insulating film 11'. In the source-gate connection section formation region, the contact hole that at least reaches the gate lower connection wiring line 7sgG is formed in the gate insulating film 4' and the first insulating film 11', and the contact hole (the opening 11sgB) that at least reaches the gate bus line connection section 3sgG is formed in the first insulating film 11'. In the first source-CS connection section formation region, the contact hole that at least reaches the lower connection wiring line 7sc1 is formed in the gate insulating film 4' and the first insulating film 11'. In the second source-CS connection section formation region, the contact hole that at least reaches the lower connection wiring line 7sc1 is formed in the gate insulating film 4' and the first insulating film 11'.

In this etching process, the gate metal layer 3 is used as an etch stop to etch the first insulating film 11' and the gate insulating film 4'.

Among the contact holes, in the contact hole including the opening formed in the first insulating layer 11 and the opening formed in the gate insulating layer 4, the side surface of the opening formed in the first insulating layer 11 and the side surface of the opening formed in the gate insulating layer 4 may be aligned.

For example, in the antenna unit formation region, in a contact hole CH_a1 formation region, the first insulating film 11' and the gate insulating film 4' are etched, the opening 4a1 that at least reaches the connection section 7a1 is formed in the gate insulating layer 4, and the opening 11a1 overlapping the opening 4a1 is formed in the first insulating layer 11.

In the source-gate connection section formation region, the first insulating film 11' and the gate insulating film 4' are collectively etched in a contact hole CH_sgA formation region, and the gate bus line connection section 3sgG functions as the etch stop to etch only the first insulating film 11' in a contact hole CH_sgB formation region. This allows, in the contact hole CH_sgA formation region, the opening 4sgA that at least reaches the gate lower connection wiring line 7sgG to be formed in the gate insulating layer 4, and the opening 11sgA overlapping the opening 4sgA to be formed in the first insulating layer 11.

In the respective terminal section formation regions (except for the first transfer terminal section formation region), since the conductive portion included in the gate metal layer 3 is not formed, the first insulating film 11' and the gate insulating film 4' are collectively etched.

In the gate terminal section formation region, the first insulating film 11' and the gate insulating film 4' are collectively etched to form the opening 4g that at least reaches the lower connection section 7g in the gate insulating layer 4, and form the opening 11g overlapping the opening 4g in the first insulating layer 11.

In the source terminal section formation region, the first insulating film 11' and the gate insulating film 4' are collectively etched to form the opening 4s that at least reaches the lower connection section 7s in the gate insulating layer 4, and form the opening 11s overlapping the opening 4s in the first insulating layer 11.

In the CS terminal section formation region, the first insulating film 11' and the gate insulating film 4' are collectively etched to form the opening 4c that at least reaches the lower connection section 7c in the gate insulating layer 4, and form the opening 11c overlapping the opening 4c in the first insulating layer 11.

In the second transfer terminal section formation region, the first insulating film 11' and the gate insulating film 4' are collectively etched to form the opening 4p2 that at least reaches the lower connection section 7p2 in the gate insulating layer 4, and form the opening 11p2 overlapping the opening 4p2 in the first insulating layer 11.

In the first transfer terminal section formation region, the lower connection section 3p1 included in the gate metal layer 3 functions as the etch stop to etch only the first insulating film 11'. This allows the opening 11p1 (contact hole CH_p1) that at least reaches the lower connection section 3p1 to be formed in the first insulating layer 11.

In the first source-CS connection section formation region, the first insulating film 11' and the gate insulating film 4' are collectively etched to form the opening 4sc1 that at least reaches the lower connection wiring line 7sc1 in the gate insulating layer 4, and form the opening 11sc1 overlapping the opening 4sc1 in the first insulating layer 11.

In the second source-CS connection section formation region, the first insulating film 11' and the gate insulating film 4' are collectively etched to form the opening 4sc2 that at least reaches the lower connection wiring line 7sc2 in the gate insulating layer 4, and form the opening 11sc2 overlapping the opening 4sc2 in the first insulating layer 11.

Next, as illustrated in FIG. 27(c) and FIG. 28(c), the flattening film 14' is formed on the first insulating layer 11, within the opening 4a, within the opening 4sgA, within the opening 11sgB, within the opening 4g, within the opening 4s, within the opening 4c, within the opening 11p1, within the opening 4p2, within the opening 4sc1, and within the opening 4sc2.

Subsequently, as illustrated in FIG. 27(d) and FIG. 28(d), the flattening film 14' is patterned to form the flattened layer 14. Specifically, the opening 14a1 overlapping the opening 11a1 formed in the first insulating layer 11 is formed in the antenna unit formation region. This allows the contact hole CH_a1 to be obtained. In the source-gate connection section formation region, the opening 14sgA and the opening 14sgB are formed that respectively overlap the opening 11sgA and the opening 11sgB formed in the first insulating layer 11. The flattened layer 14 is not formed in the source terminal formation region, the gate terminal formation region, the CS terminal formation region, the transfer terminal formation region, and the source-CS connection section formation region. For example, the flattened layer 14 is formed not to overlap the lower connection sections 7s, 7g, 7c, 3p1 and 7p2, and the lower connection wiring lines 7sc1 and 7sc2 when viewed from the normal direction of the dielectric substrate 1.

Next, as illustrated in FIG. 29(a) and FIG. 30(a), the patch conductive film 15' is formed on the first insulating layer 11 and on the flattened layer 14. Here, as the patch conductive film 15', a layered film (Cu/Ti) is formed which includes a Ti film (having a thickness of 20 nm, for example) and a Cu film (having a thickness of 500 nm, for example) in this order.

Next, the patch conductive film 15' is patterned to form the patch metal layer 151 as illustrated in FIG. 29(b) and FIG. 30(b). Specifically, the patch electrode 15, the connection section 15a1, and the protruding portion 15h are formed in the antenna unit formation region. The connection section 15a1 is formed to be connected to the connection section 7a1 within the opening 4a1 in the antenna unit formation region.

Next, as illustrated in FIG. 29(c) and FIG. 30c(d), the second insulating film 17' is formed on the patch metal layer 151, on the flattened layer 14, and on the first insulating layer 11. Here, as the second insulating film 17', a silicon nitride (SixNy) film having a thickness of 100 nm, for example, is formed. The second insulating film 17' is formed to cover the patch metal layer 151 and the flattened layer 14.

Next, the second insulating film 17' is etched through a known photolithography process to form the second insulating layer 17 as illustrated in FIG. 31(a) and FIG. 32(a). Specifically, in the source-gate connection section formation region, the opening 17sgA and the opening 17sgB are formed that respectively overlap the opening 14sgA and the opening 14sgB are formed in the flattened layer 14. This allows the contact hole CH_sgA and the contact hole CH_sgB to be obtained. In the source terminal section formation region, the opening 17s overlapping the opening 11s formed in the first insulating layer 11 is formed. In the gate terminal section formation region, the opening 17g overlapping the opening 11g formed in the first insulating layer 11 is formed. In the CS terminal section formation region, the opening 17c overlapping the opening 11c formed in the first insulating layer 11 is formed. In the first transfer terminal section formation region, the opening 17p1 overlapping the opening 11p1 formed in the first insulating layer 11 is formed. In the second transfer terminal section formation region, the opening 17p2 overlapping the opening 11p2 formed in the first insulating layer 11 is formed. In the first source-CS connection section formation region, the opening 17sc1 overlapping the opening 11sc1 formed in the first insulating layer 11 is formed. In the second source-CS connection section formation region, the opening 17sc2 overlapping the opening 11sc2 formed in the first insulating layer 11 is formed.

Next, as illustrated in FIG. 31(b) and FIG. 32(b), the upper conductive film 19' is formed on the second insulating layer 17, within the contact hole CH_sgA, within the contact hole CH_sgB, within the contact hole CH_s, within the contact hole CH_g, within the contact hole CH_c, within the contact hole CH_p1, within the contact hole CH_p2, within the contact hole CH_sc1, and within the contact hole CH_sc2. Here, an ITO film having a thickness of 70 nm, for example, is used as the upper conductive film 19'. Alternatively, a layered film (ITO/Ti) formed by layering Ti (having a thickness of 50 nm, for example) and ITO (having a thickness of 70 nm, for example) in this order may be used as the upper conductive film 19'.

Next, the upper conductive film 19' is patterned to form the upper conductive layer 19 as illustrated in FIG. 31(c) and FIG. 32(c). Specifically, formed are the gate upper connection section 19sg connected to the gate lower connection wiring line 7sgG within the contact hole CH_sgA and connected to the gate bus line connection section 3sgG within the contact hole CH_sgB in the source-gate connection section formation region, the upper connection section 19s in contact with the lower connection section 7s within the contact hole CH_s in the source terminal section formation region, the upper connection section 19g in contact with the lower connection section 7g within the contact hole CH_g in the gate terminal section formation region, the upper connection section 19c in contact with the lower connection section 7c within the contact hole CH_c in the CS terminal section formation region, the upper connection section 19p1 connected to the lower connection section 3p1 within the contact hole CH_p1 in the first transfer terminal section formation region, the upper connection section 19p2 connected to the lower connection section 7p2 within the contact hole CH_p2 in the second transfer terminal section formation region, the upper connection section 19sc1 connected to the lower connection wiring line 7sc1 within the contact hole CH_sc1 in the first source-CS connection section formation region, and the upper connection section 19sc2 connected to the lower connection wiring line 7sc2 within the contact hole CH_sc2 in the second source-CS connection section formation region. This provides the antenna unit region U, the source-gate connection section SG, the source terminal section ST, the gate terminal section GT, the CS terminal section CT, the first transfer terminal section PT1, the second transfer terminal section PT2, the first source-CS connection section SC1, and the second source-CS connection section SC2.

In this manner, the TFT substrate 101B is manufactured.

Modification Example

A scanning antenna 1000Ba and a TFT substrate 101Ba included in the scanning antenna 1000Ba in Modification Example of the present embodiment will be described with reference to FIGS. 33 and 34. The constitutions common to the scanning antenna 1000B and the TFT substrate 101B are denoted by the same reference signs and the descriptions thereof are omitted.

Structure of TFT Substrate 101Ba

FIGS. 33(a) to 33(c) are schematic plan views of the scanning antenna 1000Ba, and FIGS. 34(a) to 34(c) are schematic cross-sectional views of the TFT substrate 101Ba. FIG. 33(a) illustrates the antenna unit region U in the transmission and/or reception region R1, FIG. 33(b) illustrates the gate terminal section GT, the CS terminal section CT, the transfer terminal section PT, the source-gate connection section SG, the first source-CS connection section SC1, and the second source-CS connection section SC2 provided in the non-transmission and/or reception region R2, and FIG. 33(c) illustrates the source terminal section ST provided in the non-transmission and/or reception region R2. FIG. 34(a) illustrates a cross section of the antenna unit region U along a line A-A' in FIG. 33(a), FIG. 34(b) illustrates a cross section of the source-gate connection section SG along a line B-B' in FIG. 33(b), and FIG. 34(c) illustrates a cross section of the source-gate connection section SG along a line E-E' in FIG. 33(b). Note that other cross sections of the TFT substrate 101Ba are the same as the TFT substrate 101B, and thus, illustrations and descriptions thereof will be omitted.

Figure 33:
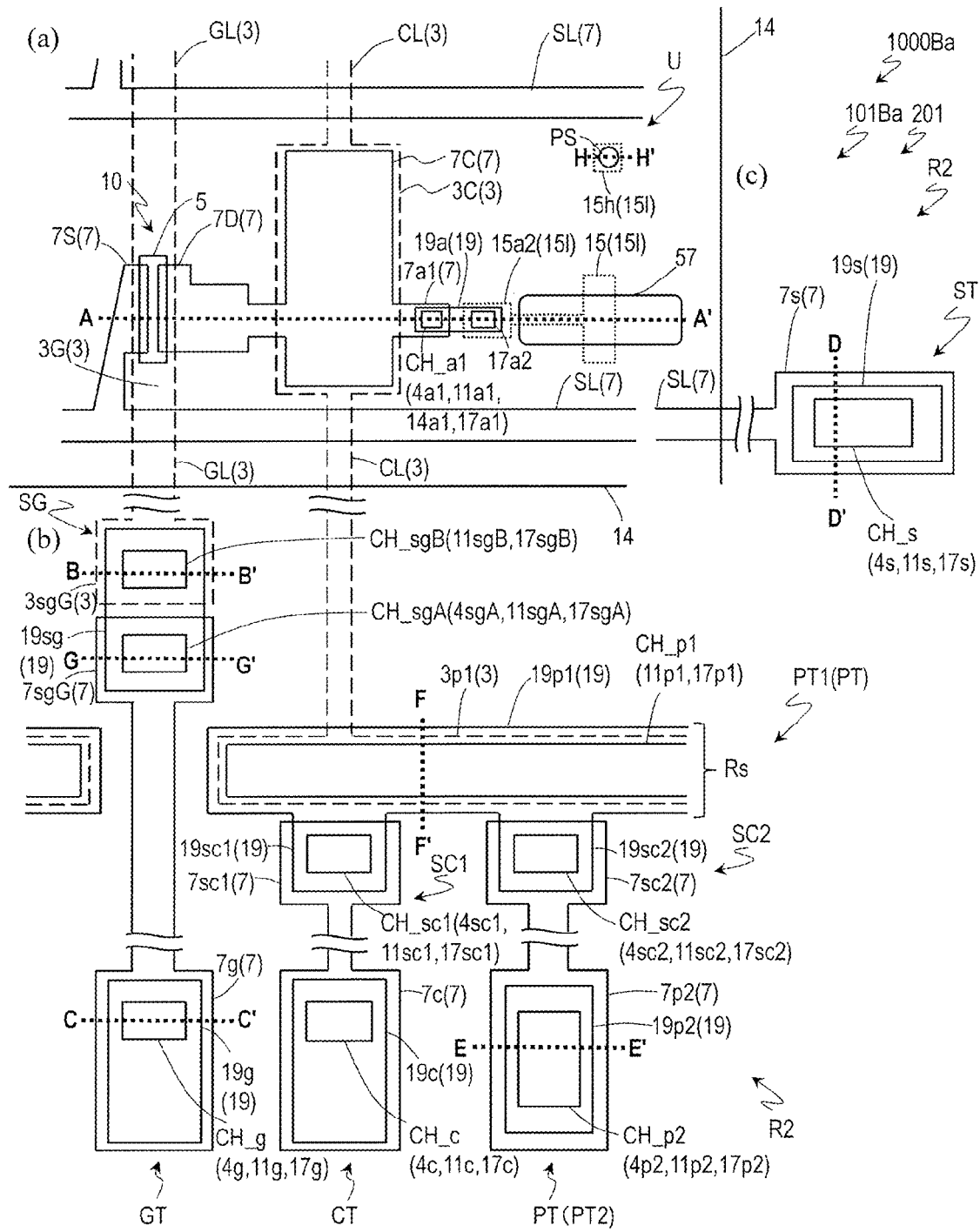
FIGS. 33(a) to 33(c) are schematic plan views illustrating a scanning antenna 1000Ba according to Modification Example of the second embodiment.
Figure 34:
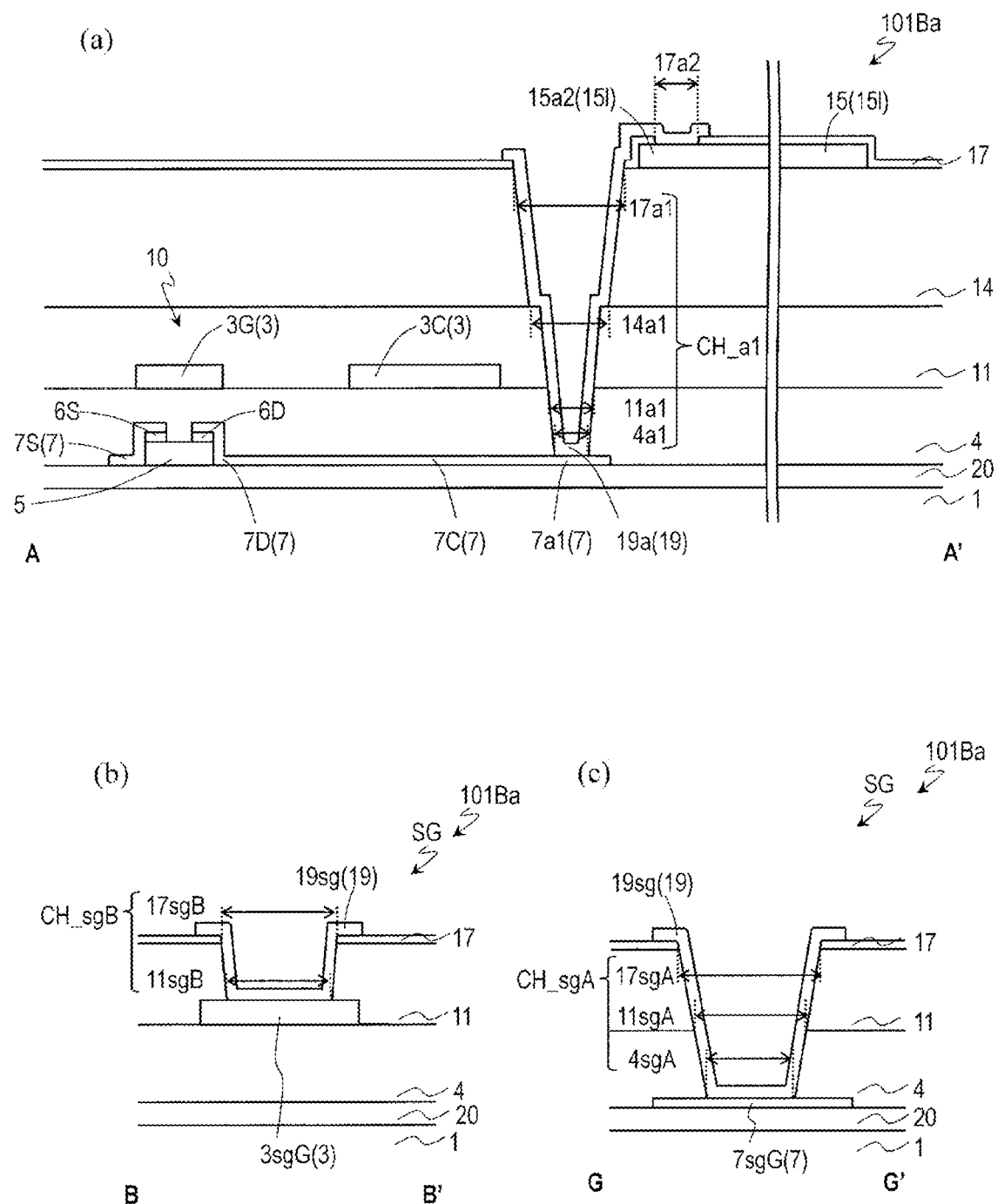
FIGS. 34(a) to 34(c) are schematic cross-sectional views of a TFT substrate 101Ba included in the scanning antenna 1000Ba.

As illustrated in FIG. 33 and FIG. 34, the TFT substrate 101Ba included in the scanning antenna 1000Ba differs from the TFT substrate 101B included in the scanning antenna 1000B in a shape of the flattened layer 14. In the TFT substrate 101B, the flattened layer 14 is formed on the source-gate connection section, but is not formed on the source terminal section, on the gate terminal section, on the CS terminal section, and on the transfer terminal section. In contrast, the flattened layer 14 of the TFT substrate 101Ba differs from the TFT substrate 101B in that the flattened layer 14 is not formed also on the source-gate connection section.

The source-gate connection section SG of the TFT substrate 101Ba illustrated in FIG. 33(b), FIG. 34(b), and FIG. 34(c) corresponds to the source-gate connection section SG of the TFT substrate 101B illustrated in FIG. 22(b), FIG. 23(b) and FIG. 23(c) with the flattened layer 14 being omitted.

The source-gate connection section SG of the TFT substrate 101Ba includes the gate lower connection wiring line 7sgG, the opening 4sgA formed in the gate insulating layer 4, the gate bus line connection section 3sgG connected to the gate bus line GL, the opening 11sgA and opening 11sgB formed in the first insulating layer 11, the opening 17sgA and opening 17sgB formed in the second insulating layer 17, and the gate upper connection section 19sg as illustrated in FIG. 33(b), FIG. 34(b), and FIG. 34(c).

The opening 17sgA formed in the second insulating layer 17 overlaps the opening 11sgA formed in the first insulating layer 11 when viewed from the normal direction of the dielectric substrate 1. The opening 17sgB formed in the second insulating layer 17 overlaps the opening 11sgB formed in the first insulating layer 11 when viewed from the normal direction of the dielectric substrate 1. The opening 4sgA formed in the gate insulating layer 4, the opening 11sgA formed in the first insulating layer 11, and the opening 17sgA formed in the second insulating layer 17 constitute the contact hole CH_sgA. The opening 11sgB formed in the first insulating layer 11 and the opening 17sgB formed in the second insulating layer 17 constitute the contact hole CH_sgB.

In the scanning antenna 1000Ba having such a structure also, the same effect as in the scanning antenna 1000B can be obtained.

As illustrated in FIG. 33(a) and FIG. 34(a), the TFT substrate 101Ba differs from the TFT substrate 101B in an electrical connection method between the drain electrode 7D and the patch electrode 15. However, the TFT substrate 101Ba is not limited to the illustrated example in the structure that electrically connects the drain electrode 7D and the patch electrode 15, and may be the same as, for example, the TFT substrate 101B.

As illustrated in FIG. 33(a) and FIG. 34(a), in the antenna unit region U of the TFT substrate 101Ba, the upper conductive layer 19 includes the connection section 19a which is electrically connected to the patch electrode 15 and the drain electrode 7D. Specifically, the drain electrode 7D is electrically connected to the patch electrode 15 through the connection section 19a.

A specific configuration is described. The patch metal layer 151 includes the patch electrode 15 and the connection section 15a2 as illustrated in FIG. 33(a) and FIG. 34(a). The connection section 15a2 is formed on the flattened layer 14. The second insulating layer 17 includes the opening 17a1 overlapping the opening 14a1 formed in the flattened layer 14 when viewed from the normal direction of the dielectric substrate 1, and the opening 17a2 that at least reaches the connection section 15a2. The opening 4a1 formed in the gate insulating layer 4, the opening 11a1 formed in the first insulating layer 11, the opening 14a1 formed in the flattened layer 14, and the opening 17a1 formed in the second insulating layer 17 constitute the contact hole CH_a1. The upper conductive layer 19 includes the connection section 19a. The connection section 19a is formed on the second insulating layer 17, on the patch metal layer 151, within the contact hole CH_a1, and within the opening 17a2, and is connected to the connection section 7a1 within the contact hole CH_a1 and is connected to the connection section 15a2 within the opening 17a2.

Manufacturing Method of TFT Substrate 101Ba

Figure 35:
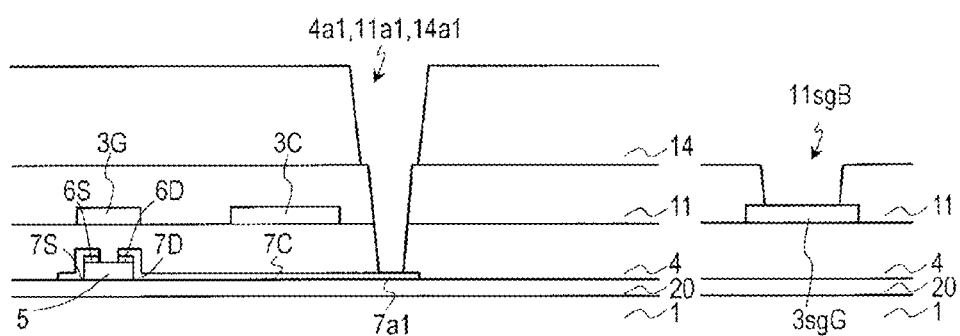
FIG. 35 is a process cross-sectional view illustrating an example of a manufacturing method of the TFT substrate 101Ba.
Figure 36:
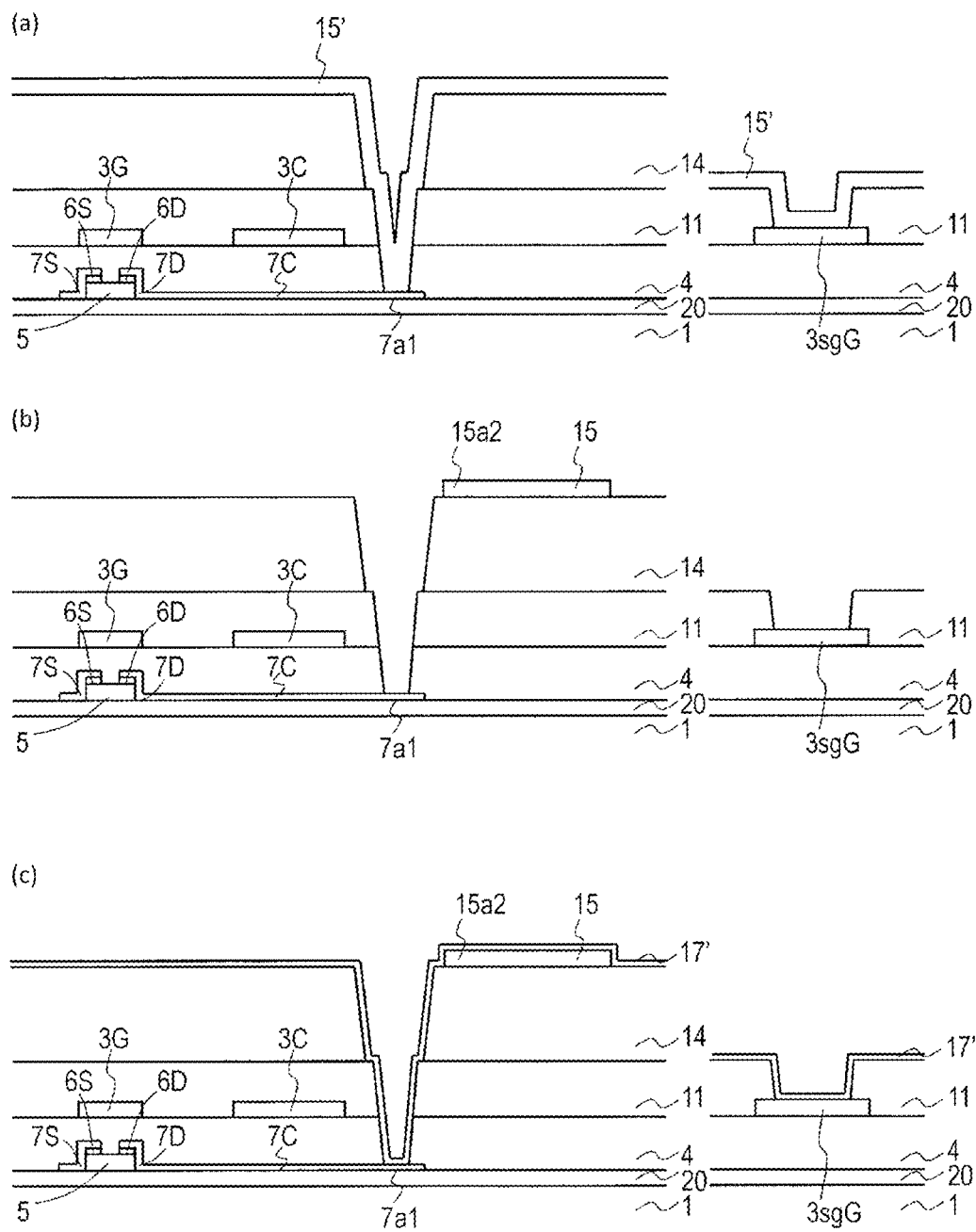
FIGS. 36(a) to 36(c) are process cross-sectional views illustrating an example of the manufacturing method of the TFT substrate 101Ba.
Figure 37:
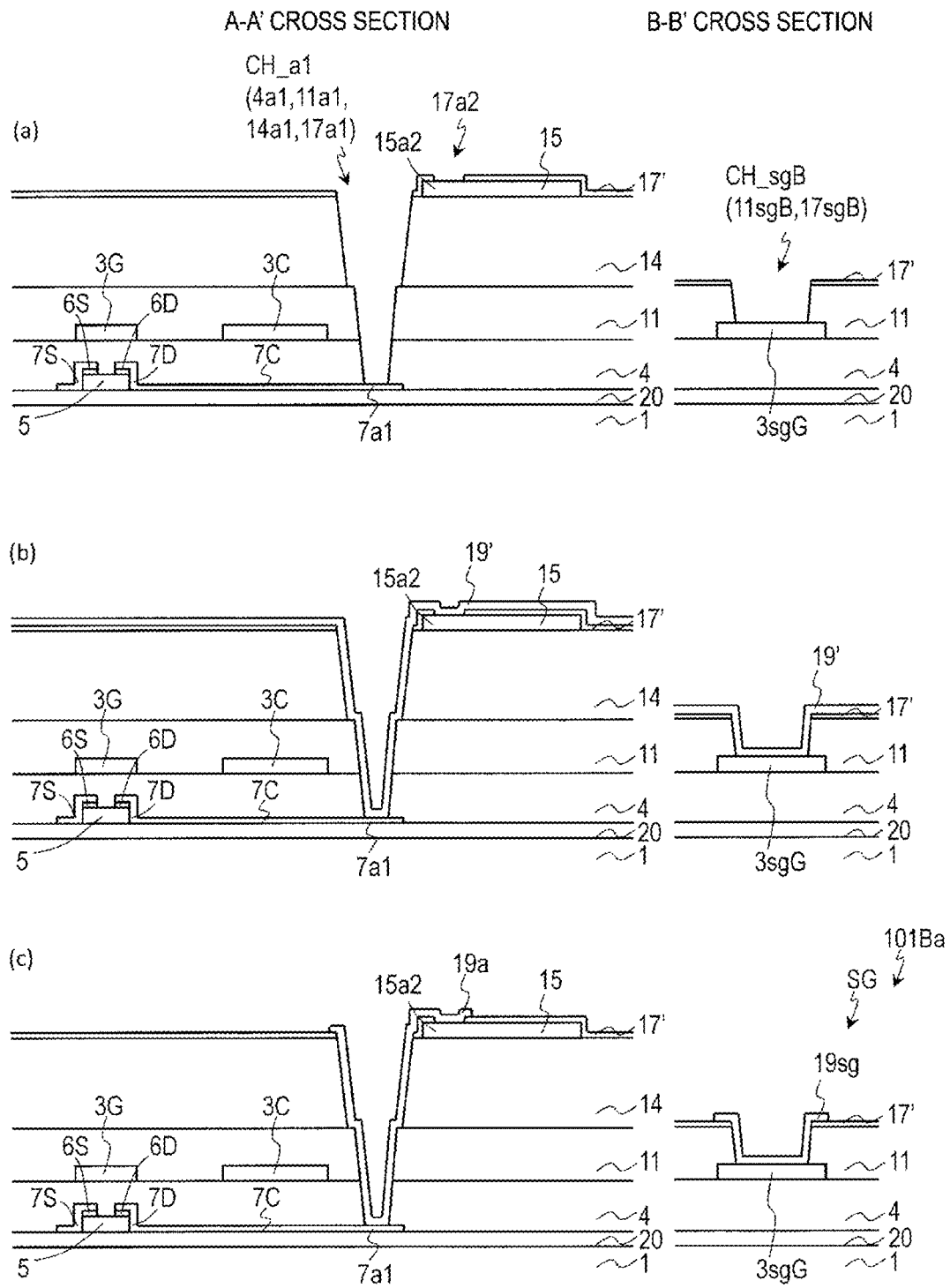
FIGS. 37(a) to 37(c) are process cross-sectional views illustrating an example of the manufacturing method of the TFT substrate 101Ba.

A description is given of a manufacturing method of the TFT substrate 101Ba with reference to FIG. 35 to FIG. 37.

FIG. 35, FIGS. 36(a) to 36(c), and FIGS. 37(a) to 37(c) are process cross-sectional views illustrating an example of the manufacturing method of the TFT substrate 101Ba. These drawings illustrate cross sections corresponding to FIGS. 34(a) and 34(b) (the cross sections along lines A-A' and B-B' of the TFT substrate 101Ba). The following description mainly describes differences from the manufacturing method of the TFT substrate 101B described referring to FIG. 25 to FIG. 32.

First, as illustrated in FIGS. 25(a) to 25(g), FIGS. 26(a) to 26(g), FIGS. 27(a) to 27(c), and FIGS. 28(a) to 28(c), formed on the dielectric substrate 1 are the gate metal layer 3, the gate insulating film 4', the island-shaped semiconductor layer 5, the contact layers 6S and 6D, the source metal layer 7, the first insulating film 11', the lower conductive layer 13, and the flattening film 14'.

Subsequently, as illustrated in FIG. 35, the flattening film 14' is patterned to form the flattened layer 14. Here, a difference from the manufacturing method of the TFT substrate 101B is in that the flattened layer 14 is not formed on the source-gate connection section formation region. For example, the flattened layer 14 is formed not to overlap the gate lower connection wiring line 7sgG and the gate bus line connection section 3sgG when viewed from the normal direction of the dielectric substrate 1.

Next, as illustrated in FIG. 36(a), the patch conductive film 15' is formed within the opening 4a1, within the opening 11sgB, on the first insulating layer 11, and on the flattened layer 14.

Next, the patch conductive film 15' is patterned to form the patch metal layer 151 as illustrated in FIG. 36(b). Here, in the antenna unit formation region, the connection section 15a2 is formed on the flattened layer 14.

Next, as illustrated in FIG. 36(c), the second insulating film 17' is formed within the opening 4a1, within the opening 11sgB, on the patch metal layer 151, on the flattened layer 14, and on the first insulating layer 11.

Next, the second insulating film 17' is etched through a known photolithography process to form the second insulating layer 17 as illustrated in FIG. 37(a). Here, a difference from the method of manufacturing the TFT substrate 101B is in that the opening 17a1 that overlaps the opening 14a1 formed in the flattened layer 14 and the opening 17a2 that at least reaches the connection section 15a2 are formed in the antenna unit formation region. This allows the contact hole CH_a1 to be obtained. In the source-gate connection section formation region, the opening 17sgA and the opening 17sgB are formed that respectively overlap the opening 11sgA and the opening 11sgB formed in the first insulating layer 11. This allows the contact hole CH_sgA and the contact hole CH_sgB to be obtained.

Next, as illustrated in FIG. 37(b), the upper conductive film 19' is formed on the second insulating layer 17, within contact hole CH_a1, within opening 17a2, within the contact hole CH_sgA, within the contact hole CH_sgB, within the contact hole CH_s, within the contact hole CH_g, within the contact hole CH_c, within the contact hole CH_p1, within the contact hole CH_p2, within the contact hole CH_sc1, and within the contact hole CH_sc2.

Next, the upper conductive film 19' is patterned to form the upper conductive layer 19 as illustrated in FIG. 37(c). Here, formed in the antenna unit formation region is the connection section 19a that is connected to the connection section 7a1 within the contact hole CH_a1 and connected to the connection section 15a2 within the opening 17a2.

In this manner, the TFT substrate 101Ba is manufactured.

Example of Antenna Unit Array and Connection of Gate Bus Line and Source Bus Line In the scanning antenna according to the embodiments of the disclosure, the antenna units are arrayed concentrically, for example.

For example, in a case where the antenna units are arrayed in m concentric circles, one gate bus line is provided for each circle, for example, such that a total of m gate bus lines is provided. For example, assuming that the outer diameter of the transmission and/or reception region R1 is 800 mm, m is 200, for example. Assuming that the innermost gate bus line is the first one, n (30, for example) antenna units are connected to the first gate bus line and nx (620, for example) antenna units are connected to the m-th gate bus line.

In such an array, the number of antenna units connected to each gate bus line is different. In addition, although m antenna units are connected to n source bus lines that are also connected to the antenna units constituting the innermost circle, among nx source bus lines connected to nx antenna units that constitute the outermost circle, the number of antenna units connected to other source bus lines is less than m.

In this way, the array of antenna units in the scanning antenna is different from the array of pixels (dots) in the LCD panel, and the number of connected antenna units differs depending on the gate bus line and/or source bus line. Accordingly, in a case where the capacitances (liquid crystal capacitances+auxiliary capacitances) of all the antenna units are set to be the same, depending on the gate bus line and/or the source bus line, the electrical loads of the antenna units connected thereto differ. In such a case, there is a problem where variations occur in the writing of the voltage to the antenna unit.

Accordingly, to prevent this, the capacitance value of the auxiliary capacitance is preferably adjusted, or the number of antenna units connected to the gate bus line and/or the source bus line is preferably adjusted, for example, to make the electrical loads of the antenna units connected to the gate bus lines and the source bus lines substantially the same.

The scanning antenna according to the embodiments of the disclosure is housed in a plastic housing as necessary, for example. It is preferable to use a material having a small dielectric constant EM that does not affect microwave transmission and/or reception in the housing. In addition, the housing may include a through-hole provided in a portion thereof corresponding to the transmission and/or reception region R1. Furthermore, the housing may include a light blocking structure such that the liquid crystal material is not exposed to light. The light blocking structure is, for example, provided so as to block light that propagates through the dielectric substrate 1 and/or 51 from the side surface of the dielectric substrate 1 of the TFT substrate 101A and/or the side surface of the dielectric substrate 51 of the slot substrate 201 and is incident upon the liquid crystal layer. A liquid crystal material having a large dielectric anisotropy $\Delta\varepsilon_M$ may be prone to photodegradation, and as such it is preferable to shield not only ultraviolet rays but also short-wavelength blue light from among visible light. By using a light-blocking tape such as a black adhesive tape, for example, the light blocking structure can be easily formed in necessary locations.

INDUSTRIAL APPLICABILITY

Embodiments according to the disclosure are used in scanning antennas for satellite communication or satellite broadcasting that are mounted on mobile bodies (ships, aircraft, and automobiles, for example) or the manufacture thereof.

REFERENCE SIGNS LIST

1 Dielectric substrate
3 Gate metal layer
3C Auxiliary capacitance counter electrode
3G Gate electrode
3c, 3g, 3p1, 3s Lower connection section
3sg Source lower connection wiring line
3sgG Gate bus line connection section
4 Gate insulating layer
4a, 4a1, 4c, 4g, 4p1, 4p2, 4s Opening
4sc1, 4sc2, 4sg1, 4sgA Opening
5 Semiconductor layer
6D Drain contact layer
6S Source contact layer
7 Source metal layer
7C Auxiliary capacitance electrode
7D Drain electrode
7S Source electrode
7a1 Connection section
7c, 7g, 7p2, 7s Lower connection section 7sc1, 7sc2 Lower connection wiring line
7sg Source bus line connection section
7sgG Gate lower connection wiring line
11 First insulating layer
11a, 11a1, 11c, 11g, 11p1, 11p2 Opening
11s, 11sc1, 11sc2, 11sg1, 11sg2 Opening
11sgA, 11sgB Opening
13 Lower conductive layer
13sg Source bus line upper connection section
14 Flattened layer
14a, 14a1, 14p1, 14sgA, 14sgB Opening
15 Patch electrode
15a, 15a1, 15a2 Connection section
15h Protruding portion
151 Patch metal layer
15p1 Conductive portion
15p2 Lower connection section
17 Second insulating layer
17a, 17a1, 17a2, 17b, 17c, 17g Opening
17p1, 17p2, 17s Opening
17sc1, 17sc2, 17sgA, 17sgB Opening
19 Upper conductive layer
19a Connection section
19c, 19g, 19p1, 19p2, 19s Upper connection section
19sc1, 19sc2, 19sg Upper connection section
20 Base insulating layer
51 Dielectric substrate
52 Third insulating layer
54 Dielectric layer (air layer)
55 Slot electrode
55L Lower layer
55M Main layer
55U Upper layer
57 Slot
58 Fourth insulating layer
60 Upper connection section
65 Reflective conductive plate
70 Power feed device
71 Conductive beads
72 Power feed pin
73 Sealing portion
101A, 101Aa, 101Ax, 101B, 101Ba TFT substrate
201 Slot substrate
301 Waveguide
1000A, 1000Aa, 1000Ax, 1000B, 1000Ba Scanning antenna
CH_a, CH_a1, CH_c, CH_g Contact hole
CH_p1, CH_p2, CH_s, CH_sc1, CH_sc2 Contact hole
CH_sg1, CH_sg2 Contact hole
CH_sgA, CH_sgB Contact hole
CL CS bus line
CT CS Terminal Section
GD Gate driver
GL Gate bus line
GT Gate terminal section
IT Terminal section
LC Liquid crystal layer
PS Columnar spacer
PT Transfer terminal section
PT1 First transfer terminal section
PT2 Second transfer terminal section
R1 Transmission and/or reception region
R2 Non-transmission and/or reception region
R2a First non-transmission and/or reception region
R2b Second non-transmission and/or reception region
Rs Seal region
SC1, SC2 Source-CS connection section
SD Source driver
SG Source-gate connection section
SL Source bus line
ST Source terminal section
U Antenna unit, Antenna unit region

The invention claimed is:

1. A thin film transistor substrate comprising:
a dielectric substrate; and
a plurality of antenna unit regions arranged on the dielectric substrate, each of the plurality of antenna unit regions including a thin film transistor and a patch electrode, the patch electrode electrically connected to a drain electrode of the thin film transistor, the thin film transistor substrate further comprising:
a gate metal layer supported by the dielectric substrate and including gate electrode of the thin film transistor;
a source metal layer supported by the dielectric substrate and including source electrode of the thin film transistor;
a semiconductor layer of the thin film transistor, the semiconductor layer being supported by the dielectric substrate;
a gate insulating layer formed between the gate metal layer and the semiconductor layer; and
a flattened layer formed over the gate insulating layer and formed from an organic insulating material.

2. The thin film transistor substrate according to of claim 1,
wherein the flattened layer is formed on the thin film transistor.

3. The thin film transistor substrate according to of claim 1, further comprising:
a first insulating layer formed on the thin film transistor, wherein the flattened layer is formed on the first insulating layer.

4. The thin film transistor substrate according to claim 1, further comprising an inorganic insulating layer formed on the flattened layer,
wherein the flattened layer is covered by the inorganic insulating layer.

5. The thin film transistor substrate according to claim 1, wherein the flattened layer is formed under a conductive layer including the patch electrode.

6. The thin film transistor substrate according to claim 1, wherein the flattened layer includes a region overlapping the patch electrode in each of the plurality of antenna unit regions, when viewed from the normal direction of the dielectric substrate.

7. The thin film transistor substrate according to claim 1, wherein the flattened layer is formed from a photosensitive resin.

8. A scanning antenna comprising:
the thin film transistor substrate according to claim 1;
a slot substrate disposed to face the thin film transistor substrate;
a liquid crystal layer provided between the thin film transistor substrate and the slot substrate; and
a reflective conductive plate disposed to face a surface of the slot substrate on a side opposite to the liquid crystal layer with a dielectric layer interposed between the reflective conductive plate and the surface,
wherein the slot substrate includes another dielectric substrate and a slot electrode formed on a surface of the another dielectric substrate on a side of the liquid crystal layer, and
the slot electrode includes a plurality of slots, each of the plurality of slots being arranged corresponding to the patch electrode of each of the plurality of antenna unit regions of the thin film transistor substrate.

9. The scanning antenna according to claim 8,
wherein the flattened layer includes a region overlapping the patch electrode and/or the slot in each of the plurality of antenna unit regions, when viewed from a normal direction of the dielectric substrate and the another dielectric substrate.

10. The scanning antenna according to claim 8,
wherein the flattened layer includes a region, in the region the patch electrode and the slot electrode overlapping each other in each of the plurality of antenna unit regions, when viewed from the normal direction of the dielectric substrate and the another dielectric substrate.

11. The scanning antenna according to claim 8,
wherein the thin film transistor substrate or the slot substrate further includes a columnar spacer formed in each of the plurality of antenna unit regions.

12. The scanning antenna according to claim 11,
wherein the flattened layer includes a region overlapping the columnar spacer in each of the plurality of antenna unit regions, when viewed from the normal direction of the dielectric substrate and the another dielectric substrate.

13. The scanning antenna according to claim 11,
wherein the thin film transistor substrate further includes a protruding portion overlapping the columnar spacers in each of the plurality of antenna unit regions, when viewed from the normal direction of the dielectric substrate and the another dielectric substrate.

14. The scanning antenna according to claim 13,
wherein the protruding portion includes a metal layer.

15. The scanning antenna according to claim 13,
wherein the protruding portion is included in a conductive layer including the patch electrode.

* * * * *